United States Patent [19]
Ohsawa et al.

[11] Patent Number: 5,917,764
[45] Date of Patent: Jun. 29, 1999

[54] SEMICONDUCTOR MEMORY DEVICE

[75] Inventors: Takashi Ohsawa, Yokohama; Hiroshi Maejima, Tokyo, both of Japan

[73] Assignee: Kabushiki Kaisha Toshiba, Kawasaki, Japan

[21] Appl. No.: 09/069,865

[22] Filed: Apr. 30, 1998

[30] Foreign Application Priority Data

Apr. 30, 1997 [JP] Japan ................................. 9-112775

[51] Int. Cl.⁶ ..................................................... G11C 7/00
[52] U.S. Cl. ....................................... 365/200; 365/189.07
[58] Field of Search ................................. 365/200, 225.7, 365/189.07, 201; 371/10.2, 10.3, 21.1

[56] References Cited

U.S. PATENT DOCUMENTS 5,748,543  5/1998  Lee et al. ................................. 365/200

*Primary Examiner*—Son Mai
*Attorney, Agent, or Firm*—Banner & Witcoff, Ltd.

[57] ABSTRACT

A semiconductor memory device comprises a memory cell array, a redundancy memory cell array provided as a reserve for the memory cell array, a redundancy calculation and allocation circuit, whenever a test circuit for successively testing a plurality of memory cells forming the memory cell array has found a failure memory cell, for generating at least one repair solution for repairing the failure memory cell in parallel to the test of the plurality of memory cells carried out by the test circuit, and a redundancy circuit for substituting a row or a column of the memory cell array by a row or a column of the redundancy memory cell array on the basis of the at least one repair solution.

25 Claims, 46 Drawing Sheets

DISTRIBUTION OF FAILURE BIT (●; FAILURE BIT)

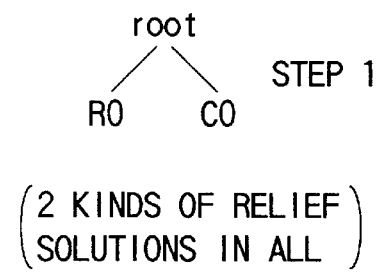
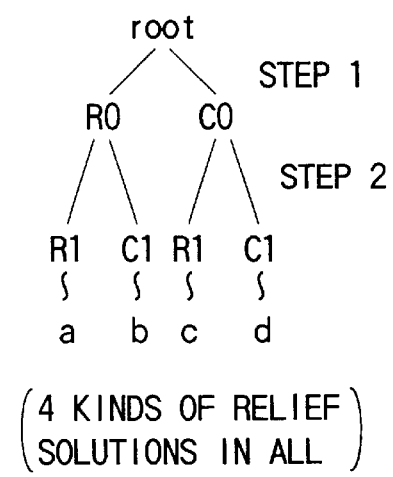
FIG. 5A  FIG. 5B
FIG. 6A  FIG. 6B

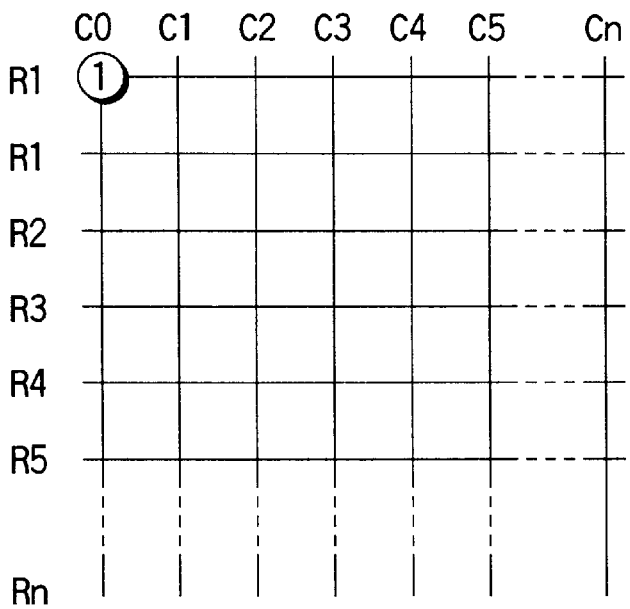 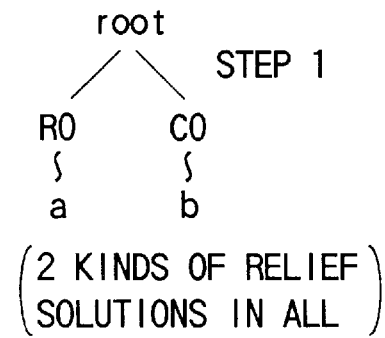
FIG. 10A        FIG. 10B
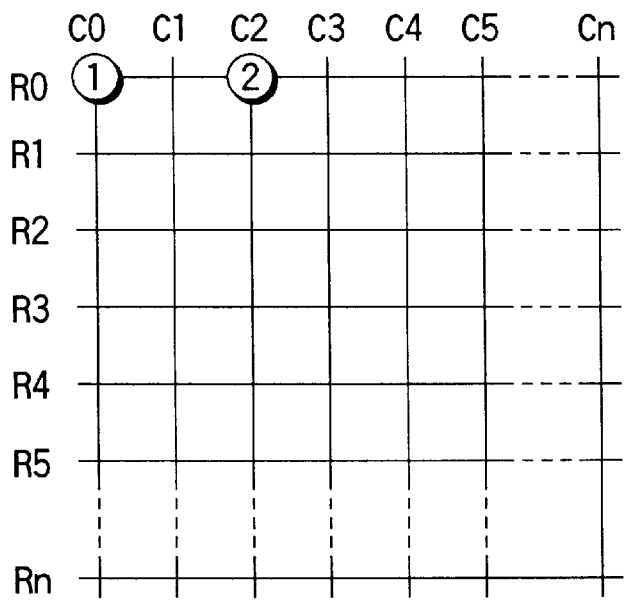 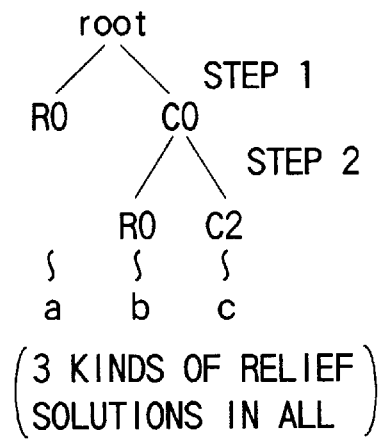
FIG. 11A        FIG. 11B

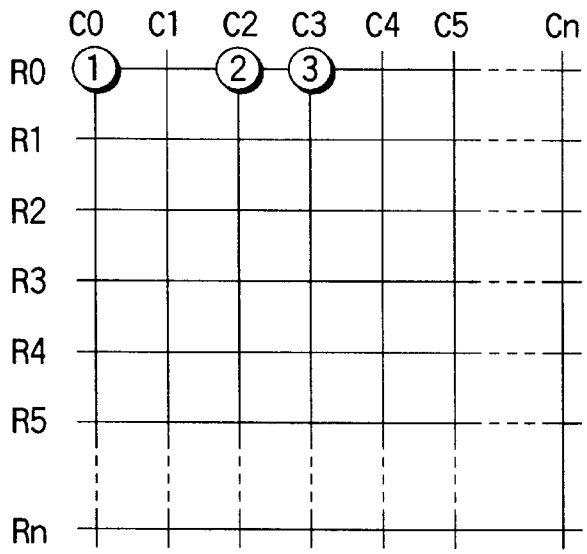
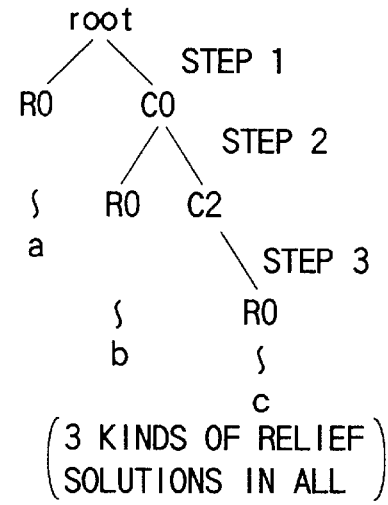
FIG. 12A  FIG. 12B
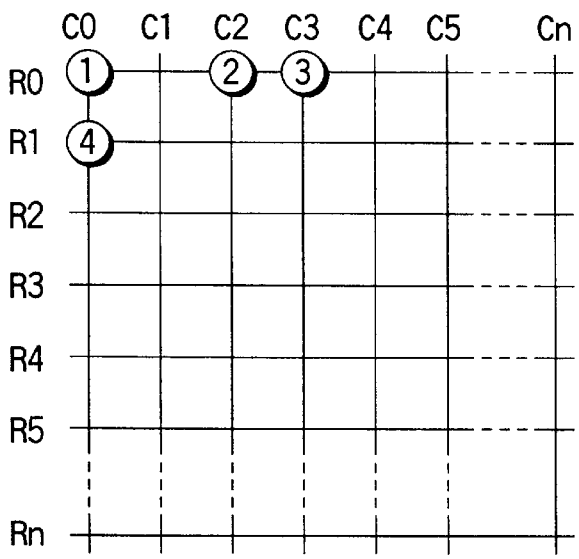
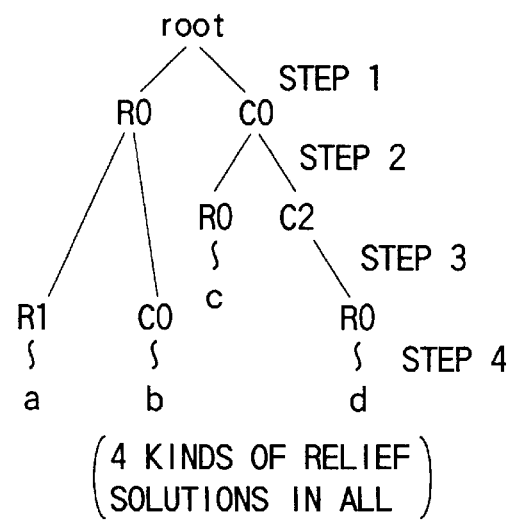
FIG. 13A  FIG. 13B

X ; IMRELIEVABLE CASE (5 KINDS OF RELIEF SOLUTIONS IN ALL)

TEMPLATE OF "TREE" STRUCTURE
(IN CASE NRS(NUMBER OF SPARE ROW)=2,
NCS(NUMBER OF SPARE COLUMN)=2)

TEMPLATE ARRANGEMENT OF "TREE" STRUCTURE
(IN CASE NRS(NUMBER OF SPARE ROW)=2,
NCS(NUMBER OF SPARE COLUMN)=2)

ARRANGEMENT M (RETAIN FAILURE BIT ADDRESS)
(IN CASE NRS(NUMBER OF SPARE ROW)=2,
NCS(NUMBER OF SPARE COLUMN)=2)

FIG. 19

| | ORDER → | | | |
|---|---|---|---|---|
| SR11 | SR12 | SR13 | SR14 | SR15 |
| SR21 | SR22 | SR23 | SR24 | SR25 |
| SR31 | SR32 | SR33 | SR34 | SR35 |
| SR41 | SR42 | SR43 | SR44 | SR45 |
| SR51 | SR52 | SR53 | SR54 | SR55 |
| SR61 | SR62 | SR63 | SR64 | SR65 |

ARRANGEMENT SR (RETAIN EFFECTIVE BIT)
{IN CASE NRS(NUMBER OF SPARE ROW)=2,
NCS(NUMBER OF SPARE COLUMN)=2}

FIG. 20

| ORDER → | | | |
|---|---|---|---|
| R0 | R1 | C1 | |
| R0 | C0 | R1 | C1 |
| R0 | C0 | C1 | |
| C0 | R0 | R1 | C1 |
| C0 | R0 | C1 | |
| C0 | C2 | R0 | R1 |

ARRANGEMENT M
{IN CASE NRS(NUMBER OF SPARE ROW)=2,
NCS(NUMBER OF SPARE COLUMN)=2}

FIG. 21

| ORDER → | | | | |
|---|---|---|---|---|
| 1 | 1 | 1 | 0 | 0 |
| 1 | 1 | 1 | 1 | 0 |
| 1 | 1 | 1 | 0 | 0 |
| 1 | 1 | 1 | 1 | 0 |
| 1 | 1 | 1 | 0 | 0 |
| 1 | 1 | 1 | 1 | 1 |

ARRANGEMENT SR
{IN CASE NRS(NUMBER OF SPARE ROW)=2,
NCS(NUMBER OF SPARE COLUMN)=2}

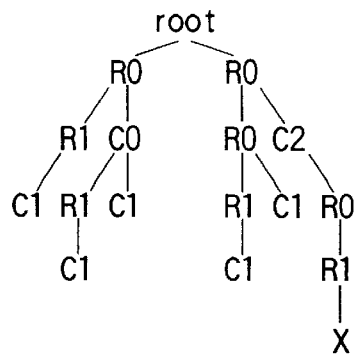

FIG. 22

| | | | | | | | | | | | | | | | | | |
|--|--|--|--|--|--|--|--|--|--|--|--|--|--|--|--|--|--|
|1|R|R|R|R|C|C|C|C|36|C|R|R|R|R|C|C|C|
|2|R|R|R|C|R|C|C|C|37|C|R|R|R|C|R|C|C|
|3|R|R|R|C|C|R|C|C|38|C|R|R|R|C|C|R|C|
|4|R|R|R|C|C|C|R|C|39|C|R|R|R|C|C|C|R|
|5|R|R|R|C|C|C|C|R|40|C|R|R|C|R|R|C|C|
|6|R|R|C|R|R|C|C|C|41|C|R|R|C|R|C|R|C|
|7|R|R|C|R|C|R|C|C|42|C|R|R|C|R|C|C|R|
|8|R|R|C|R|C|C|R|C|43|C|R|R|C|C|R|R|C|
|9|R|R|C|R|C|C|C|R|44|C|R|R|C|C|R|C|R|
|10|R|R|C|C|R|R|C|C|45|C|R|R|C|C|C|R|R|
|11|R|R|C|C|R|C|R|C|46|C|R|C|R|R|R|C|C|
|12|R|R|C|C|R|C|C|R|47|C|R|C|R|R|C|R|C|
|13|R|R|C|C|C|R|R|C|48|C|R|C|R|R|C|C|R|
|14|R|R|C|C|C|R|C|R|49|C|R|C|R|C|R|R|C|
|15|R|R|C|C|C|C|R|R|50|C|R|C|R|C|R|C|R|
|16|R|C|R|R|R|C|C|C|51|C|R|C|R|C|C|R|R|
|17|R|C|R|R|C|R|C|C|52|C|R|C|C|R|R|R|C|
|18|R|C|R|R|C|C|R|C|53|C|R|C|C|R|R|C|R|
|19|R|C|R|R|C|C|C|R|54|C|R|C|C|R|C|R|R|
|20|R|C|R|C|R|R|C|C|55|C|R|C|C|C|R|R|R|
|21|R|C|R|C|R|C|R|C|56|C|C|R|R|R|R|C|C|
|22|R|C|R|C|R|C|C|R|57|C|C|R|R|R|C|R|C|
|23|R|C|R|C|C|R|R|C|58|C|C|R|R|R|C|C|R|
|24|R|C|R|C|C|R|C|R|59|C|C|R|R|C|R|R|C|
|25|R|C|R|C|C|C|R|R|60|C|C|R|R|C|R|C|R|
|26|R|C|C|R|R|R|C|C|61|C|C|R|R|C|C|R|R|
|27|R|C|C|R|R|C|R|C|62|C|C|R|C|R|R|R|C|
|28|R|C|C|R|R|C|C|R|63|C|C|R|C|R|R|C|R|
|29|R|C|C|R|C|R|R|C|64|C|C|R|C|R|C|R|R|
|30|R|C|C|R|C|R|C|R|65|C|C|R|C|C|R|R|R|
|31|R|C|C|R|C|C|R|R|66|C|C|C|R|R|R|R|C|
|32|R|C|C|C|R|R|R|C|67|C|C|C|R|R|R|C|R|
|33|R|C|C|C|R|R|C|R|68|C|C|C|R|R|C|R|R|
|34|R|C|C|C|R|C|R|R|69|C|C|C|R|C|R|R|R|
|35|R|C|C|C|C|R|R|R|70|C|C|C|C|R|R|R|R|

FIG. 23  TEMPLATE ARRANGEMENT OF "TREE" STRUCTURE (IN CASE NRS(NUMBER OF SPARE ROW)=4, NCS(NUMBER OF SPARE COLUMN)=4)

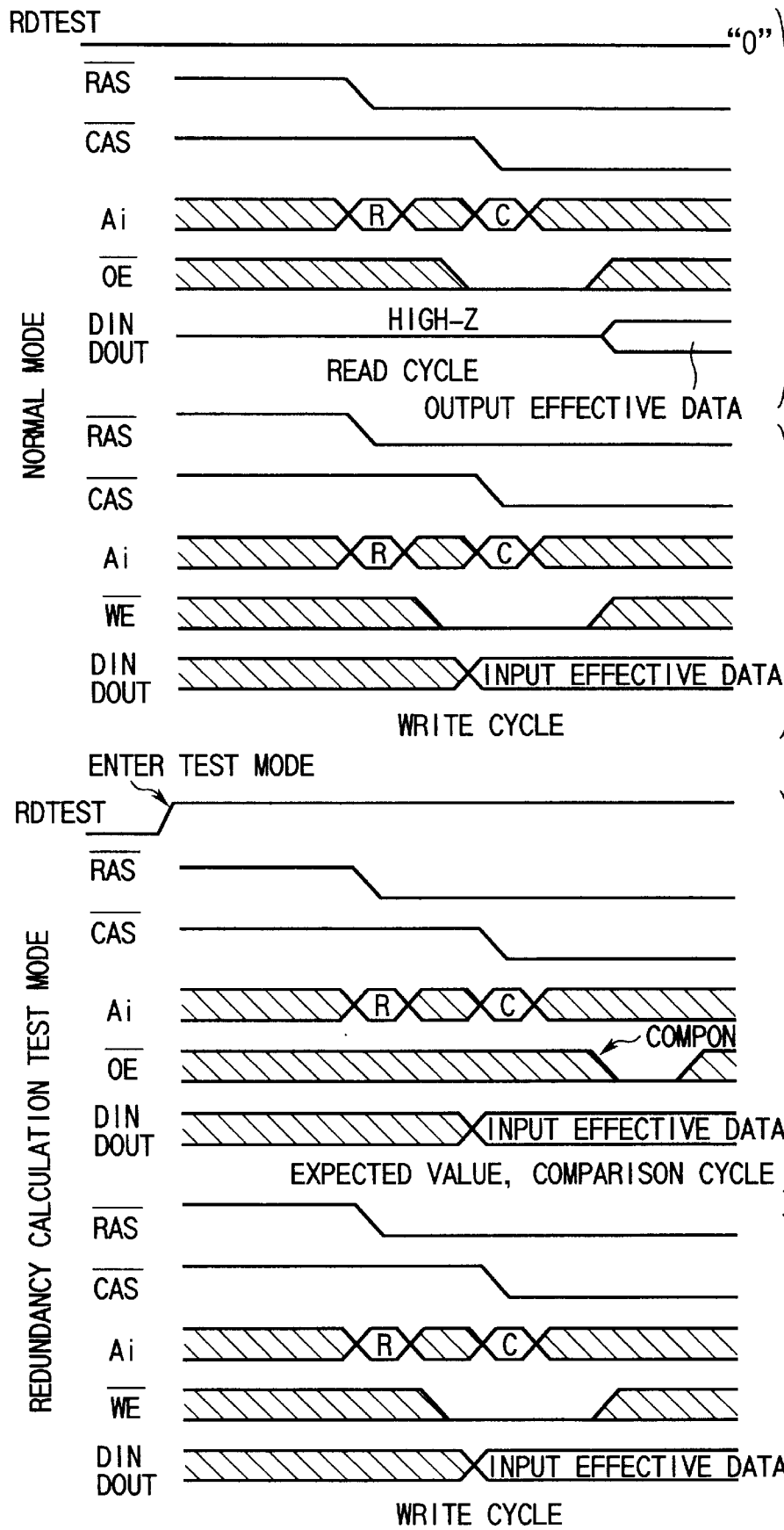

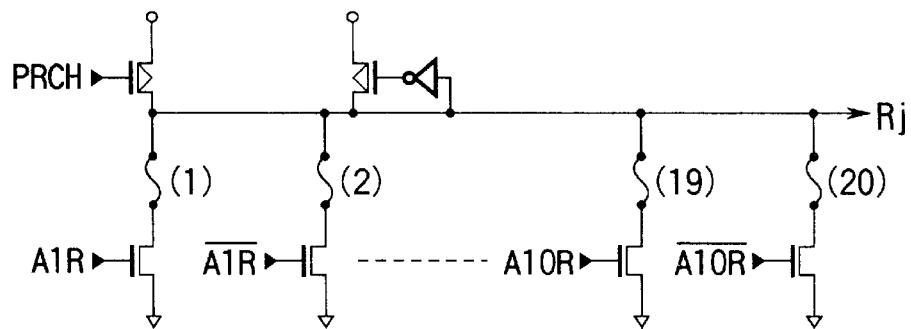
FIG. 58  NORMAL FUSE
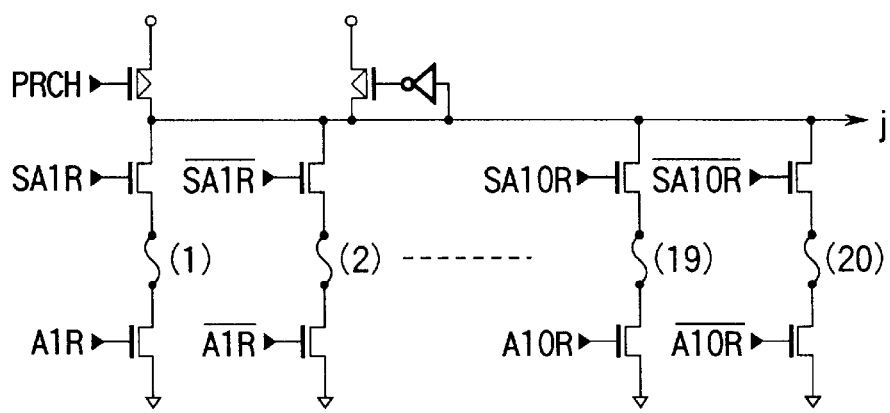
FIG. 59  SOFT-SETTABLE FUSE
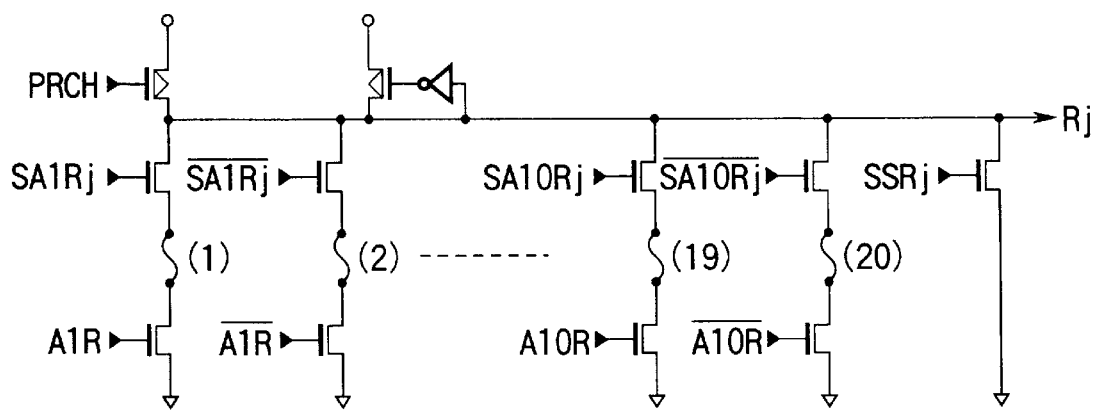
FIG. 60

• BIST
• BISR

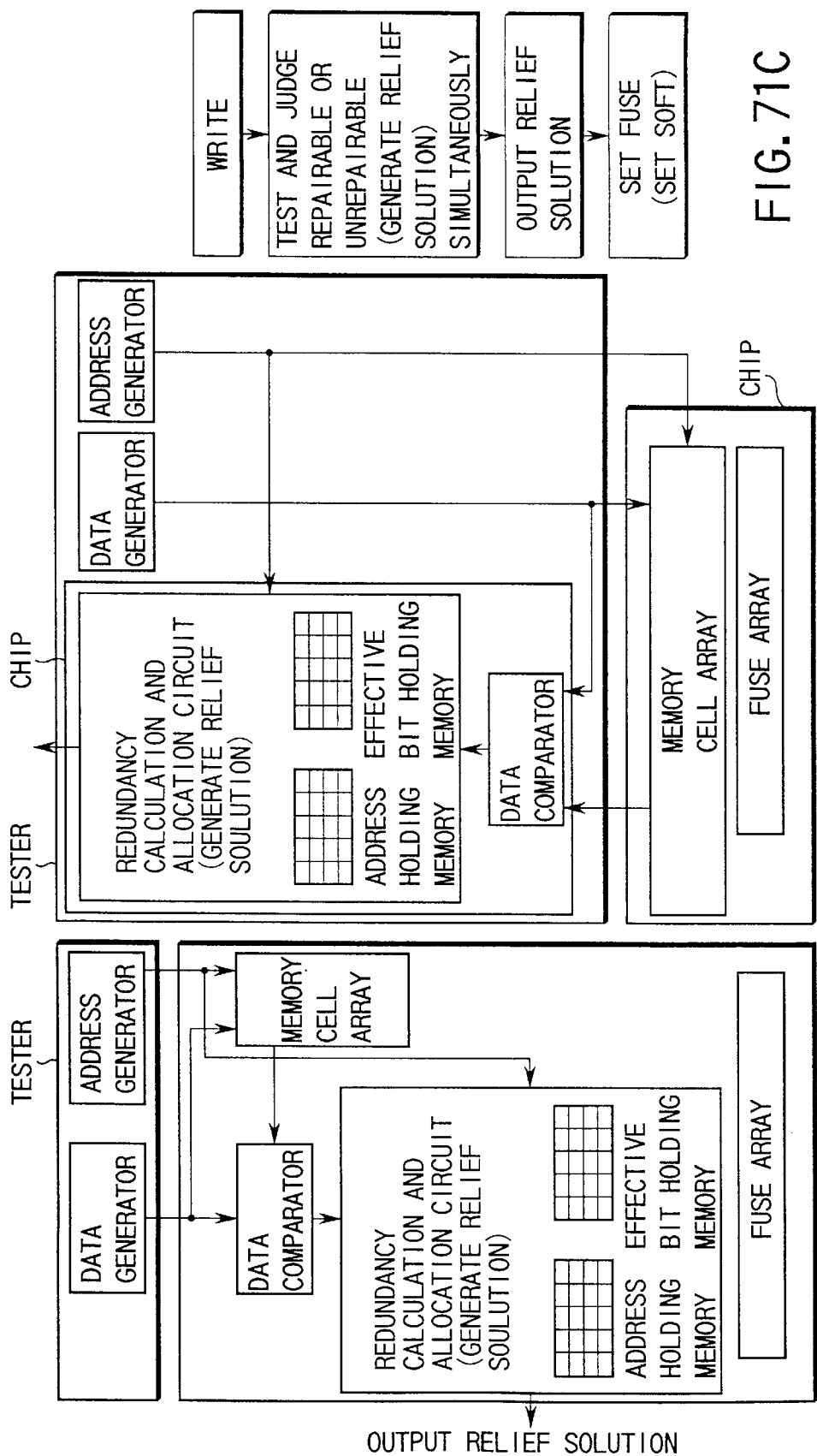

SEMICONDUCTOR MEMORY DEVICE

BACKGROUND OF THE INVENTION

The present invention relates to a redundancy technique in semiconductor memory devices.

When manufacturing semiconductor memory devices, particles (i.e., impurities such as dust) are in general apt to get mixed in a silicon device in the middle course of each process. In the thermal process, stress is caused in silicon crystal and consequently defects are apt to occur.

Such mixture of a particle or occurrence of a defect becomes a cause of a memory cell failure of a semiconductor memory device.

As for memory cell failures, there are a single bit failure in which one predetermined memory cell of a memory cell array fails, a line failure in which a plurality of memory cells belonging to one row or one column of a memory cell array fail, and an area failure in which a plurality of memory cells contained in a predetermined area of a memory cell array fails.

To a memory cell failure, a redundancy technique for repairing the failure memory cell and thereby making it function as a normal semiconductor memory device has heretofore been applied.

The redundancy technique is frequently used in semiconductor memory devices including DRAMs (dynamic random access memories). According to this technique, all bit data are retained accurately by substituting a failure memory cell by a spare redundancy memory cell. In DRAMs, for example, the redundancy technique has been adopted from the 256-kbit generation.

The redundancy technique substitutes a failure memory cell by a redundancy memory cell. The greater the number of the redundancy memory cells is, the greater the number of normal semiconductor memory devices which can be obtained, resulting in an improved manufacturing yield.

On the other hand, the generation of DRAMS advances from 256-kbits to 1-gigabits through 1-Mbits, 4-Mbits, 16-Mbits, 64-Mbits and 256-Mbits. As the memory cell size is thus reduced, the probability of failure occurrence becomes high because of fine particles which have not posed a problem until then and an increase of stress of silicon crystal caused by a high density of memory cells on the surface of the silicon crystal.

Such occurrence of failure memory cells attendant upon the advance of the DRAM generation can be reduced by the development of a cleaning technique for reducing the particles and a process for relaxing the stress of the silicon crystal.

With only the development of the cleaning technique and a new process, however, there is a limit in preventing the occurrence of a failure memory cell.

Accordingly, the redundancy technique becomes important. In repairing a failure memory cell by using the redundancy technique, a typical method for improving the repair efficiency is to increase the number of spare rows and spare columns each of which forms the repair unit.

Here, the term "spare row" means a row formed by spare redundancy memory cells extending in the row direction of the memory cell array. The term "spare column" means a column formed by spare redundancy memory cells extending in the column direction of the memory cell array.

In the 1-Mbit generation, one spare row and one spare column are provided every 256-kbits (i.e., four spare rows and four spare columns are provided in all). In the 64-Mbit generation, eight spare rows and four spare columns are provided every one Mbit (i.e., 512 spare rows and 256 spare columns are provided in all).

Thus, by proceeding the generation of DRAMs, the number of spare lines (spare rows and spare columns) increase to improve repair efficiency.

As a result of the increase of the spare lines, however, it becomes difficult and takes a long time to judge in the redundancy technique whether a failure memory cell is repairable.

In the current judgment as to whether a failure memory cell is repairable, a functional test is carried out by using a memory tester, and on the basis of information of the failure memory cell (failure bit) obtained by this memory tester, a predetermined algorithm is used.

The tester stores an algorithm to be used in the judgment as to whether failure memory cells are repairable. Under control of the CPU, the tester starts this algorithm. If as a result of the judgment as to whether failure memory cells are repairable it is determined that all failure memory cells can be repaired by the spare lines incorporated in the semiconductor memory device, processing for substituting the failure memory cells by redundancy memory cells of the spare lines is carried out.

If as a result of the judgment as to whether failure memory cells are repairable it is determined that all failure memory cells are unrepairable by the spare lines incorporated in the semiconductor memory device, this semiconductor memory device is judged to be failed.

If the number of the spare lines each serving as the repair unit is small, the algorithm for repair becomes simple and the time required for the judgment becomes short. As the number of the spare lines each serving as the repair unit, however, the algorithm for repair becomes complicated and the time required for the judgment becomes long.

In some testers in recent years, a CPU for memory tester and a CPU for redundancy analysis are provided and both of those functions are simultaneously activated to conduct the parallel processing. However, failure occurrence information for carrying out the redundancy analysis is a result obtained by a memory tester immediately preceding (in time) the function being currently carried out. It isn't that the test and the analysis are carried out at the same time and in parallel.

As the algorithm for repair becomes complicated, therefore, the time required for the redundancy analysis becomes significantly longer than the time of the memory tester. As a result, there is a possibility that the speed of the test time is constrained.

Thus in semiconductor memory devices in which failure memory cells are repaired by using the redundancy technique, an increase of the capacity of the semiconductor memory device causes an increase in the number of spare lines each serving as the repair unit. The increase in the number of spare lines complicates the algorithm for judging as to whether repair is possible and consequently the computation time becomes long and exceeds a practical test time.

BRIEF SUMMARY OF THE INVENTION

In semiconductor memory devices in which failure memory cells are repaired by using the redundancy technique, an object of the present invention is to shorten the time for performing the redundancy and make the time of the memory cell (including the redundancy) practical by developing a novel algorithm for judging whether the memory cell is repairable.

A semiconductor memory device according to the present invention comprises: a memory cell array; a redundancy memory cell array provided as a reserve for the memory cell array; a redundancy calculation and allocation circuit, whenever a test circuit for successively testing a plurality of memory cells forming the memory cell array has found a failure memory cell, for generating at least one repair solution for repairing the failure memory cell in parallel to the test of the plurality of memory cells carried out by the test circuit; and a redundancy circuit for substituting a row or a column of the memory cell array by a row or a column of the redundancy memory cell array on the basis of the at least one repair solution. Where, the memory cell array comprises a plurality of repair units, the redundancy memory cell array is provided for each of the plurality of repair units, and the generation of the at least one repair solution by the redundancy calculation and allocation circuit and the substitution of a row or a column of the memory cell array on the basis of the at least one repair solution are carried out for each of the plurality of repair units.

Preferred manners of the above described semiconductor memory device are as follows.

(1) The substitution of a row or a column of the memory cell array is carried out by fuse blow or electric means.

(2) The semiconductor memory device is formed in a semiconductor chip, and the test circuit is incorporated in the semiconductor chip.

(3) The at least one repair solution is one of all repair solutions capable of repairing the failure memory cell.

(4) The number of the at least one repair solutions is $_{NRS+NCS}C_{NRS}$ (combinations of taking NRS out of NRS+NCS) at maximum. In the case where a memory cell array has a plurality of repair units, NRS represents the number of spare rows contained in the repair unit and NCS represents the number of spare columns contained in the repair unit.

(5) The redundancy calculation and allocation circuit has $_{NRS+NCS}C_{NRS}$ blocks, whenever the failure memory cell is found, one repair solution is generated and retained for each of the blocks, and an effective bit indicating whether or not the one repair solution is effective is retained in each of the blocks.

(6) The one repair solution is constructed by an arrangement of row addresses for selecting a row containing the failure memory cell or column addresses for selecting a column containing the failure memory cell, and arrangement of the row addresses or the column addresses in each block differs from block to block. In other words, one repair solution is formed by such an arrangement as to include a failure memory cell. The order of the arrangement differs every repair solution.

(7) Row addresses or column addresses contained in the at least one repair solution are different from each other. In other words, repair solutions including the same row address or the same column address are prevented from being generated.

(8) An output control circuit for serially outputting the at least one repair solution to outside of a chip on which the semiconductor memory device is formed is further provided. In the case where a memory cell array has a plurality of repair units, an output control circuit is provided for each repair unit.

(9) In (7), in the case where the test circuit conducts a plurality of test, the output control circuit outputs the at least one repair solution whenever each test is completed, or in the case where the test circuit conducts a plurality of test, the output control circuit outputs the at least one repair solution for each test after all tests are completed.

(10) The redundancy calculation and allocation circuit generates effective bits indicating whether or not the at least one repair solution is effective.

(11) In (9), an output control circuit for serially outputting the at least one repair solution and the effective bits to outside of a chip on which the semiconductor memory device is formed is further provided.

(12) In the case where the test circuit conducts a plurality of test, the output control circuit outputs the at least one repair solution and the effective bits whenever each test is completed, or in the case where the test circuit conducts a plurality of test, the output control circuit outputs the at least one repair solution and the effective bits for each test after all tests are completed.

(13) The redundancy circuit substitutes a row or a column of the memory cell array to a row or a column of the redundancy memory cell array based on one optimum repair solution capable of repairing the failure memory cell the most efficiently out of the at least one repair solution.

(14) The optimum repair solution is a solution as to reduce the number of rows and columns of the redundancy memory cell array required to repair a failure to a minimum.

(15) A tester for supplying row address data, column address data, and test data to the semiconductor memory device and receiving the at least one repair solution from the semiconductor memory device is further provided.

(16) A tester for receiving the at least one repair solution from the semiconductor memory device is further provided, and upon receiving a control signal of the tester, the test circuit of the semiconductor memory device generates row address data, column address data, and test data.

In the above described configuration, it is preferable that the redundancy circuit substitutes a row or a column of the memory cell array to a row or a column of the redundancy memory cell array based on one optimum repair solution capable of repairing the failure memory cell the most efficiently out of the at least one repair solution, or the optimum repair solution is a solution as to reduce the number of rows and columns of the redundancy memory cell array required to repair a failure to a minimum.

A semiconductor memory test system according to the present invention comprises: a semiconductor memory device including a memory cell array, a redundancy memory cell array provided as a reserve for the memory cell array, and a redundancy circuit for substituting a row or a column of the memory cell array by a row or a column of the redundancy memory cell array on the basis of the at least one repair solution; and a test device including a test circuit for successively testing a plurality of memory cells forming the memory cell array, and a redundancy calculation and allocation circuit, wherein whenever the test circuit has found a failure memory cell, the redundancy calculation and allocation circuit generates at least one repair solution for repairing the failure memory cell in parallel to the test of the plurality of memory cells carried out by the test circuit.

A still another semiconductor memory device according to the present invention comprises: a memory cell array; a redundancy memory cell array provided as a reserve for the memory cell array; a redundancy calculation and allocation circuit, whenever a test circuit for successively testing a plurality of memory cells forming the memory cell array has found a failure memory cell, for generating at least one repair solution for repairing the failure memory cell in parallel to the test of the plurality of memory cells carried out by the test circuit; storage circuit included in the redundancy calculation and allocation circuit for storing the at least one repair solution during the test; and a redundancy circuit for substituting a row or a column of the memory cell array by a row or a column of the redundancy memory cell array on the basis of the at least one repair solution.

It is preferable that the storage circuit is a nonvolatile semiconductor memory which is readable, programmable and erasable, and/or is preferable that when at least one repair solution has a plurality of repair solutions, an optimum repair solution is selected among the plurality of effective repair solutions, and the redundancy circuit substitutes a row or a column of the memory cell array to a row or a column of the redundancy memory cell array based on the optimum repair solution.

In a memory cell repair method according to the present invention, a plurality of memory cells forming a memory cell array are tested one after another. Each time a failure memory cell is found, at least one repair solution for repairing the failure memory cell is generated in parallel to the test of the plurality of memory cells.

Preferred manners of the repair method are as follows.

(1) On the basis of the at least one repair solution, a row or column of the memory cell array is substituted by a row or column of the redundancy memory cell array.

(2) A row or column of the memory cell array is substituted by a row or column of the redundancy memory cell array by fuse blowing or electric means.

(3) The at least one repair solution is one of all repair solutions capable of repairing the failure memory cells.

(4) The maximum number of the at least one repair solutions is $_{NRS+NCS}C_{NRS}$ (combination of deriving NRS from NRS+NCS) (where NRS is the number of the spare rows and NCS is the number of the spare columns).

(5) The at least one repair solution is formed by an arrangement of row addresses for selecting rows containing the failure memory cells or column addresses for selecting columns containing the failure memory cells.

(6) The at least one repair solution does not contain the same row address or the same column address.

(7) Out of the at least one repair solution, one repair solution capable of repairing the failure memory cell most efficiently is selected. On the basis of the selected one repair solution, rows or columns of the memory cell array are substituted by rows or columns of the redundancy memory cell array. The term "one repair solution capable of repairing the failure memory cell most efficiently" means such a solution that the number of rows and columns of the redundancy memory cell array required to repair the failure is minimized.

According to another method for generating a repair solution, a repair solution is formed by an arrangement of row addresses or column addresses. In substituting rows or columns of a memory cell array selected by the row addresses or column addresses of the repair solution by rows or columns of a redundancy memory cell array, a row address or column address of the failure memory cell is added to the repair solution, only when a row address or column address of the failure memory cell does not coincide with any row address or column address of the repair solution.

In the repair method, preferred manners are as follows.

(1) When the row address or column address of the failure memory cell coincides with a row address or column address of the repair solution, the row address or column address of the failure memory cell is not added to the repair solution.

(2) When the repair solution already contains NRS row addresses in the case where the redundancy memory cell array includes NRS spare rows, the row address of the failure memory cell is not added to the repair solution, even if the row address of the failure memory cell does not coincide with any row address of the repair solution.

(3) When the repair solution already contains NCS column addresses in the case where the redundancy memory cell array includes NCS spare columns, the column address of the failure memory cell is not added to the repair solution, even if the column address of the failure memory cell does not coincide with any column address of the repair solution.

(4) In the case where the redundancy memory cell array is formed by NRS spare rows and NCS spare columns, the repair solution is invalidated, when the repair solution already contains NRS row addresses and NCS column addresses and the row address or column address of the failure memory cell does not coincide with any row address or column address of the repair solution.

A still another memory cell repair method according to the present invention comprises the steps of testing a plurality of memory cells forming a memory cell array one after another, generating at least one repair solution for repairing the failure memory cell in parallel to the test of the plurality of memory cells in each time a failure memory cell is found, substituting a row or a column of the memory cell array by a row or a column of the redundancy memory cell array on the basis of the at least one repair solution.

It is preferable that when at least one repair solution has a plurality of repair solutions, an optimum repair solution is selected among the plurality of effective repair solutions, and a row or a column of the memory cell array is substituted to a row or a column of the redundancy memory cell array based on the optimum repair solution.

A recording medium according to the present invention has a program for testing a plurality of memory cells forming a memory cell array one after another and generating at least one repair solution for repairing the failure memory cell in parallel to the test of the plurality of memory cells whenever a failure memory cell is found.

Preferred manners of the recording medium are as follows.

(1) The recording medium further comprises a program for substituting a row or column of the memory cell array by a row or column of the redundancy memory cell array on the basis of the at least one repair solution.

(2) The recording medium further comprises a program for substituting a row or column of the memory cell array by a row or column of the redundancy memory cell array by fuse blowing or electric means.

(3) The recording medium comprises a program that the at least one repair solution is one of all repair solutions capable of repairing the failure memory cells.

(4) The recording medium comprises a program that the maximum number of the at least one repair solutions is $_{NRS+NCS}C_{NRS}$ (combination of deriving NRS from NRS+NCS) (where NRS is the number of the spare rows and NCS is the number of the spare columns).

(5) The recording medium comprises a program that the at least one repair solution is formed by an arrangement of row addresses for selecting rows containing the failure memory cells or column addresses for selecting columns containing containing the failure memory cells.

(6) The recording medium comprises a program that the at least one repair solution does not contain the same row address or the same column address.

(7) The recording medium comprises a program that out of the at least one repair solution, one repair solution capable of repairing the failure memory cell most efficiently is selected, and on the basis of the one repair solution, rows or columns of the memory cell are substituted by rows or columns of the redundancy memory cell array.

Another recording medium according to the present invention comprises a program that a repair solution is formed by an arrangement of row addresses or column addresses, and in substituting rows or columns of a memory cell array selected by the row addresses or column addresses of the repair solution by rows or columns of a redundancy memory cell array, a row address or column address of the failure memory cell is added to the repair solution, only when a row address or column address of the failure memory cell does not coincide with any row address or column address of the repair solution.

Preferred manners of the recording medium are as follows.

(1) The recording medium comprises a program that when the row address or column address of the failure memory cell coincides with a row address or column address of the repair solution, the row address or column address of the failure memory cell is not added to the repair solution.

(2) The recording medium comprises a program that when the repair solution already contains NRS row addresses in the case where the redundancy memory cell array includes NRS spare rows, the row address of the failure memory cell is not added to the repair solution, even if the row address of the failure memory cell does not coincide with any row address of the repair solution.

(3) The recording medium comprises a program that when the repair solution already contains NCS column addresses in the case where the redundancy memory cell array includes NCS spare columns, the column address of the failure memory cell is not added to the repair solution, even if the column address of the failure memory cell does not coincide with any column address of the repair solution.

(4) The recording medium comprises a program that in the case where the redundancy memory cell array is formed by NRS spare rows and NCS spare columns, the repair solution is invalidated, when the repair solution already contains NRS row addresses and NCS column addresses and the row address or column address of the failure memory cell does not coincide with any row address or column address of the repair solution.

A still another recording medium according to the present invention comprises a program for performing the following sequence: testing a plurality of memory cells forming a memory cell array one after another, generating at least one repair solution for repairing the failure memory cell in parallel to the test of the plurality of memory cells in each time a failure memory cell is found, substituting a row or a column of the memory cell array by a row or a column of the redundancy memory cell array on the basis of the at least one repair solution.

It is preferable that when at least one repair solution has a plurality of repair solutions, an optimum repair solution is selected among the plurality of effective repair solutions, and a row or a column of the memory cell array is substituted to a row or a column of the redundancy memory cell array based on the optimum repair solution.

The semiconductor memory device according to the present invention brings about the following advantages.

The repair solution is generated simultaneously with the memory tester. In addition, the time required for the redundancy calculation and allocation can be significantly reduced by carrying out the memory tester and generation of the repair solution simultaneously even in one repair unit, not to mention carrying out simultaneous processing for every repair unit (memory cell array) included in the memory chip.

In the case where the number of spare lines is small in the repair unit included in the memory chip, it is effective to form a circuit for redundancy calculation and allocation in the memory chip (i.e., in the on-chip form).

On the other hand, in the case where the number of spare lines is large in the repair unit included in the memory chip, the overhead inevitably becomes large. In such a case, it is realistic to, for example, form a circuit for redundancy calculation and allocation on a chip different from the memory chip as an exclusive LSI and incorporate this exclusive LSI in the tester.

As the memory generation advances, a fail bit memory having a corresponding capacity is needed. The price of the fail bit memory, and accordingly the price of the tester are getting higher and higher. If the exclusive LSI described herein is prepared, the fail bit memory becomes unnecessary. Together with the shortening of the test time, therefore, there are obtained merits such as reduction of the manufacturing cost of memory chips and improvement of the yield owing to the redundancy calculation and allocation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 5A and 5B are diagrams showing one process included all processes for generating a "tree" structure (repair solution) concerning a first exercise of the present invention;

FIGS. 6A and 6B are diagrams showing one process included all processes for generating a "tree" structure (repair solution) concerning a first exercise of the present invention;

FIGS. 10A and 10B are diagrams showing one process included all processes for generating a "tree" structure (repair solution) concerning a second exercise of the present invention;

FIGS. 11A and 11B are diagrams showing one process included all processes for generating a "tree" structure (repair solution) concerning a second exercise of the present invention;

FIGS. 12A and 12B are diagrams showing one process included all processes for generating a "tree" structure (repair solution) concerning a second exercise of the present invention;

FIGS. 13A and 13B are diagrams showing one process included all processes for generating a "tree" structure (repair solution) concerning a second exercise of the present invention;

FIG. 19 is a diagram showing an arrangement of a storage unit SR for retaining effective bits;

FIG. 20 is a diagram showing an example of failure bit addresses retained in the storage unit M;

FIG. 21 is a diagram showing an example of effective bits retained in the storage unit SR;

FIG. 22 is a diagram showing a "tree" structure in the case where data of FIG. 20 and FIG. 21 are retained;

FIG. 23 is a diagram showing a display obtained by arranging templates of the "tree" structure;

FIGS. 31A and 31B are diagrams showing timing of signals in a normal mode of the semiconductor memory device of FIG. 25;

FIGS. 32A and 32B are diagrams showing timing of signals in a redundancy calculation test mode of the semiconductor memory device of FIG. 25;

FIG. 58 is a diagram showing a normal fuse array unit which is not soft-settable;

FIG. 59 is a diagram showing a soft-settable fuse array unit;

FIG. 60 is a diagram showing an example of a configuration in the case where the fuse array unit of FIG. 59 is applied to a system of the present invention;

FIGS. 71A to 71C are schematic diagrams showing the configuration of a conventional semiconductor memory;

DETAILED DESCRIPTION OF THE INVENTION

Figure 1:
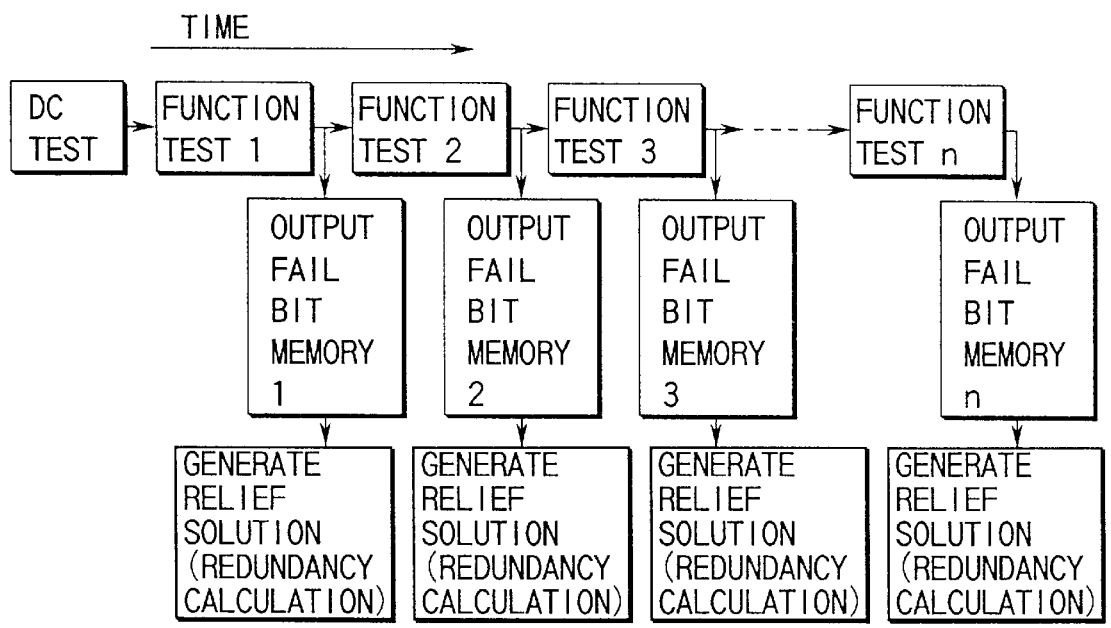
FIG. 1 is a diagram showing conventional time relationship between memory tester for each repair unit of a memory cell array and redundancy calculation and allocation.
Figure 2:
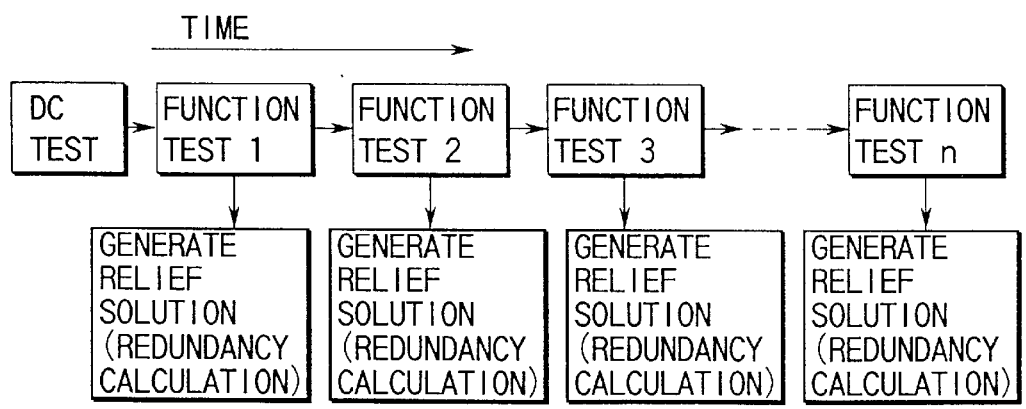
FIG. 2 is a diagram showing time relationship between memory tester for each repair unit of a memory cell array and redundancy calculation and allocation according to the present invention.

Hereafter, a semiconductor memory device of the present invention will be described in detail by referring to the drawing.

A. Summary of Semiconductor Memory of the Present Invention

A semiconductor memory device of the present invention is premised on the assumption that a circuit for redundancy calculation and allocation incorporated in a memory chip in which the semiconductor memory device is formed (i.e., the circuit is formed in an on-chip form).

In other words, a semiconductor memory device of the present invention provides a technique for carrying out the redundancy calculation and allocation of a memory cell at high speed by using an exclusive circuit (hardware) provided in the memory chip instead of executing the redundancy calculation and allocation of the memory cell under the control of a CPU of a tester.

In the case where the memory capacity increases and the number of spare lines each serving as the repair unit becomes very large, however, it is desirable in some cases to form the circuit for executing the redundancy calculation and allocation in an exclusive chip, dispose this exclusive chip in the tester, and execute the redundancy calculation and allocation of a memory cell under the control of the tester. For the semiconductor memory device of the present invention, therefore, such a case is also considered.

The semiconductor memory device of the present invention is premised on the assumption that a circuit (hardware) capable of carrying out the memory tester of the semiconductor memory device and the redundancy calculation and allocation of a memory cell in parallel is provided.

Simultaneously with providing the semiconductor memory device with address data successively, reading out memory data successively, comparing the memory data with an expected value, and testing whether a memory cell is good or failed, a repair solution is generated in the same cycle by a predetermined algorithm on the basis of a result of this test. As the test results indicating whether respective memory cells are normal or failed increase, therefore, the repair solution successively changes. In addition, simultaneously at the time of the test end, generation of the final repair solution has also been finished.

Conventionally, after all memory cells (bits) were tested, the redundancy calculation and allocation is carried out on the basis of the test result (arrangement of failure bits) (blanket repair algorithm) as shown in FIG. 1. Whenever a failure memory cell (bit) is found during the test, however, repair solutions are successively generated in parallel to the test in the present invention (successive repair algorithm) as shown In the semiconductor memory device of the present invention, an algorithm enumerating all possible repair solutions is adopted for failure memory cells (bits).

This repair algorithm is thus carried out in parallel with the memory tester. By taking out a result of the redundancy calculation and allocation outside of the memory chip when the test of all memory cells (bits) is finished, therefore, it can be determined whether the memory chip (semiconductor memory device) is a good chip or a failure chip.

If the memory chip is good, a special readout mode is executed and redundancy calculation and allocation information is read outside the memory chip. On the basis of the redundancy calculation and allocation information (repair solution), the fuse element blows.

In the case of the semiconductor memory device according to the present invention, repair solutions are successively stacked in the memory chip. Therefore, it is also possible to obtain redundancy calculation and allocation information after a plurality of memory testers have been carried out.

Therefore, the present invention is suitable for selection of good chips out of such semiconductor memory devices as to require a margin test and a large number of memory testers.

In the case where a plurality of memory testers are carried out, it is possible to monitor, after each memory tester, redundancy calculation and allocation information based upon that memory tester. Therefore, the present invention can contribute to the failure analysis and test time shortening.

Even if the hardware configuration as heretofore described is formed in an exclusive chip separate from the memory chip and this exclusive chip is incorporated into the tester, the redundancy calculation and allocation of a memory cell contained in the memory chip can be carried out at high speed.

B. Repair Solution Generation Algorithm applied to the Semiconductor Memory of The Present Invention and Circuit for executing the Algorithm a. Algorithm for Generating Repair Solution (Redundancy Calculation)

In the present invention, an algorithm enumerating all possible repair solutions is adopted for failure memory cells (bits) as described above. Understanding this algorithm becomes the basis for setting the memory capacity and data rate of redundancy calculation and allocation circuit, when this algorithm is actually implemented as hardware.

In general, for one or more failure bits (failure of a memory cell storing one bit data), how to substitute the failure bits by redundancy memory cells of the spare line (hereafter referred to as repair solution) is not always limited to one way.

For example, for a single bit failure, there are two repair solutions: a solution of substituting the failure memory cell by a redundancy memory cell of a spare row; and a solution of substituting the failure memory cell by a redundancy memory cell of a spare column.

Hereafter, the algorithm enumerating all possible repair solutions for all failure bits will now be described.

If this algorithm is executed and a repair solution is not present, then it means that all failure memory cells (bits) cannot be repaired. Therefore, the memory chip is judged to be a failure chip.

If one or more repair solutions are present, it means that all failure memory cells (bits) can be repaired. In the case where one repair solution is present, the failure memory cell may be substituted by the redundancy memory cell according to the repair solution. In the case where a plurality of repair solutions are present, one repair solution (usually such a repair solution that the number of spare lines to be used or the number of times of fuse blowing (cutting) becomes the least) is selected.

All repair solutions are enumerated by a so-called "tree" structure.

Figure 3:
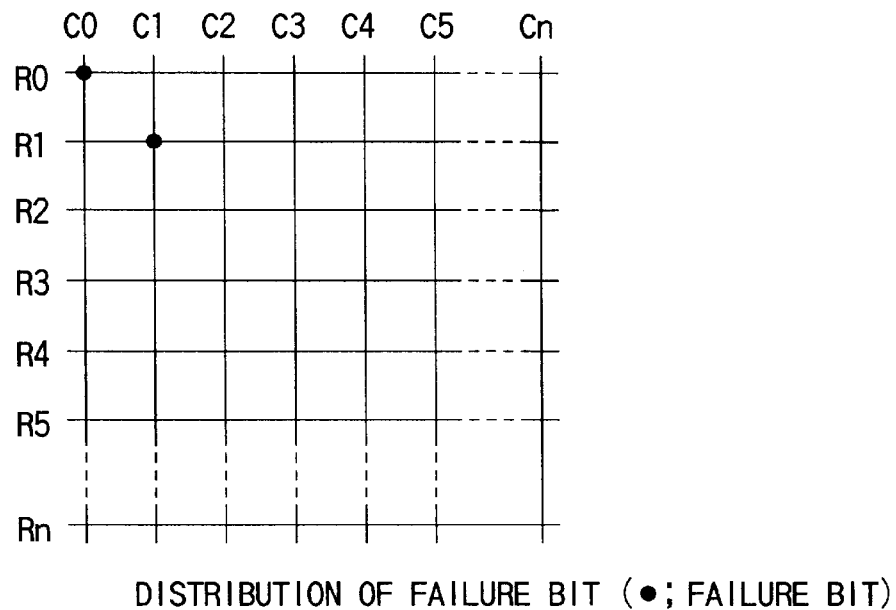
FIG. 3 is a diagram showing positions of failure bits in a memory cell array (repair unit)
Figure 4:
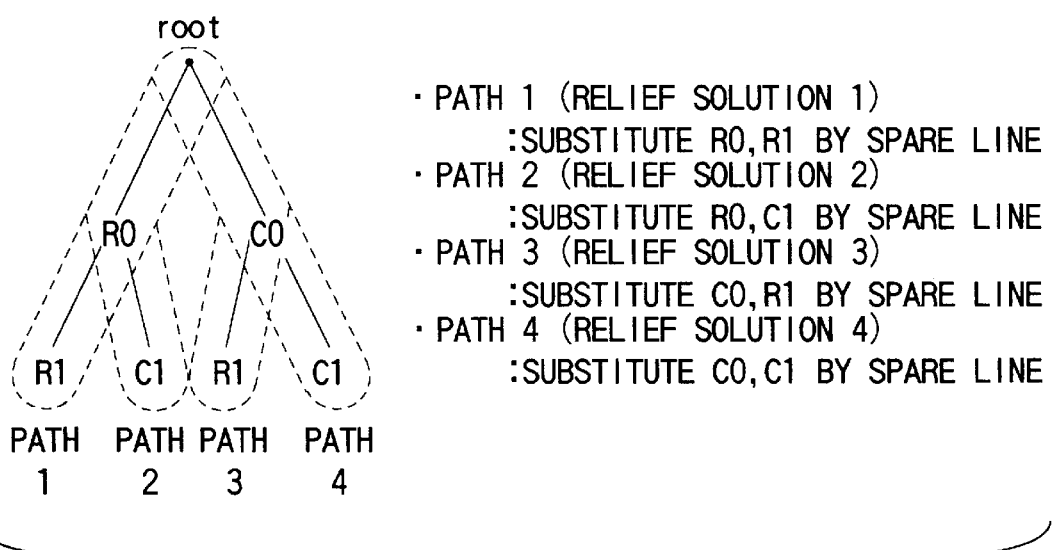
FIG. 4 is a diagram showing relationship between a "tree" structure and repair solutions in the case where there are the failure bits of FIG. 3.

FIG. 3 shows positions of failure bits in the memory cell array. FIG. 4 represents four repair solutions of the case where single bit failures as shown in FIG. 3 are present by using a "tree" structure.

Assuming now that two single bit failures are present and addresses where the failure bits are located are (R0, C0) and (R1, C1), the following four repair solutions can be obtained. Rx and Cx represent a row address and a column address, respectively, and x and y represent virtual serial numbers of row address and column address, respectively. It is assumed that there are two or more spare rows and two or more columns.

Repair using two spare rows

This repair solution substitutes memory cells belonging to respective rows selected by R0 and R1 by redundancy memory cells of respective spare rows.

Repair using two spare columns

This repair solution substitutes memory cells belonging to respective columns selected by C0 and C1 by redundancy memory cells of respective spare column.

Repair using a spare row and a spare column

This repair solution substitutes memory cells belonging to a row selected by R0 by redundancy memory cells of a spare row and substitutes memory cells belonging to a column selected by C1 by redundancy memory cells of a spare column.

Repair using a spare column and a spare row

This repair solution substitutes memory cells belonging to a column selected by C0 by redundancy memory cells of a spare column and substitutes memory cells belonging to a row selected by R1 by redundancy memory cells of a spare row.

b. Relation between "tree" structure and representation of repair solution

Rule 1: Each node of the "tree" structure represents the row address or column address of a failure bit (memory cell).

Rule 2: Each path of the "tree" structure represents a repair solution. The address indicated by each node in each path becomes the address of the failure bit.

If the address represented by a node of the "tree" structure is a row address, the failure bit is substituted by a redundancy memory cell of a spare row. If the address represented by a node of the "tree" structure is a column address, the failure bit is substituted by a redundancy memory cell of a spare column.

c. Rule in generating "tree" structure

Rule 3: To a node of the "tree" structure, a maximum of two branches can be connected.

The "tree" structure changes whenever a new failure bit is found. The change of the "tree" structure follows the following condition with respect to its immediately preceding "tree" structure.

Rule 4: The address (row address and column address) of a newly found failure bit is compared with the address of a failure bit already found (each node of the "tree" structure) every path (branch) of the "tree" structure.

If in each path (branch) of the "tree" structure the address (both the row address and column address) of a newly found failure bit is not in the node of each path, then two more branches are coupled to a node of the most extreme end of each path, and a node (leaf) representing the row address and column address of a failure bit is newly added to the extreme end (the end which newly becomes the extreme end) of each branch.

At this time, the number of paths of the "tree" structure increases by one. For example, if all spare rows have been used up, only one branch is coupled to the node of the most extreme end of the path (branch). To an extreme end of that branch, a node representing the column address of the failure bit is newly added. In the same way, if all spare columns have been used up, only one branch is coupled to the node of the most extreme end of the path (branch). To an extreme end of that branch, a node representing the row address of the failure bit is newly added. (Rule 6)

If all spare rows and spare columns have been used up, then that failure bit becomes unrepairable and consequently as a matter of course a branch cannot be coupled to the node of the most extreme end of the path (branch) (rule 7).

According to the rule 4, it is understood that the address of a failure bit found earlier forms a node located on the root (upper) side of the "tree" structure and the address of a failure bit found later forms a node located on the extreme end (lower) side of the "tree" structure.

Rule 5: The address (row address and column address) of a newly found failure bit is compared with the address of a failure bit already found (each node of the "tree" structure) every path (branch) of the "tree" structure.

If in each path (branch) of the "tree" structure the address (at least one of the row address and column address) of a newly found failure bit is in the node of each path, then a branch is not coupled to a node of the most extreme end of each path.

Because such a failure bit has already been repaired by a redundancy memory cell of a spare row or a spare column.

Rule 6: Denoting the number of spare rows by NRS and the number of spare columns by NCS, only NRS nodes representing row addresses or only NCS nodes representing column addresses can be disposed in each path of the "tree" structure.

In other words, in each path of the "tree" structure, the fact that the number of nodes representing row addresses is NRS means that all spare rows are being used, and the fact the number of columns representing column addresses is NCS means that all spare columns are being used.

If in each path the number of nodes representing row addresses becomes NRS and the number of nodes representing column addresses becomes NCS, then a branch cannot be further coupled to the most extreme end of that path (branch).

Rule 7: When for a new failure bit it becomes impossible to dispose a branch at the most extreme end of every path, it is meant that the new failure bit is unrepairable and the semiconductor memory device is judged to be a failure memory.

d. Exercise 1

Generation of repair solutions using the above described algorithm will now be described by taking the case where the number of spare rows is 2 (NRS=2) and the number of spare columns is 2 (NCS=2) as an example.

The memory tester of the memory cell array is started from, for example, a memory cell having an address of R0 and C0. While fixing the row address to Rk (k=0 to n), the column address is successively changed from C0 to Cn. Thus the memory tester is carried out as far as a memory cell having an address of Rn and Cn.

In parallel to such execution of the memory tester, an algorithm for deriving repair solutions is executed.

Step 1

First, if it is determined by the memory tester that a memory cell 1 having a row address R0 and a column address C0 is failure as shown in FIG. 5A, then a "tree" structure as shown in FIG. 5B is generated by the rule 4 of the above described algorithm.

According to the "tree" structure of FIG. 5B, two branches are formed with respect to its root, and nodes R0 and C0 are added to the extreme ends of the two branches, respectively.

The node R0 means that the failure bit (memory cell) 1 having the row address R0 and the column address C0 is substituted by a redundancy memory cell of a spare row. In this case, it is a matter of course that all memory cells of the row address R0 are substituted by redundancy memory cells of the spare row. One of the two spare rows becomes a used row.

In the same way, the node C0 means that the failure bit (memory cell) 1 having the row address R0 and the column address C0 is substituted by a redundancy memory cell of a spare column. In this case, it is a matter of course that all memory cells of the column address C0 are substituted by redundancy memory cells of the spare column. One of the two spare columns becomes a used column.

In this way, for the first failure bit 1 of the row address R0 and the column address C0, there are two repair solutions: a solution of substituting the failure bit 1 by a redundancy memory cell of a spare row; and a solution of substituting the failure bit 1 by a redundancy memory cell of a spare column.

There are only two ways of repairing a failure bit: a way of repairing the failure bit with a spare row; and a way of repairing the failure bit with a spare column. Therefore, this becomes the basis of the rule 3 in forming the "tree" structure, i.e., "To a root or node, a maximum of two branches can be connected".

Step 2

If it is determined by the memory tester that a memory cell 2 having a row address R1 and a column address C1 is failure as shown in FIG. 6A, then a "tree" structure as shown in FIG. 6B is generated by the rule 4 of the above described algorithm.

In other words, the address R1 and C1 of the failure bit (memory cell) 2 is coincident with neither the node R0 nor the node C0 in the "tree" structure of FIG. 5B. On the basis of the rule 4, therefore, two branches are formed with respect to the node of R0 and are added with node of R1 or C1 to respective extreme end there of. Two branches are also formed with respect to the nodes of C0 and are added with node of R1 or C1 to respective extreme end thereof.

In this way, for the failure bit 2 of the row address R1 and the column address C1, there are two repair solutions: a solution of substituting the failure bit 2 by a redundancy memory cell of a spare row; and a solution of substituting the failure bit 2 by a redundancy memory cell of a spare column.

As for the repair solutions at the current time point, therefore, there are two ways for repairing the failure bit 1 and two ways for repairing the failure bit 2. As shown in FIG. 6B, therefore, there are four ways in all (paths a to d).

Step 3

Figure 7A:
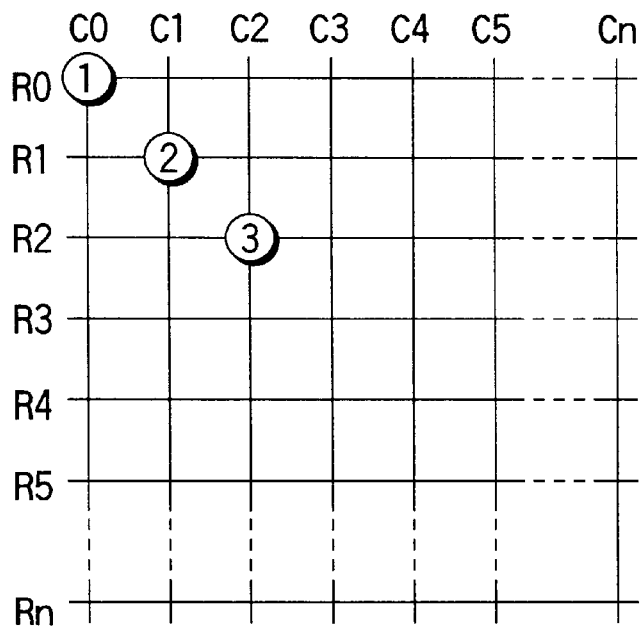
FIGS. 7A and 7B are diagrams showing one process included all processes for generating a "tree" structure (repair solution) concerning a first exercise of the present invention.
Figure 7B:
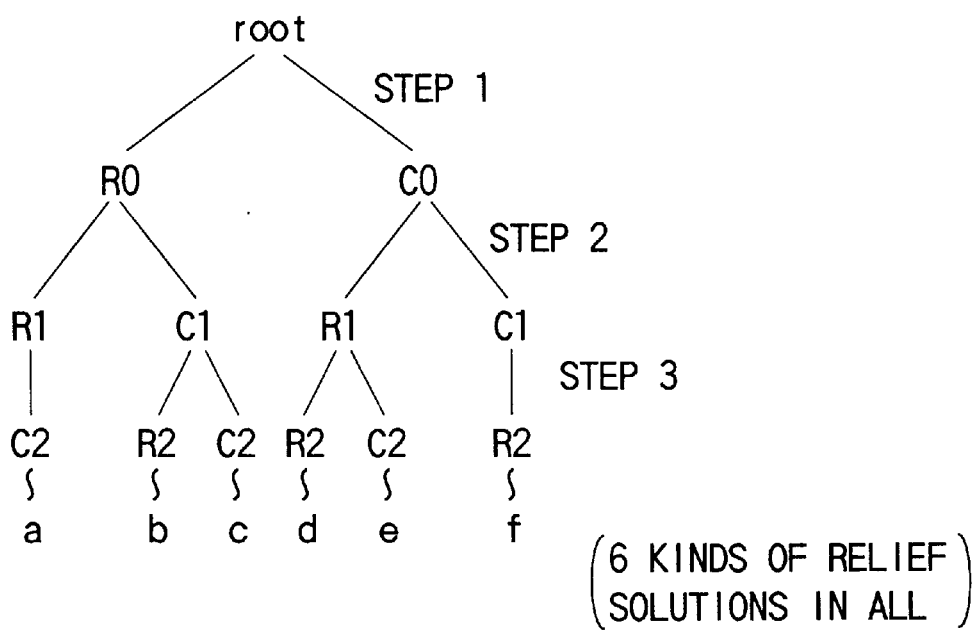

If it is determined by the memory tester that a memory cell 3 having a row address R2 and a column address C2 is failure as shown in FIG. 7A, then a "tree" structure as shown in FIG. 7B is generated by the rules 4 and 6 of the above described algorithm.

In other words, the address R2 and C2 of the failure bit (memory cell) 3 is not coincident with any of the nodes R0, R1, C0 and C1 of the two paths b and c in the "tree" structure of FIG. 6B. On the basis of the rule 4, therefore, two branches are formed with respect to each of the nodes located at extreme ends of the paths b and c of FIG. 6B. To each of the extreme ends of the two branches, nodes of R2 and C2 are added.

As for the path a of FIG. 6B, nodes are R0 and R1, and all (two) spare rows have already been used. Therefore, the rule 6 is applied. To the node located on the extreme end of the path a, one branch is coupled. To an extreme end of the one branch, only a node of C2 is added.

In the same way, as for the path d of FIG. 6B, nodes are C0 and C1, and all (two) spare columns have already been used. Therefore, the rule 6 is applied. To the node located on the extreme end of the path d, one branch is coupled. To an extreme end of the one branch, only a node of R2 is added.

As for repair solutions at the current time, therefore, one repair solution increases for each of the two paths b and c of FIG. 6B. As shown in FIG. 7B, therefore, there are six repair solutions (paths a to f) in all at the current time.

Step 4

Figure 8A:
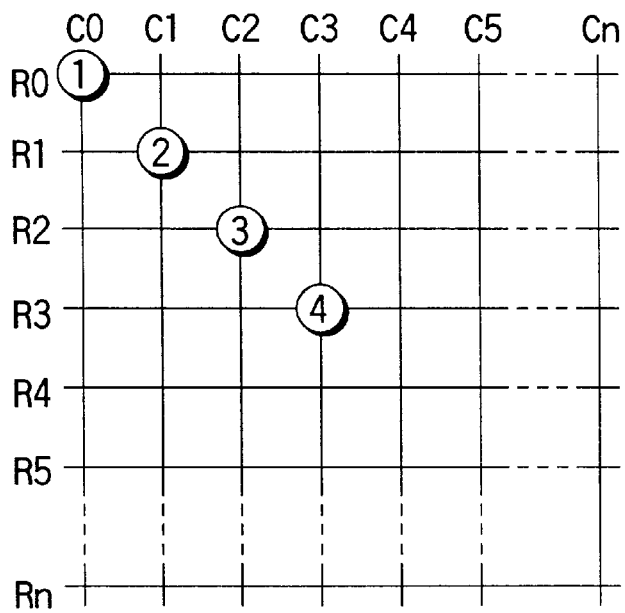
FIGS. 8A and 8B are diagrams showing one process included all processes for generating a "tree" structure (repair solution) concerning a first exercise of the present invention.
Figure 8B:
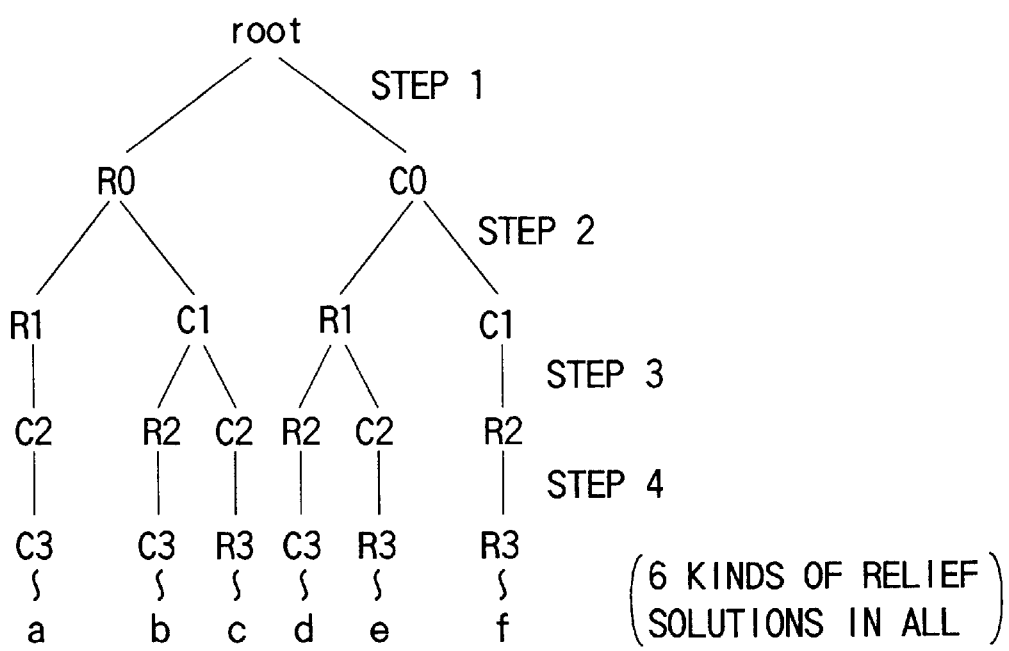

If it is determined by the memory tester that a memory cell 4 having a row address R3 and a column address C3 is failure as shown in FIG. 8A, then a "tree" structure as shown in FIG. 8B is generated by the rule 6 of the above described algorithm.

In other words, nodes of each of the paths a, b and d shown in FIG. 7B contain two out of R0, R1 and R2. Therefore, all (two) spare rows have already been used. Accordingly, the rule 6 is applied. To the node located on the extreme end of each of the paths a, b and d, one branch is coupled. To an extreme end of the one branch, only the node of C3 is added.

In the same way, nodes of each of the paths c, e and f shown in FIG. 7B contain two out of C0, C1 and C2.

Therefore, all (two) spare columns have already been used. Accordingly, the rule 6 is applied. To the node located on the extreme end of each of the paths c, e and f, one branch is coupled. To an extreme end of the one branch only the node of R3 is added.

As shown in FIG. 8B, therefore, there are six repair solutions (paths a to f) in all at the current time.

Step 5

Figure 9A:
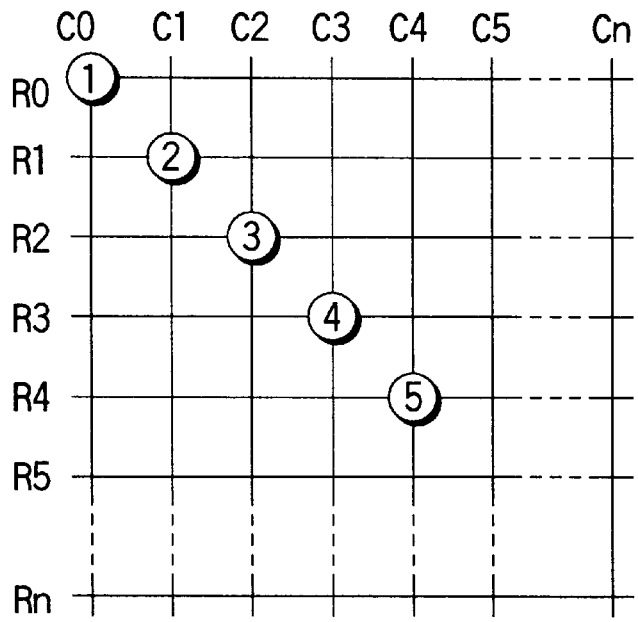
FIGS. 9A and 9B are diagrams showing one process included all processes for generating a "tree" structure (repair solution) concerning a first exercise of the present invention.
Figure 9B:
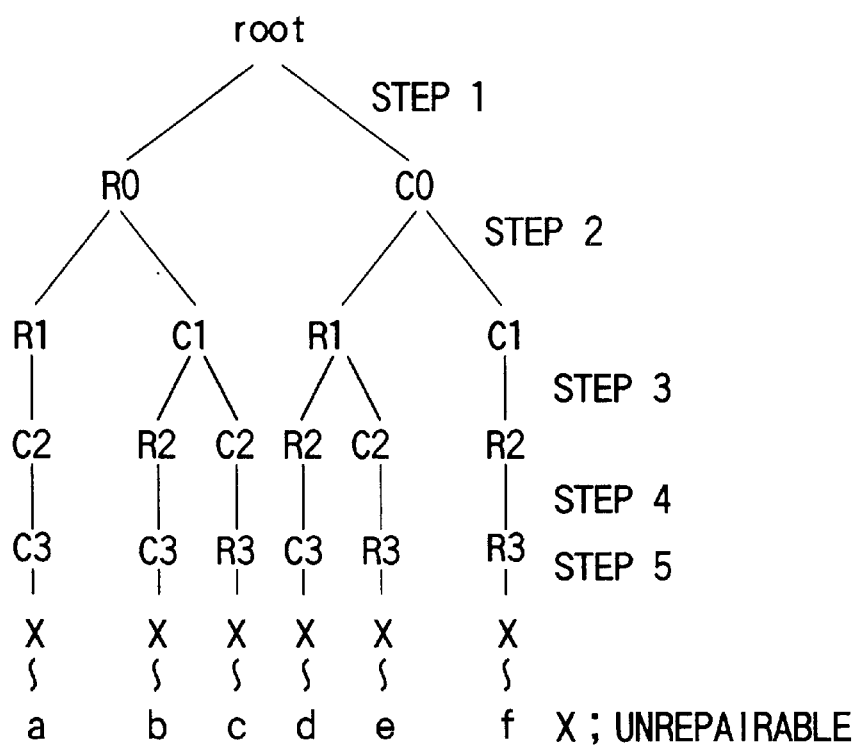

If it is determined by the memory tester that a memory cell 5 having a row address R4 and a column address C4 is failure as shown in FIG. 9A, then a new branch cannot be coupled to a node located on the extreme end of each of the paths a to f as per the rule 6 and rule 7 of the above described algorithm.

In other words, each of the paths a to e shown in FIG. 8B contains two nodes out of R0 to R3 and two nodes out of C0 to C3. Accordingly, all (two) spare rows and all (two) spare columns have already been used.

As per the rules 6 and 7, therefore, a new branch cannot be coupled to a node located on the extreme end of each of the paths a to f. As a result, it becomes impossible to repair the failure bit 5. In other words, the semiconductor memory device is judged to be a failure memory.

e. Exercise 2

Generation of repair solutions using the above described algorithm will now be described by taking the case where the number of spare rows is 2 (NRS=2) and the number of spare columns is 2 (NCS=2) as an example.

The memory tester of the memory cell array is started from, for example, a memory cell having an address of R0 and C0. While fixing the row address to Rk (k=0 to n), the column address is successively changed from C0 to Cn. Thus the memory tester is carried out as far as a memory cell having an address of Rn and Cn.

In parallel to such execution of the memory tester, an algorithm for deriving repair solutions is executed.

Step 1

First, if it is determined by the memory tester that a memory cell 1 having a row address R0 and a column address C0 is failure as shown in FIG. 10A, then a "tree" structure as shown in FIG. 10B is generated by the rule 4 of the above described algorithm.

According to the "tree" structure of FIG. 10B, two branches are formed with respect to its root, and nodes R0 and C0 are added to the extreme ends of the two branches, respectively.

The node R0 means that the failure bit (memory cell) 1 having the row address R0 and the column address C0 is substituted by a redundancy memory cell of a spare row. In this case, it is a matter of course that all memory cells of the row address R0 are substituted by redundancy memory cells of the spare row. One of the two spare rows becomes a used row.

In the same way, the node C0 means that the failure bit (memory cell) 1 having the row address R0 and the column address C0 is substituted by a redundancy memory cell of a spare column. In this case, it is a matter of course that all memory cells of the column address C0 are substituted by redundancy memory cells of the spare column. One of the two spare columns becomes a used column.

In this way, for the first failure bit 1 of the row address R0 and the column address C0, there are two repair solutions: a solution of substituting the failure bit 1 by a redundancy memory cell of a spare row; and a solution of substituting the failure bit 1 by a redundancy memory cell of a spare column.

There are only two ways of repairing a failure bit: a way of repairing the failure bit with a spare row; and a way of repairing the failure bit with a spare column. Therefore, this becomes the basis of the rule 3 in forming the "tree" structure, i.e., "To a root or node, a maximum of two branches can be connected".

Step 2

If it is determined by the memory tester that a memory cell 2 having a row address R0 and a column address C2 is failure as shown in FIG. 11A, then a "tree" structure as shown in FIG. 11B is generated by the rule 4 and rule 5 of the above described algorithm.

In other words, the address R0 and C2 of the failure bit (memory cell) 2 is not coincident with the node C0 in the "tree" structure of FIG. 10B. On the basis of the rule 4, therefore, two branches are formed with respect to the node of C0 of the path b shown in FIG. 10B. To extreme ends of the two branches, nodes of R0 and C2 are added, respectively.

The node of the path a in FIG. 10B is R0, and it is coincident with the row address R0 of the failure bit 2. Therefore, the rule 5 is applied, and a new branch is not coupled to the node R0 of the path a.

As shown in FIG. 11B, therefore, there are three repair solutions in all (paths a to c) at the current time.

Step 3

If it is determined by the memory tester that a memory cell 3 having a row address R0 and a column address C3 is failure as shown in FIG. 12A, then a "tree" structure as shown in FIG. 12B is generated by the rules 5 and 6 of the above described algorithm.

In other words, the address R0 and C3 of the failure bit (memory cell) 3 is coincident with neither C0 nor C2 of the path c in the "tree" structure of FIG. 11B. As for the path c, nodes are C0 and C2, and all spare columns have already been used.

On the basis of the rule 6, therefore, only one branch is coupled to the node C2 located on the most extreme end of the path c shown in FIG. 11B, and a node of R0 is added to an extreme end of the one branch.

Each of the paths a and b shown in FIG. 11B contains a node of R0. This node R0 coincides with the row address R0 of the failure bit 3. Therefore, the rule 5 is applied, and a new branch is not coupled to the node R0 located on the most extreme end of each of the paths a and b.

As shown in FIG. 12B, therefore, there are three repair solutions (paths a to c) in all at the current time.

Step 4

If it is determined by the memory tester that a memory cell 4 having a row address R1 and a column address C0 is failure as shown in FIG. 13A, then a "tree" structure as shown in FIG. 13B is generated by the rules 4 and 5 of the above described algorithm.

In other words, the address R1 and C0 of the failure bit (memory cell) 4 is not coincident with the node R0 in the "tree" structure of FIG. 12B. On the basis of the rule 4, therefore, two branches are formed with respect to the node of R0 located on the most extreme end of the path a shown in FIG. 12B. To extreme ends of the two branches, nodes of R1 and C0 are added, respectively.

The path b shown in FIG. 12B contains a node of C0. This node C0 coincides with the column address C0 of the failure bit 4. Therefore, the rule 5 is applied, and a new branch is not coupled to the node R0 located on the most extreme end of the path b shown in FIG. 12B.

In the same way, the path c shown in FIG. 12B also contains a node of C0. This node C0 coincides with the column address C0 of the failure bit 4. Therefore, the rule 5 is applied, and a new branch is not coupled to the node R0 located on the most extreme end of the path c shown in FIG. 12B.

As shown in FIG. 13B, therefore, there are four repair solutions (paths a to d) in all at the current time.

Step 5

Figure 14A:
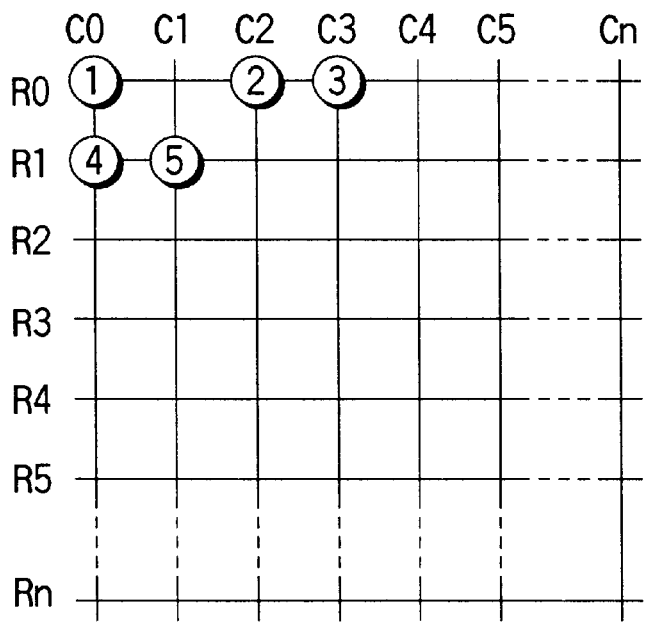
FIGS. 14A and 14B are diagrams showing one process included all processes for generating a "tree" structure (repair solution) concerning a second exercise of the present invention.
Figure 14B:
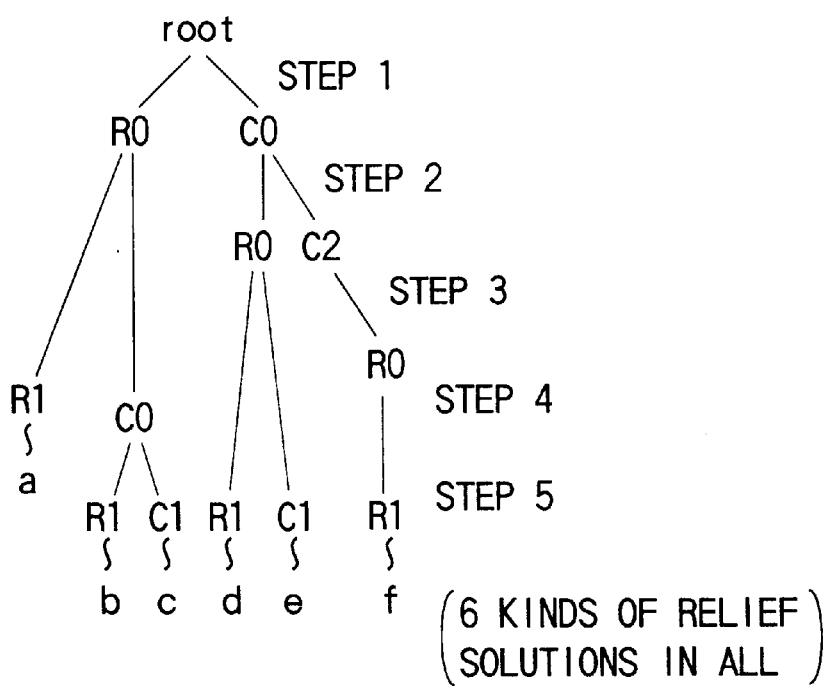

If it is determined by the memory tester that a memory cell 5 having a row address R1 and a column address C1 is failure as shown in FIG. 14A, then a "tree" structure as shown in FIG. 14B is generated by the rules 4 to 6 of the above described algorithm.

In other words, the address R1 and C1 of the failure bit (memory cell) 5 is coincident with neither the node R0 nor the node C0 of the paths b and c in the "tree" structure of FIG. 13B. On the basis of the rule 4, therefore, two branches are formed with respect to each of the nodes C0 and R0 respectively of the paths b and c shown in FIG. 13B. To extreme ends of the two branches, nodes of R1 and C1 are added, respectively.

The path a of FIG. 13B contains the node of R1. This node R1 coincides with the row address R1 of the failure bit 5. Therefore, the rule 5 is applied, and a new branch is not coupled to the node R1 located on the most extreme end of the path a shown in FIG. 13B.

The address R1 and C1 of the failure bit (memory cell) 5 is not coincident with any of the nodes R0, C0 and C2 of the path d in the "tree" structure of FIG. 13B. The path d contains the nodes of C0 and C2, and has already used all spare columns.

On the basis of the rule 6, therefore, only one branch is coupled to the node R0 located on the most extreme end of the path d shown in FIG. 13B, and a node of R1 is added to an extreme end of the one branch.

As shown in FIG. 14B, therefore, there are six repair solutions (paths a to f) in all at the current time.

Step 6

Figure 15A:
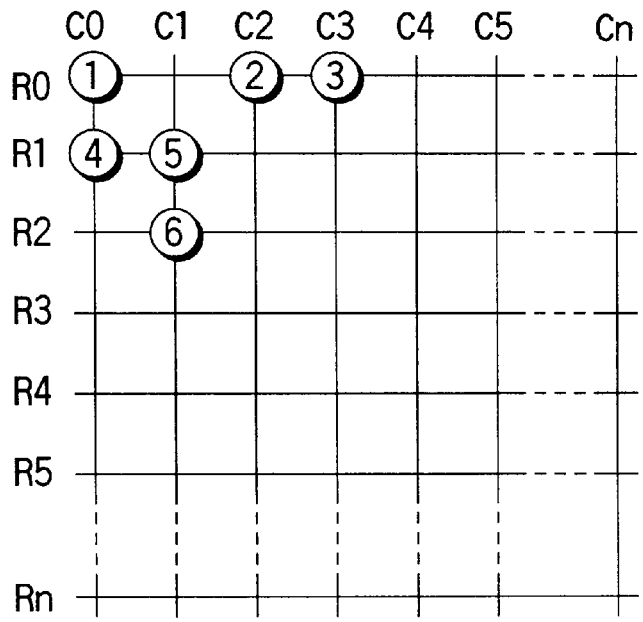
FIGS. 15A and 15B are diagrams showing one process included all processes for generating a "tree" structure (repair solution) concerning a second exercise of the present invention.
Figure 15B:
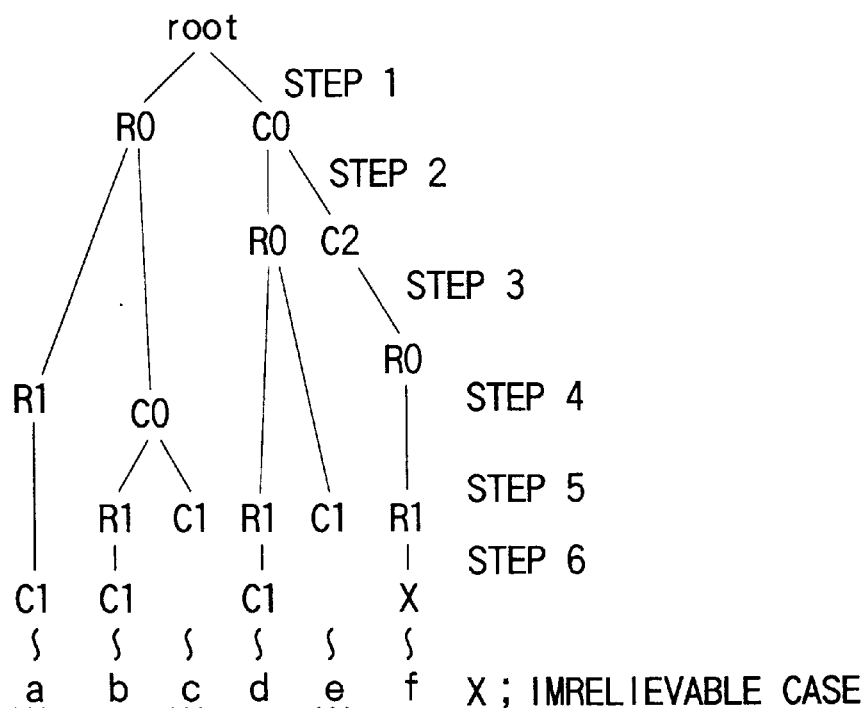

If it is determined by the memory tester that a memory cell 6 having a row address R2 and a column address C1 is failure as shown in FIG. 15A, then a "tree" structure as shown in FIG. 15B is generated by the rules 4 to 6 of the above described algorithm.

In other words, each of the paths c and e shown in FIG. 14B contains a node of C1. This node C1 coincides with the column address C1 of the failure bit 6. Therefore, the rule 5 is applied, and a new branch is not coupled to the node C1 located on the most extreme end of each of the paths c and e.

The address R2 and C1 of the failure bit (memory cell) 6 is not coincident with any of the nodes R0, R1 and C0 of the paths a, b and d in the "tree" structure of FIG. 14B. The paths a, b and d contain the nodes of R0 and R1, and consequently have already used all spare rows.

On the basis of the rule 6, therefore, only one branch is coupled to the node R1 located on the most extreme end of each of the paths a, b and d shown in FIG. 14B, and a node of C1 is added to an extreme end of the one branch.

On the other hand, the path f of FIG. 14B contains the nodes of R0, R1, C0 and C1, and consequently has already used all spare rows and spare columns. To the node R1 located on the most extreme end of the path f shown in FIG. 14B, therefore, a branch cannot be coupled. The failure bit 6 is unrepairable with this path f.

As shown in FIG. 15B, therefore, there are five repair solutions (paths a to e) in all at the current time.

If a new failure bit is not found thereafter, one out is selected of the five repair solutions shown in FIG. 15B. On the basis of the selected repair solution, repair of the failure bit, i.e., substituting the failure bit by a redundancy memory cell is executed.

In the present example, the failure bit is repairable by the fewest spare lines (three spare lines) in the repair solutions of the paths a, c and e. Therefore, it is desirable to choose one of these three repair solutions (paths a, c and e).

f. Summary

For all failure bits of the memory cell array, all repair solutions for repairing these failure bits are derived on the basis of the rules 1 to 7 in the semiconductor memory device of the present invention as heretofore described.

Denoting the number of spare rows by NRS and the number of spare columns by NCS, the upper limit of the number of the repair solutions can be represented as $_{NRS+NCS}C_{NRS}$ (combination of selecting NRS pieces from NRS+NCS pieces) as per the rules 1 to 7.

For example, in the case where NRS=2 and NCS=2, the upper limit of the number of repair solutions becomes $_4C_2=(4\times3)/(2\times1)=6$.

The fact that the upper limit of the number of the repair solutions is determined is based on the following. If the number of the spare rows and the number of the spare columns are determined, a rough frame of the final shape of the "tree" structure (hereafter referred to as template) is determined by the rules 3 to 6 no matter how failures occur.

Figure 16:
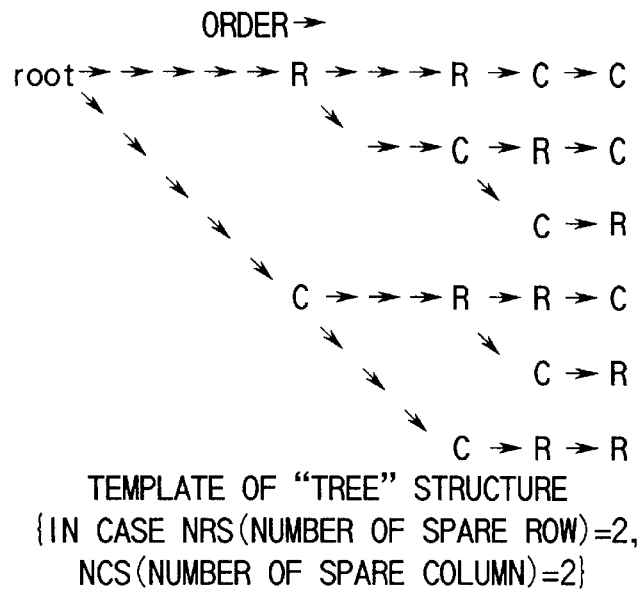
FIG. 16 is a diagram showing a template of the "tree" structure.
Figure 17:
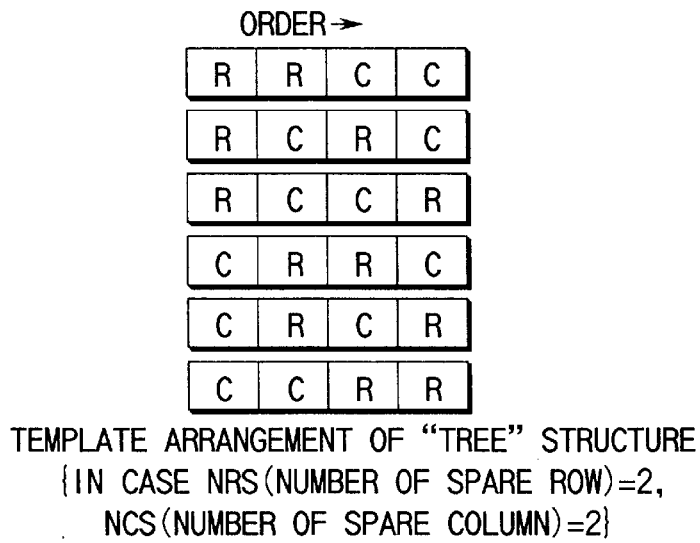
FIG. 17 is a diagram showing a display obtained by arranging templates of the "tree" structure.

For example, in the case where NRS=2 and NCS=2, the rough frame (template) of the "tree" structure becomes as shown in FIGS. 16 and 17, and the upper limit of the number of repair solutions becomes six. In FIGS. 16 and 17, "R" means that a failure bit is repaired by a redundancy memory cell of a spare row, and "C" means that a failure bit is repaired by a redundancy memory cell of a spare column.

As a matter of fact, the shape itself of the "tree" structure changes according to the number of failure bits and their address. However, all changes are housed within the template of FIGS. 16 and 17. Such a change acts in such a direction as to eliminate a branch and a node located on the extreme end of each path, and it does not act in such a direction as to add a branch and a node located on the extreme end of each path.

In the case where all failure bits are single bit failures which are not coincident with each other in address as in the exercise 1, up to a maximum of NRS+NCS failure bits can be repaired. In this case, the number of repair solutions becomes $_{NRS+NCS}C_{NRS}$. In other words, in the case where all failure bits are single bit failures, a maximum of NRS+NCS failure bits can be repaired by one of $_{NRS+NCS}C_{NRS}$ repair solutions.

If failure bits are line failures or area failures, it is a matter of course that NRS+NCS or more failure bits can be repaired.

Eventually, those which become keys are the following properties.

Whenever a failure bit is found, the judgement of repairability and redundancy calculation and allocation (branch and node addition) are carried out independently in respective paths on the basis of the rules 4 and 5.

If the number of spare lines (spare rows and spare columns) is determined, then the rough frame (template) of the "tree" structure is determined and the upper limit of the number of repair solutions is also determined by $_{NRS+NCS}C_{NRS}$.

g. Memory Capacity of Redundancy Calculation and Allocation Circuit and Higher Speed Redundancy Calculation Implementation Method According to the above described two properties, the memory capacity of redundancy calculation and allocation circuit required for the semiconductor memory device of the present invention and a method for implementing a higher speed redundancy calculation become as follows.

Figure 18:
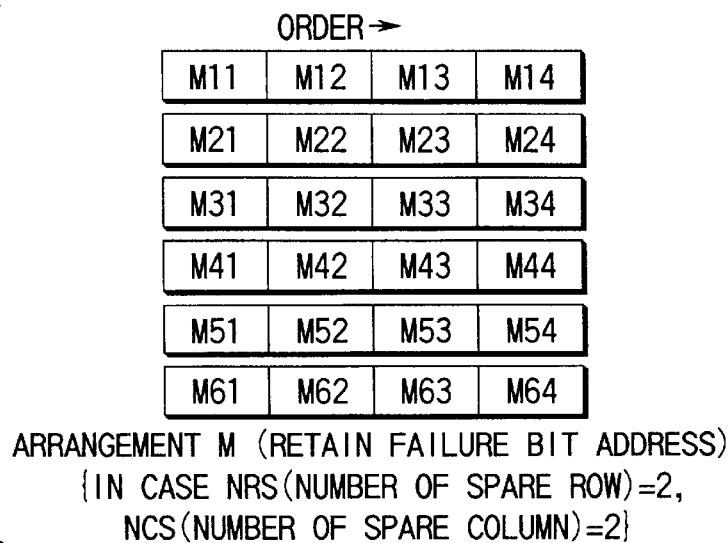
FIG. 18 is a diagram showing an arrangement of a storage unit M for retaining failure bit addresses.

First of all, a memory unit M having a size (arrangement) of $_{NRS+NCS}C_{NRS} \times (NRS+NCS)$ for storing the addresses of failure bits is prepared as shown in FIG. 18.

The memory unit M of FIG. 18 is used in the case where the number NRS of spare rows is 2 and the number NCS of spare columns is 2, and it is provided to store, for example, the templates of the "tree" structure of FIGS. 16 and 17.

In FIG. 18, $M_{i1}$, $M_{i2}$, $M_{i3}$ and $M_{i4}$ (where i is an integer in the range of 1 to 6) represents one repair solution (path). The address of the failure bit is stored in the order of $M_{i1}$, $M_{i2}$, $M_{i3}$ and $M_{i4}$.

For example, whenever a failure bit having a different row address is found in the path of i=1 (the first line of FIG. 18), the row address of the failure bit is written into the memory unit in the order of $M_{i1}$ and $Mi_2$. Whenever a failure bit having a different column address is found thereafter, the column address of the failure bit is written into the memory unit in the order of $M_{i3}$ and $M_{i4}$.

This corresponds to repair solutions R, R, C and C shown in the first line of FIG. 17. As for other paths (lines) i=2 to 6 as well, FIG. 17 corresponds to FIG. 18 in one-to-one correspondence.

As shown in FIG. 19, a memory unit SR having a size (arrangement) of $_{NRS+NCS}C_{NRS} \times (NRS+NCS+1)$ for storing effective bits is then prepared. Each of the effective bits represents whether data (address) of each element $M_{ij}$ of the memory unit M shown in FIG. 18 is effective, i.e., represents whether either node in the templates shown in FIGS. 16 and 17 is effective as a repair solution.

The memory unit SR shown in FIG. 19 is provided so as to correspond to the memory unit M shown in FIG. 18 (the case where NRS=2 and NCS=2).

In FIG. 19, $SR_{i1}$, $SR_{i2}$, $SR_{i3}$ and $SR_{i4}$ (i is an integer in the range of 1 to 6) represent whether each node of one repair solution (path) is effective. Bit data representing whether each node is effective is stored in all of $SR_{i1}$, $SR_{i2}$, $SR_{i3}$ and $SR_{i4}$.

For example, in the case where bit data of $SR_{ij}$ is "1", an element $M_{ij}$ of the memory unit X is judged to be effective. In the case where bit data of $SR_{ij}$ is "0", an element $M_{ij}$ of the memory unit M is judged to be ineffective (where j is an integer in the range of 1 to 4).

On the other hand, bit data $SR_{i5}$ indicates whether the repair solution of the path i is effective, i.e., whether all failure bits can be repaired by the repair solution of the path i. Contrary to $SR_{ij}$ (j=1 to 4), "1" indicates that the repair solution of the path i is ineffective, and "0" indicates that the repair solution of the path i is effective.

For example, for $SR_{ij}$ (j=1 to 4), the bit data "1" indicates that $M_{ij}$ is effective and the bit data "0" indicates that $M_{ij}$ is ineffective. At the beginning, therefore, all of $SR_{i1}$, $SR_{i2}$, $SR_{i3}$, $SR_{i4}$ and $SR_{i5}$ are set to "0". Each time a failure bit appears, the bit data is successively changed to "1" in the order of $SR_{i1}$, $SR_{i2}$, $SR_{i3}$, $SR_{i4}$ and $SR_{i5}$.

When all elements $SR_{i1}$, $SR_{i2}$, $SR_{i3}$, $SR_{i4}$ and $SR_{i5}$ have become "1", i.e., when $SR_{i5}$ has become "1", the repair solution of the path i is judged to be ineffective.

FIG. 20 shows the data (address) of the elements $M_{ij}$ of the memory unit M in the case where the final shape of the "tree" structure becomes a shape as shown in FIG. 22. Blank portions indicate such a state that data (address) is not stored. FIG. 21 shows bit data $SR_{ij}$ of the memory unit SR in the case where the final shape of the "tree" structure becomes as shown in FIG. 22.

FIG. 23 shows the template arrangement of the "tree" structure in the case where NRS=4 and NCS=4. In this case, the number of repair solutions becomes 70 ($=_8C_4$) at its maximum. Therefore, the elements of the memory unit M for storing addresses of the failure bits form an arrangement of 70×8. The bit data of the memory unit SR indicating whether an element of the memory unit M is effective form an arrangement of 70×9.

Denoting the number of the spare rows by NRS and denoting the number of the spare columns by NCS, Nconb ($=_{NRS+NCS}C_{NRS}$) repair solutions at a maximum can be generated in parallel to the execution of the memory tester in the semiconductor memory device of the present invention.

Figure 24:
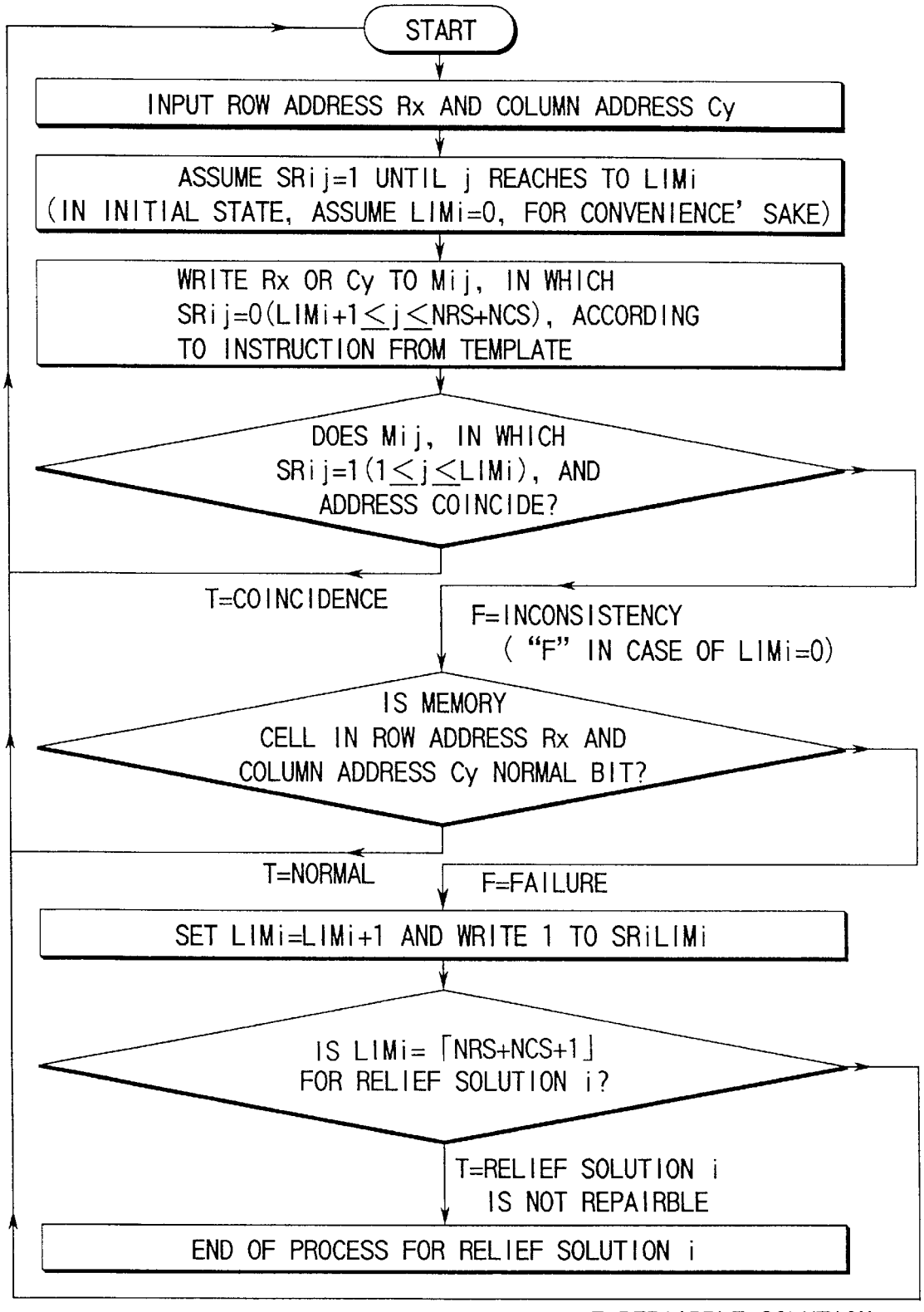
FIG. 24 is a flow chart showing a procedure for generating a repair solution according to the present invention.

FIG. 24 shows a flow chart for Nconb repair solutions in the semiconductor memory device of the present invention.

FIG. 24 straightforwardly shows that the processing for inspecting whether a memory cell located in a predetermined address is good by the memory tester and the processing for successively generating the repair solutions i (i=1, 2, . . . Nconb) are carried out independently in parallel, resulting in faster processing.

As the initial state, data "0" are written into all elements $SR_{ij}$ of the memory unit SR. In other words, $SR_{ij}$="0" indicates that effective address data is not stored in an element $M_{ij}$ of the memory unit M beforehand.

Embodiments

Figure 25:
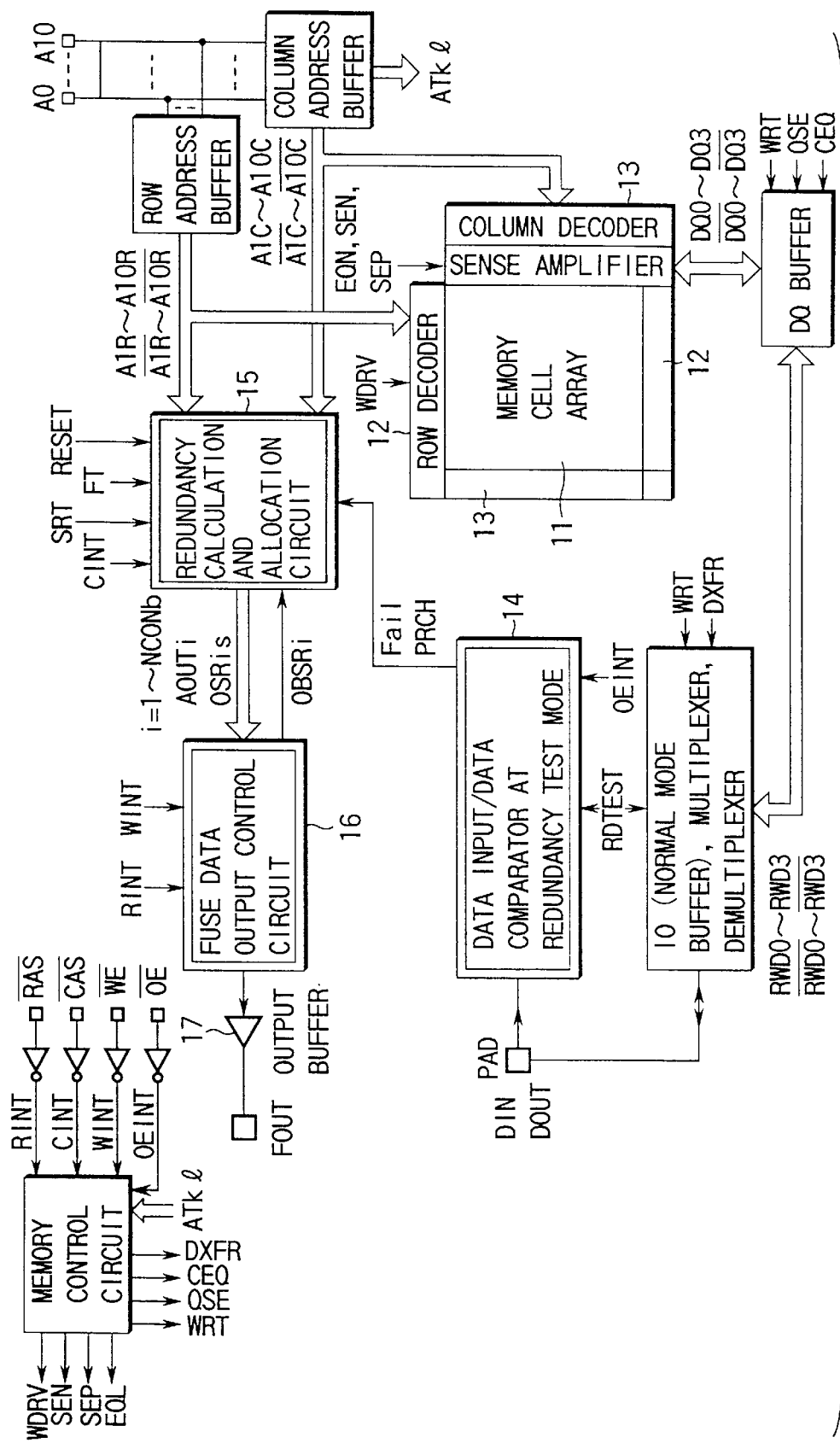
FIG. 25 is a diagram showing the configuration of a principal part (a part concerning the redundancy calculation and allocation) of a semiconductor memory device according to the present invention.

A. FIG. 25 shows a principal part of a dynamic random access memory (DRAM) of a first embodiment according to the present invention. Each of FIGS. 26 to 29 shows an example of a circuit for generating a predetermined control signal of the DRAM of FIG. 25.

In the case of the present embodiment, data reading and writing are controlled by control signals of /RAS, /CAS, /WE and /OE. The address data take-in circuit, data read circuit, and data write circuit are not especially different in configuration from conventional circuits.

In the same way as the conventional DRAM having a redundancy circuit, a redundancy memory cell array is disposed along one side of a memory cell array 11 and a spare row 12 is provided. Along another side of the memory cell array 11, a redundancy memory cell array is disposed and a spare column 13 is provided.

On the side of each of the spare row 12 and the spare column 13, a fuse string is disposed. When repairing a memory cell by using the redundancy technique, a predetermined fuse of the fuse string is blown by, for example, a laser beam, and address data of a failure memory cell is programmed.

When the DRAM is actually operating, address data input from the outside of the memory LSI is compared with address data programmed by the fuse string. In case of coincidence, a spare decoder is activated to select a predetermined spare line and a normal decoder is inactivated.

Figure 26:
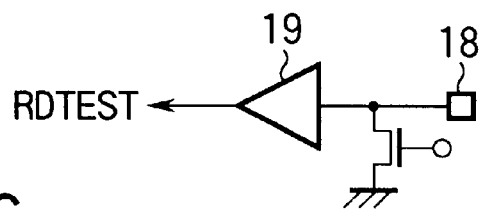
FIG. 26 is a diagram showing a circuit for generating a control signal RDTEST illustrated in FIG. 25.
Figure 27:
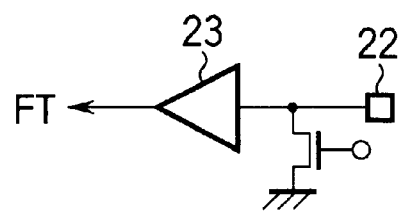
FIG. 27 is a diagram showing a circuit for generating a control signal FT illustrated in FIG. 25.
Figure 28:
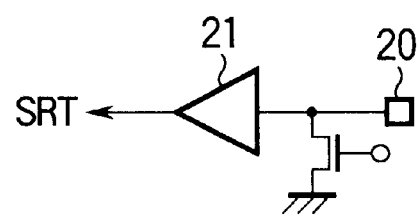
FIG. 28 is a diagram showing a circuit for generating a control signal SRT illustrated in FIG. 25.
Figure 29:
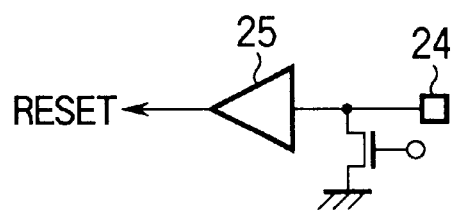
FIG. 29 is a diagram showing a circuit for generating a control signal RESET illustrated in FIG. 25.

The DRAM of the present embodiment has a feature that data input/data comparator 14 activated in the redundancy calculation test mode, a redundancy calculation and allocation circuit 15, and a fuse data output control circuit 16 are newly provided. In the DRAM of the present embodiment, circuits generating control signals RDTEST, FT, SRT and RESET for controlling those circuits as shown in FIGS. 26 to 28 and predetermined pads are newly provided. However, these control operations can also be carried out by providing external signals such as /RAS and /CAS at special timing.

Specifically, novel configurations in the present embodiment will be enumerated as follows.

Figure 30:
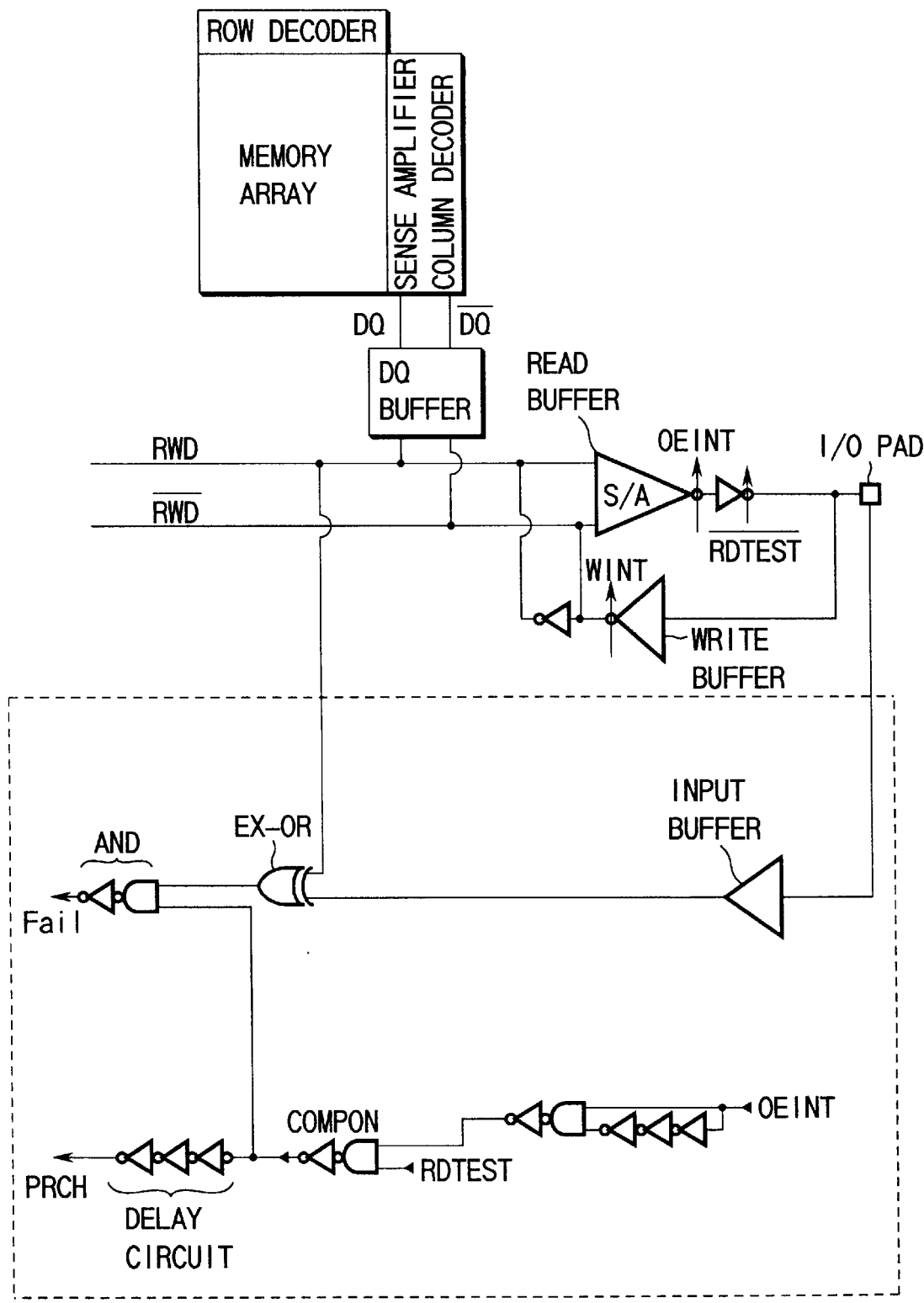
FIG. 30 is a diagram showing the configuration of a data input and data comparator at redundancy calculation test mode illustrated in FIG. 25.

1: Data input/data comparator in redundancy calculation test mode (FIG. 30)

Figure 33:
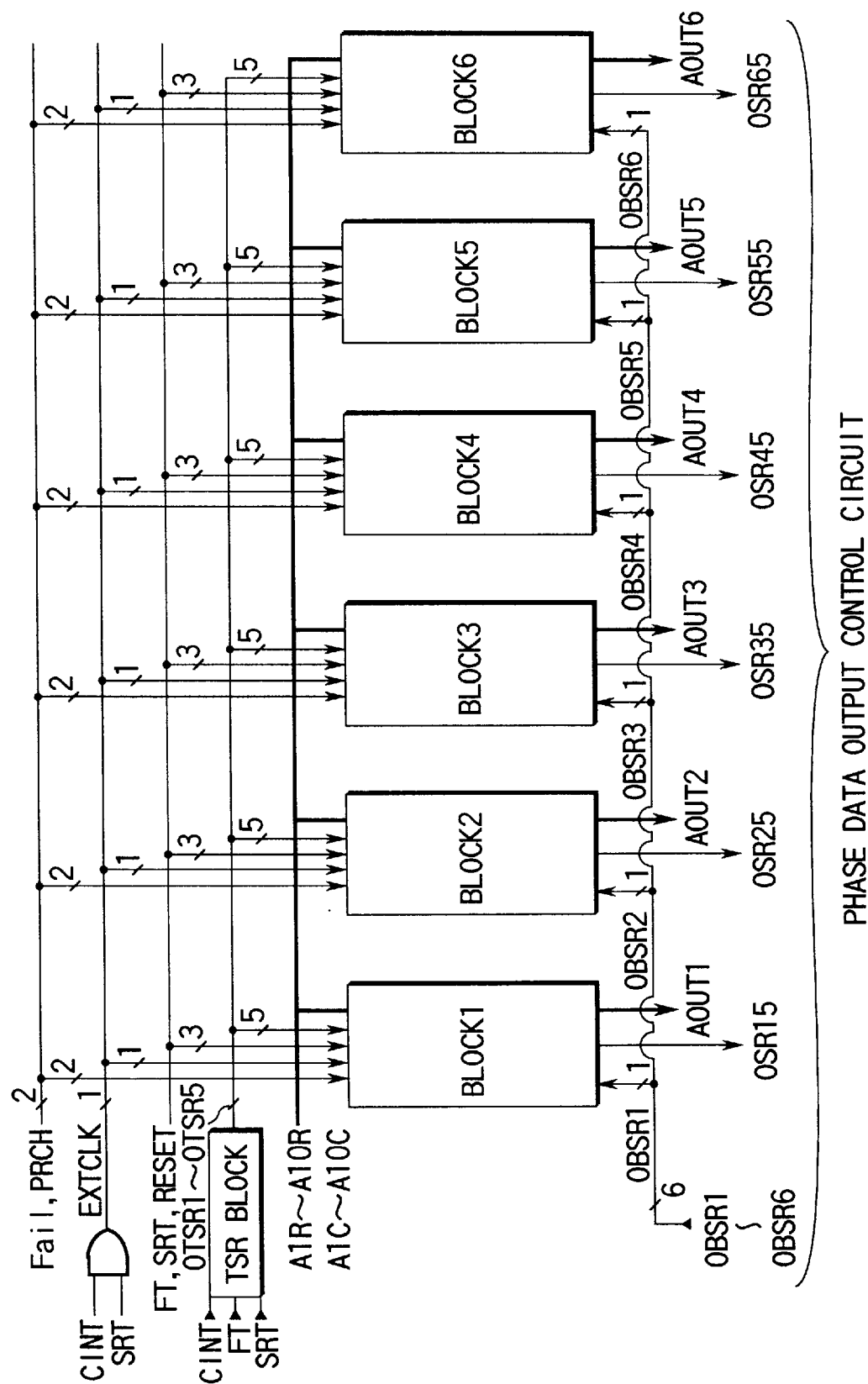
FIG. 33 is a diagram showing the configuration of a redundancy calculation and allocation circuit (in the case where NR=NC=2) illustrated in FIG. 25.

2: Redundancy Calculation and Allocation circuit (FIG. 33)

The following exemplary drawing shows the case where NR=2, NC=2, and Nconb=6. This circuit further includes the following two elements.

Figure 34:
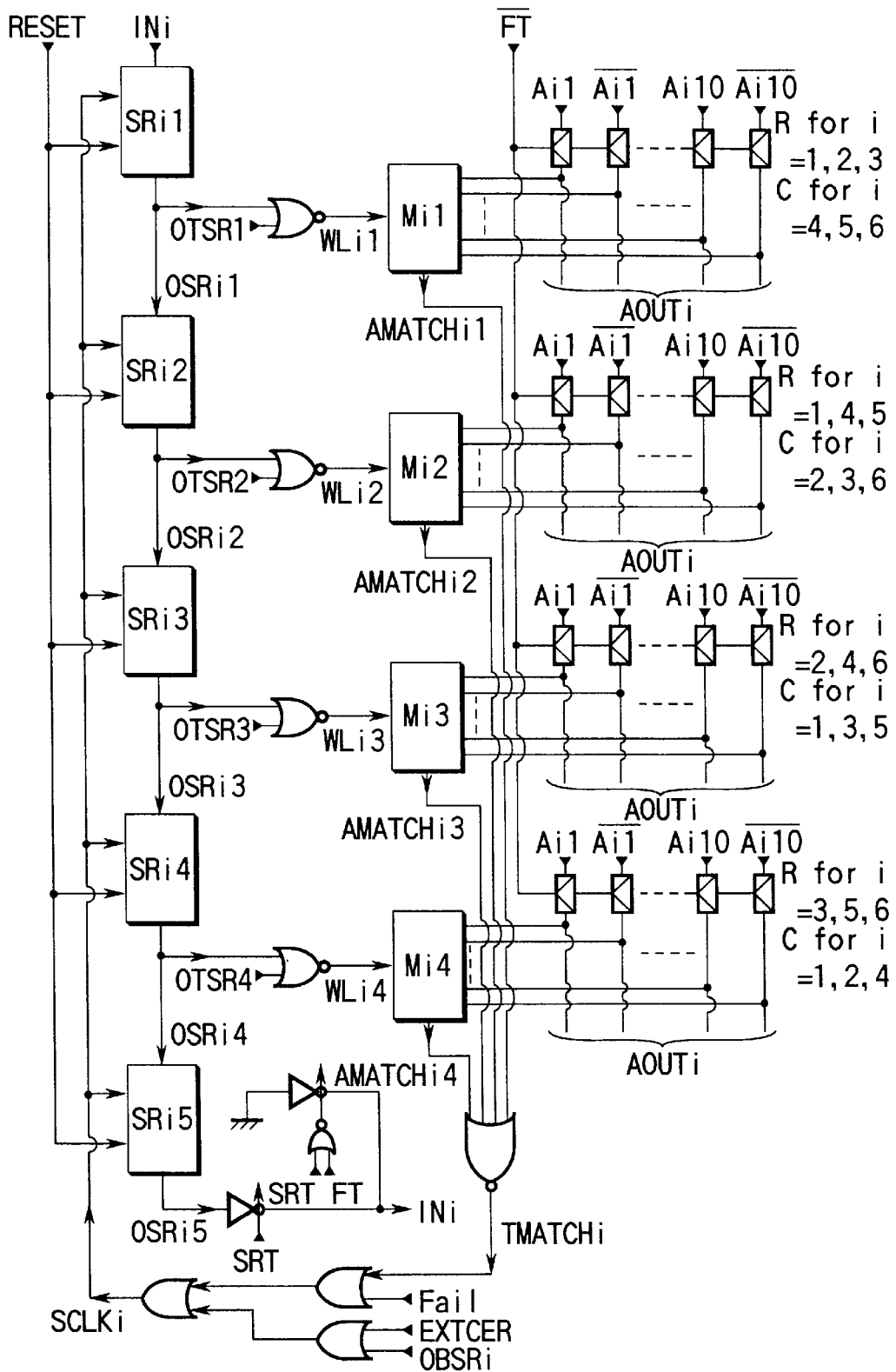
FIG. 34 is a diagram showing the configuration of a block $BLOCK_i$ (in the case where NR=NC=2) illustrated in FIG. 33.

2.1: Blocks BLOCK$_i$ corresponding to repair solution (path of the "tree" structure), where i=1 to Nconb, Nconb=the number of paths (FIG. 34)

2.2: Shift registers TSR BLOCK common to all blocks (FIGS. 38 to 41)

The BLOCK$_i$ of 2.1 further includes the following elements.

Figure 35:
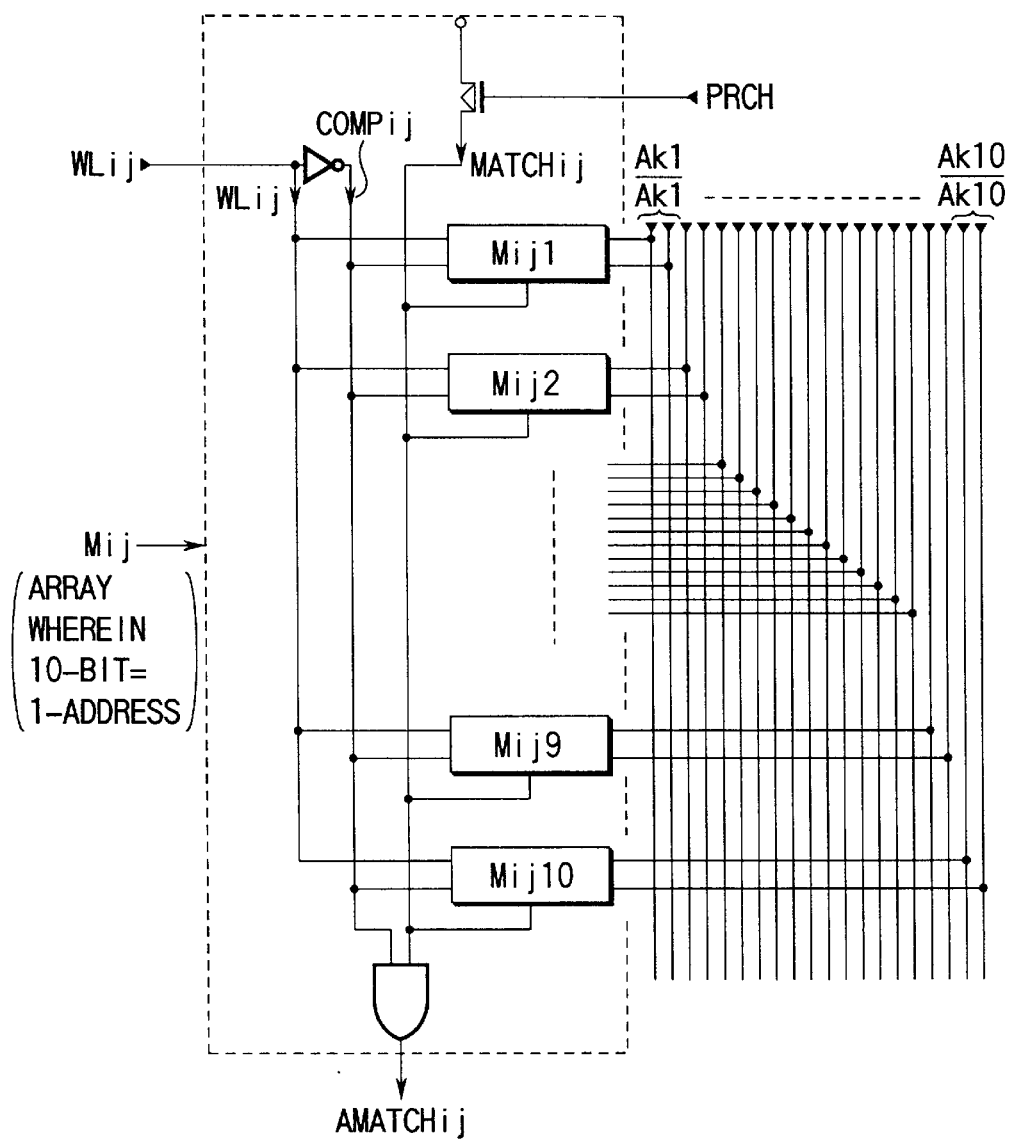
FIG. 35 is a diagram showing the configuration of a block (SRAM array) $M_{ij}$ illustrated in FIG. 34.
Figure 36:
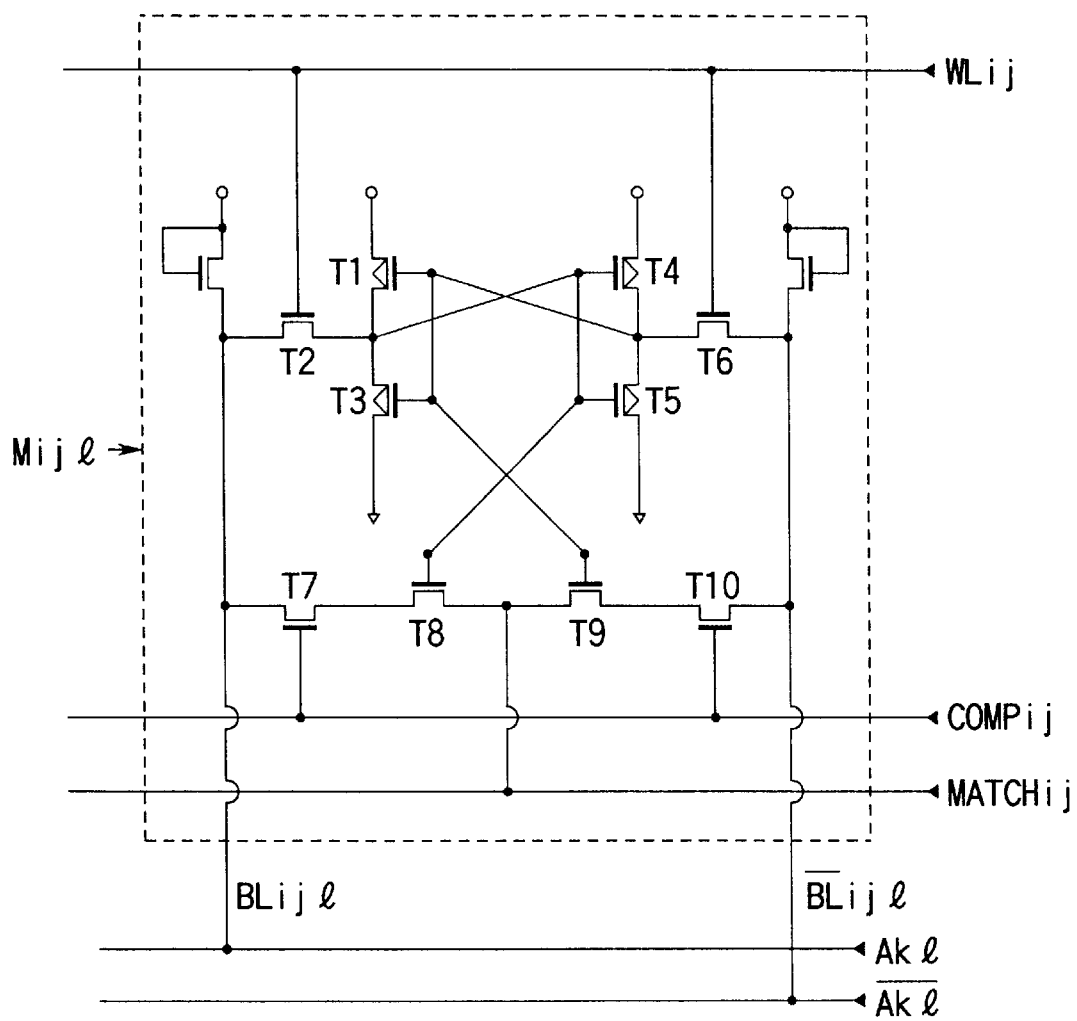
FIG. 36 is a diagram showing the configuration of a memory cell (SRAM) $M_{ijl}$ illustrated in FIG. 35.

2.1.1: Static random access memory (SRAM) array for stacking error bit address (FIGS. 35 and 36)

Figure 37:
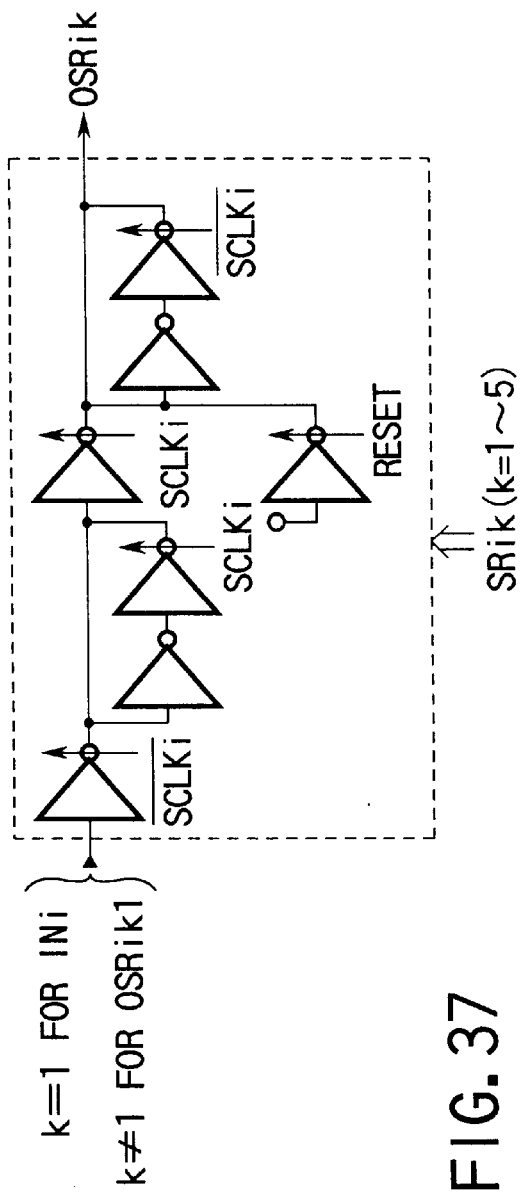
FIG. 37 is a diagram showing the configuration of a block (shift register) $SR_{ik}$ illustrated in FIG. 34.

2.1.2: A shift register accompanying each block (FIG. 37)

Figure 42:
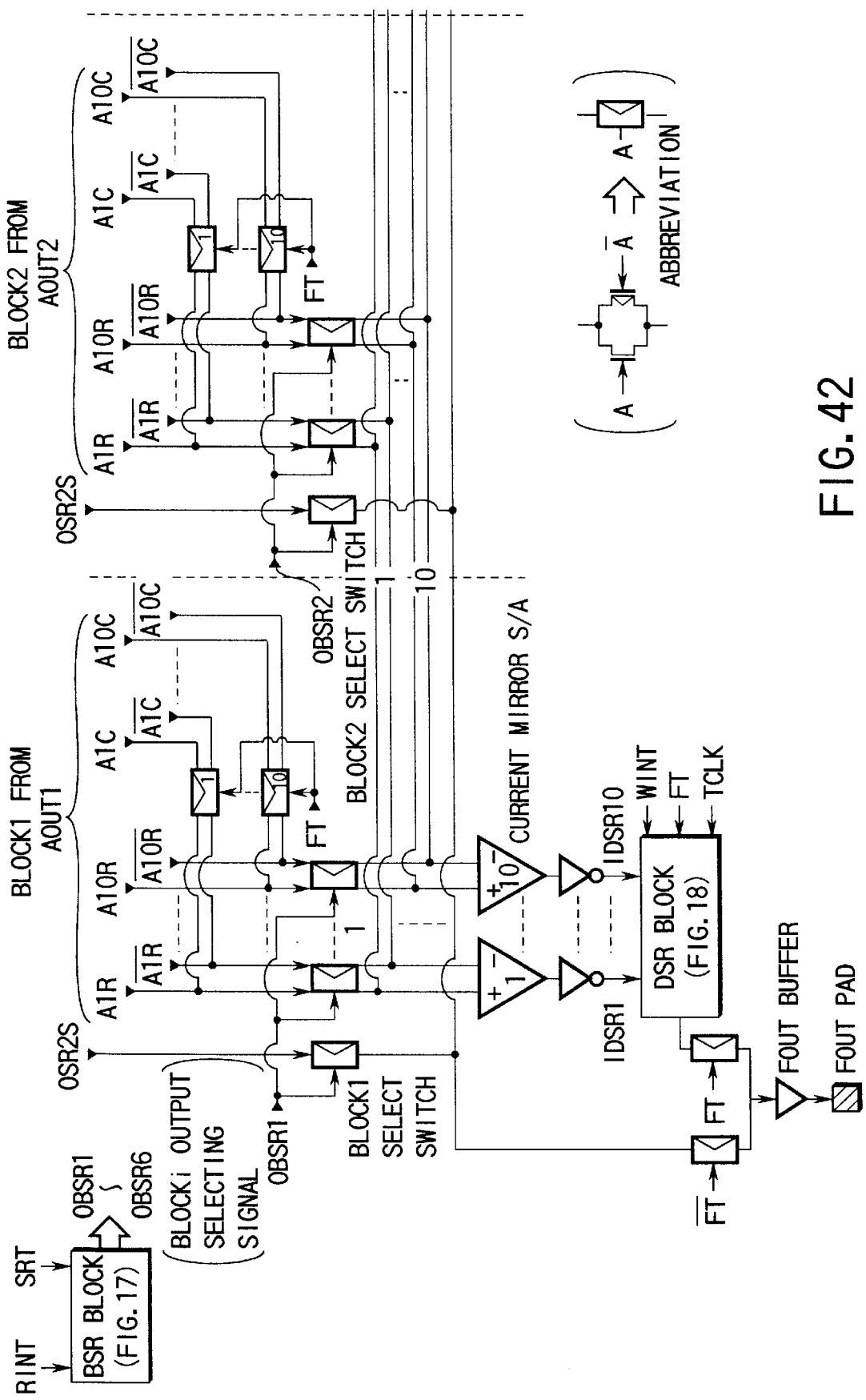
FIG. 42 is a diagram showing the configuration of a fuse data (and effective bit) output control circuit illustrated in FIG. 25.

3: Fuse data (and effective bit) output control circuit (FIG. 42)

In this circuit, control registers (FIGS. 43 to 49) are included.

4: Fuse data (and effective bit) output pad FOUT and its buffer 17

5: An input pad 18 of a redundancy calculation test signal (RDTEST) for entering the redundancy calculation test mode, and its buffer 19

6: An input pad 20 of a shift register data transfer signal (SRT) and its buffer 21

7: An input pad 22 of a fuse data transfer signal (FT) and its buffer 23

8: An input pad 24 of a shift register reset signal (RESET) and its buffer 25

B. Components of the DRAM of FIG. 25 will now be described in detail.

FIG. 30 shows the configuration of the data input/data comparator in redundancy calculation test mode of FIG. 25.

First of all, data writing timing in the redundancy calculation test mode, expected value input timing, and expected value and read data comparison timing will be described.

According to the present invention, redundancy calculation and allocation is carried out by a circuit included in the chip. Therefore, the tester does not include a fail bit memory for storing the failure bit address. In other words, it is not necessary to take out the data read out by the test outside the chip, and consequently the normal read cycle is not necessary at the time of redundancy.

FIGS. 31A and 31B show timing of data read cycle and data write cycle carried out in the normal mode, respectively. FIGS. 32A and 32B show timing of expected value data input cycle and data write cycle carried out in the redundancy calculation test mode, respectively.

When a read signal /OE falls (changes from "H" to "L") and a write signal /WE is in the "H" state, the read cycle is caused in the normal mode. When the redundancy calculation test mode is entered, however, the expected value input cycle is caused.

On the other hand, when the write signal /WE falls and the read signal /OE is in the "H" state, the data write cycle is caused in both the normal mode and the redundancy calculation test mode.

In the expected value input cycle, the expected value data is led to a read write data line pair RWD and /RWD, and compared with read data.

As a matter of fact, comparison of the expected value data with read data in the expected value input cycle is carried out when the read signal /OE has changed from "H" to "L" and a signal OEINT has changed from "L" to "H", and while a signal COMPON of FIG. 30 is "H" (pulse).

After the read data is led to the read write data line pair RWD and /RWD, it is a matter of course that the timing of the read signal /OE changing from "H" to "L" is controlled so that the expected value data will be compared with the read data.

A fail signal Fail indicating whether a memory cell is good or not is represented by a logical product of a result of comparison of the read data with the expected value data (i.e., output of an exclusive OR circuit EX-OR) and the signal COMPON. In other words, the fail signal Fail is represented by an output signal of an AND circuit AND. The fail signal Fail is input to the redundancy calculation and allocation circuit.

The fail signal Fail is so set as to become the "L" state in ordinary times. When the read data does not coincide with the expected value data, the fail signal Fail becomes "H" for a fixed period in a pulse form.

In the same way as the fail signal Fail, the signal COMPON is so set as to become the "L" state in ordinary times. A precharge signal PRCH is in the "H" state in ordinary times. However, the precharge signal PRCH becomes "L" when the signal OEINT becomes "H" and the signal COMPON also becomes "H". The precharge signal PRCH precharges various match lines (MATCH$_{ij}$) described later to the "H" state. The precharge signal PRCH is input to the redundancy calculation and allocation circuit later than the fail signal Fail.

FIG. 33 shows the configuration of the redundancy calculation and allocation circuit. FIGS. 34 to 39 show components of FIG. 33 in detail.

FIG. 34 shows the configuration of the block BLOCKi (i=1 to 6) of FIG. 33. FIG. 35 shows the configuration of a M$_{ij}$ (j=1 to 4) circuit of FIG. 34. FIG. 36 shows the configuration of a M$_{ijl}$ (l=1 to 10) circuit of FIG. 35.

Figure 38:
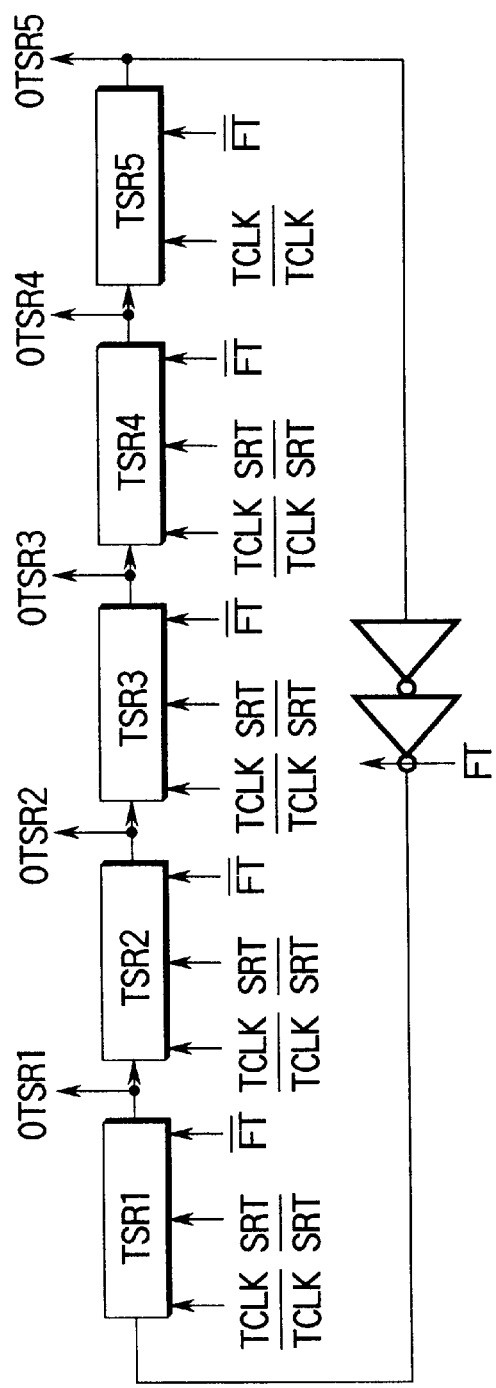
FIG. 38 is a diagram showing the configuration of a block (shift register) TSR BLOCK illustrated in FIG. 33.
Figure 39:
FIG. 39 is a diagram showing a circuit for generating a clock signal TCLK illustrated in FIG. 38.

FIG. 37 shows the configuration of a SR$_{ik}$ (k=1 to 5) of FIG. 34. FIG. 38 shows the configuration of a TSR BLOCK circuit of FIG. 33. FIG. 39 shows the configuration of a circuit for generating a clock signal TCLK of FIG. 38.

The present example is intended for a DRAM having 4 Mbits×n (where n is the number of cell arrays each serving as the repair unit) in which the memory cell repair is carried out for each cell array of 4 Mbits. Each cell array (repair unit) has four spare rows and four spare columns. Substitution by spare lines is carried out simultaneously for two lines. Among address signals A0R to A10R and A0C to A10C, address signals A0R and A0C can be ignored in this case.

In the case where the circuit of FIG. 33 is formed within a memory chip (i.e., in an on-chip form), it is necessary to provide the circuit of FIG. 33 for each cell array serving as the repair unit.

In the case where the number NRS of freely substitutable spare rows included in one cell array (repair unit) is two and the number NCS of freely substitutable spare columns included in one cell array is two as in the present example, the maximum number of paths (repair solutions) is determined to be Nconb=$_4C_2$=6 and the shape of them is predetermined (see the template of FIGS. 16 and 17).

It is assumed that i is an integer in the range of 1 to Nconb and j is an integer in the range of 1 to NRS+NCS when parameters i and j are used in the ensuing description.

A block BLOCK$_i$ (i=1 to 6) corresponds to a repair solution (a path of the "tree" structure). In the array M$_{ijl}$ (l=1 to 10) of the static random access memory (SRAM), error bit addresses are stacked.

a. Memory cell unit (FIG. 36)

For implementing the algorithm for generating all repair solutions according to the present invention as hardware, a memory unit for retaining the address data of repair solutions and a comparator for comparing the input address data with the already retained address data are required in order to carry out a series of works shown in the flow chart of FIG. 24. In order to conduct data writing, data reading, comparison of the input address data with the already retained address data, and decision for each one bit of 10-bit address data, respectively, a memory cell $M_{ijl}$ (generally referred to as associative memory cell) having a configuration as shown in FIG. 36 is used in the case of the present example.

This memory cell has an SRAM portion formed by transistors T1 to T6 and a search function portion formed by transistors T7 to T10. When potential $WL_{ij}$ of a word line is "H" and a signal $COMP_{ij}$ is "L", this memory cell functions as the SRAM. When the potential $WL_{ij}$ of the word line is "L" and the signal $COMP_{ij}$ is "H", this memory cell compares the data retained in the SRAM portion with data of a pair of bit lines $BL_{ijl}$ and $/BL_{ijl}$ to determine whether they are coincident with each other.

When comparing the data retained in the SRAM portion with data of the bit line pair $BL_{ijl}$ and $/BL_{ijl}$, a signal line $MATCH_{ij}$ is set to "H (precharge potential)" in advance. If the data coincide as a result of comparing the data, the signal line $MATCH_{ij}$ is kept in the "H" state (precharge state). In the case of noncoincidence of data, however, charge of the signal line $MATCH_{ij}$ is drawn into the bit line pair $BL_{ijl}$ and $/BL_{ijl}$ through the transistors T7 and T8, or the transistors T9 and T10, and consequently the potential of the signal line $MATCH_{ij}$ becomes the "L" state.

b. Memory cell array unit (FIG. 35)

When (i, j)=(1, 1), (1, 2), (2, 1), (2, 3), (3, 1), (3, 4), (4, 2), (4, 3), (5, 2), (5, 4), (6, 3), or (6, 4) and l is an integer in the range of 1 to 10, the bit line pair $BL_{ijl}$ and $/BL_{ijl}$ of the memory cell $M_{ijl}$ are connected to predetermined address paths included in AR1 and /AR1 to AR10 and /AR10, respectively.

When (i, j)=(1, 3), (1, 4), (2, 2), (2, 4), (3, 2), (3, 3), (4, 1), (4, 4), (5, 1), (5, 3), (6, 1), or (6, 2) and l is an integer in the range of 1 to 10, the bit line pair $BL_{ijl}$ and $/BL_{ijl}$ of the memory cell $M_{ijl}$ are connected to predetermined address paths included in AC1 and /AC1 to AC10 and /AC10, respectively.

For specifying one row address or one column address, a cell array $M_{ij}$ (corresponding to $M_{ij}$ of FIG. 18) of the SRAM of 10 bits is required. Since all of the 10 bits are subjected to the same operation (such as writing and comparison), the potential $WL_{ij}$ and the signal $COMP_{ij}$ are supplied to them in common.

The potential $WL_{ij}$ of the word line is opposite to the logic (level) of the signal $COMP_{ij}$. In other words, if $WL_{ij}$ is "H", $COMP_{ij}$ is "L". If $WL_{ij}$ is "L", $COMP_{ij}$ is "H".

The signal $MATCH_{ij}$ is a logical product (AND) of outputs of all memory cells (10 bits) $M_{ijl}$. In other words, if an input address specified by 10 bits of A1R to A10R completely coincide with all bits of the SRAM cells (10 bits), the signal $MATCH_{ij}$ becomes "H". If at least one bit is not coincident, the signal $MATCH_{ij}$ becomes "L".

A signal $AMATCH_{ij}$ is the logical product (AND) of the signal $MATCH_{ij}$ and the signal $COMP_{ij}$. In a cell array $M_{ij}$ of the SRAM which is carrying out address comparison, therefore, the signal $AMATCH_{ij}$ becomes equal to the $MATCH_{ij}$ because the signal $COMP_{ij}$ becomes "H". On the other hand, in a cell array $M_{ij}$ which writes data into a SRAM cell, the signal $AMATCH_{ij}$ becomes "L" because the signal $COMP_{ij}$ becomes "L".

c. General view (FIGS. 33 and 34)

A signal $TMATCH_i$ is a logical sum (NOR) of the signals $AMATCH_{ij}$ (j=1 to NRS+NCS). In other words, the signal $TMATCH_i$ becomes "H" when the input address is not coincident with the address of any repair solution. The signal $TMATCH_i$ is determined independently in each block $BLOCK_i$. In other words, each path (repair solution) of the "tree" structure is determined independently.

On the other hand, the word line potential $WL_{ij}$ of the SRAM cells (10 bits) is determined by a logical sum (NOR) of an output ($OSR_{i1}$ to $OSR_{i4}$) of shift registers shown in FIG. 37 and an output ($OTSR_1$ to $OTSR_4$) of shift registers common to the system shown in FIGS. 38 to 41. For example, the word line potential $WL_{ij}$ of the SRAM cells (10 bits) $M_{i1}$ is determined by the logical sum of the signal $OSR_{i1}$ and the signal $OTSR_1$. The word line $WL_{ij}$ of the SRAM cells (10 bits) $M_{i2}$ is determined by the logical sum of the signal $OSR_{i2}$ and the signal $OTSR_2$.

In the redundancy calculation test mode, the outputs $OTSR_1$ to $OTSR_4$ of the shift registers common to the entire system are fixed to "L". In the case where the output signals $OSR_{i1}$ to $OSR_{i4}$ are "L", therefore, the word line potential $WL_{ij}$ becomes "H" and the signal $COMP_{ij}$ becomes "L". Comparison of the input address with the address stored in the SRAM array is carried out when the word line potential $WL_{ij}$ is "L" and the signal $COMP_{ij}$ is "H".

For obtaining one repair solution, five shift registers ($SR_{i1}$ to $SR_{i5}$) each having a configuration shown in FIG. 37 are required. These five shift registers correspond to $SR_{ik}$ of FIG. 19.

In the entire system, therefore, 6 (=the number of repair solutions)×5 (=the number of spares+1) shift registers are required. As for the shift registers common to the entire system as shown in FIGS. 38 to 41, five (=the number of spares+1) shift registers are required ($TSR_1$ to $TSR_5$).

The shift registers heretofore described operate at instants of rising of the clock signals $SCLK_i$ and TCLK (change from "L" to "H").

The fail signal Fail is set so as to be "L" in ordinary times. Only when the expected value data input from an expected value pad is not coincident with the read data at the time of test, the fail signal Fail becomes "H" during a fixed period (in a pulse form).

The shift register input clock $SCLK_i$ is independently supplied to the block $BLOCK_i$ for deriving one repair solution. In the test mode, the shift register input clock $SCLK_i$ becomes equal to a signal $CLK_i$ which is the logical product (AND) of the fail signal Fail and the signal $TMATCH_i$ (FIG. 34).

When the input address is one specifying a failure bit and the input address is not coincident with the retained address in the already derived repair solution, the clock signal $SCLK_i$ becomes "H" and shifts data in the shift registers $SR_{i1}$ to $SR_{i5}$ by one.

If the redundancy calculation test mode is entered and then a reset signal RESET is turned "H" once, data "0" is written into all of the shift registers SRi1 to SRi5 (FIG. 37).

An input signal $IN_i$ of the shift register SRi1 is generated by a generator which generates data "1". While repair solutions are being generated, the signal $SCLK_i$ is "H". The fact that the data is shifted in the shift registers $SR_{i1}$ to $SR_{i5}$ by one means that only one data representing a failure address has been written.

In other words, if the data stored in the shift registers $SR_{i1}$ to $SR_{i5}$ shifts by one, an output value of one of the shift registers $SR_{i1}$ to $SR_{i5}$ changes from "0" to "1". As for the shift register changed in output value from "0" to "1", the potential of the word line corresponding to that shift register becomes "L" from that time on.

How registers of two-stage configuration, i.e., the shift registers TSR1 to TSR5 common to the blocks $BLOCK_i$ and the shift registers SRi1 to SRi5 independently operating for each block $BLOCK_i$ are controlled will now be described.

Basically, the shift registers $TSR_1$ to $TSR_5$ common to the blocks $BLOCK_i$ are controlled by outputs of the SRAM cell array and outputs of the shift registers $SR_{i1}$ to $SR_{i5}$ independently operating for each block $BLOCK_i$. The shift registers $SR_1$ to $SR_{i5}$ independently operating for each block $BLOCK_i$ are controlled by the output of the SRAM cell array and contents of effective bits.

In the present example, the reason why shift registers of two-stage configuration are required is that the contents of the effective bits should be retained for the test of the next time even after the fuse data (repair solutions) are output. If the fuse data are seen only in the final stage of the die sort, therefore, the shift registers of one stage suffices.

The description of the configuration of the redundancy calculation and allocation circuit of a 4 Mbits×n (where n is the number of repair units) DRAM having a 4 Mbit memory cell array as the repair unit (in the case where the number NRS of freely substitutable spare rows is 2 and the number NCS of freely substitutable spare columns is 2) will now be finished.

Expansion to a general case can be effected as per the following TABLE 1.

TABLE 1

|  | Embodiment | general structure |
|---|---|---|
| Row Address | 10-bit | NRA-bit |
| Column Address | 10-bit | NCA-bit |
| Number of Spare Row | 2 | NRS |
| Number of Spare Column | 2 | NCS |
| Total number of Spare Line | 4 | NRS + NCS |
| Number of repair solution | 6 | NRS + NCS$^C$NRS |
| Number of TSR shift register | 5 | NRS + NCS + 1 |
| Number of SR shift register | 30 | Nconb × (NRS + NCS + 1) |
| Number of SRAM cell | 240 | Nconb × (NRS × NRA + NCS × (NCA) |

FIG. 42 shows the configuration of a fuse data (and effective bit) output control circuit. FIGS. 43 to 49 show components forming the fuse data output control circuit of FIG. 42 in detail.

A block BSR BLOCK (having detailed components as shown in FIGS. 43 to 46) is formed by control registers for selecting one block $BLOCK_i$ for reading a repair solution out of the block $BLOCK_i$. The 10-bit fuse data (repair solution) read from the selected block $BLOCK_i$ is amplified by a current mirror sense amplifier, and then input to a block DSR BLOCK in parallel.

The block (control registers) DSR BLOCK converts the 10-bit fuse data to serial data, and then output the serial data to the outside of the LSI (memory chip) via a pad FOUT bit by bit.

Hereafter, the configuration of the fuse data (and effective bit) output control circuit of a 4 Mbits×n (where n is the number of repair units) DRAM having a 4-Mbit memory cell array as the repair unit (in the case where the number NRS of freely substitutable spare rows is 2 and the number NCS of freely substitutable spare columns) has heretofore been described.

Expansion to a general case can be effected as per the following TABLE 2.

TABLE 2

|  | Embodiment | General Structure |
|---|---|---|
| Number of BSR Shift Register | 6 | Nconb |
| Number of DSR Shift Register | 10 | Lager one between NRA and NCA |

Newly provided pads and buffers accompanying the pads in the semiconductor memory device of the present invention will now be described.

The newly provided pads include a pad for inputting a redundancy calculation test signal RDTEST, a pad for inputting a shift register data transfer signal SRT, a pad for inputting a fuse data transfer signal FT, and a pad for inputting a reset signal RESET.

Each of these input pads is normally fixed to "L" by high resistance N-channel MOS transistor. If the input pad is kept in such a state that no signal is supplied (floating state), therefore, the redundancy calculation test mode is not entered.

On the other hand, if a signal of "H" is supplied to these input pads, the redundancy calculation test mode is entered. When it is desired to cancel this mode, this redundancy calculation test mode can be canceled at any time by returning the input pad to the floating state.

C. Hardware configuration at the time when used as exclusive LSI

In A and B, an example having a circuit for generating repair solutions within the chip of DRAM has been described. Apart from the memory LSI (chip), the circuit for redundancy calculation and allocation may be provided in an exclusive LSI (chip) having a similar function (redundancy calculation and allocation function). In this case, the exclusive LSI is incorporated in the tester.

In the case where the circuit according to the present invention is incorporated in an exclusive LSI, the data input circuit in redundancy calculation test mode, the data comparator, and the fuse data (and effective bit) output control circuit become unnecessary.

Because the data input circuit and data comparator in redundancy calculation test mode is conventionally already incorporated in the tester, and the fuse data (and effective bit) output control circuit is a portion devised to serially output the fuse data and the effective bits to one pad FOUT. (In the case of the exclusive LSI, the fuse data and the effective bits can be processed in parallel within the tester.)

D. Circuit operation

Heretofore, the circuit configuration of the principal part of the semiconductor memory device in the present invention has been described. Hereafter, operation of the semiconductor memory device will be described in the following three steps.

Test mode entry
Repair solution generation during test
Result output (1) Test mode entry In the semiconductor memory device described by referring to FIGS. 25 to 41, the memory test is carried out basically in the state of a wafer. At the time of entry into the redundancy calculation test mode, therefore, an "H", signal is applied to the entry pad RDTEST, (2) Repair solution generation during test Upon entry into the redundancy calculation test mode, the redundancy calculation and allocation circuit, the data input/ data comparator circuit in redundancy calculation test mode, the fuse data (and effective bit) output control circuit shown in FIG. 25 are activated.

In this state, memory cell test is carried out. The test method may be basically the same as that of the memory tester ordinarily carried out. The test pattern, timing, and input level may be the same as those of the ordinary memory tester. In other words, the test may be carried out in any method, and the test method is not especially limited.

However, the test method differs in only one point from the conventional test method. In the case of the present invention, the ordinary read cycle is not present. Instead, a so-called expected value input/comparison cycle is provided. In the expected value input/comparison cycle, expected value data (expected value of the read data, i.e., data expected to be output when data can be correctly read) is supplied to an input/output pad, and this expected value data is compared with the memory cell read data.

Figure 40:
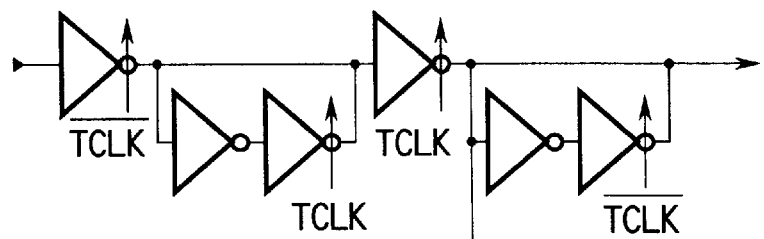
FIG. 40 is a diagram showing the configuration of shift registers $TSR_1$ to $TSR_4$ illustrated in FIG. 38.
Figure 41:
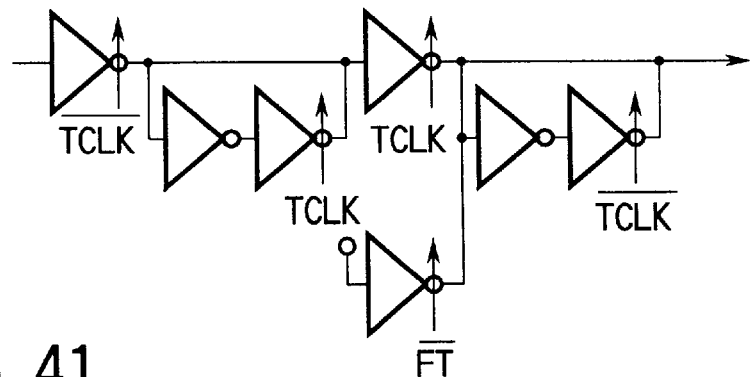
FIG. 41 is a diagram showing the configuration of a shift register $TSR_5$ illustrated in FIG. 38.

When the repair solutions are generated during the test, the outputs OTSR1 to OTSR5 of the shift registers common to the entire system are fixed to "L". Because at this time both the signal SRT and the signal FT of FIGS. 40 and 41 are set to "L". As initial states, the shift register reset signal RESET is set to "H", and the outputs $OSR_{i1}$ to $OSR_{i5}$ of the shift registers are set to "L".

In other words, all of the word line potential $WL_{ij}$ of the SRAM cell array become "H". Therefore, the address is written into all SRAM cells (memory cells).

Hereafter, a method for overwriting the address into the SRAM cells will be described. According to this method, word line potential $WL_{ij}$ keeps precharge condition, and consequently fast writing becomes possible.

As for a SRAM cell array in which the address of a failure bit is written and the word line potential $WL_{ij}$ is in the "L" state, the state is kept from that time on and only the comparison is effected to determine whether or not the address of a newly found failure bit coincides with the address already written into the cell array (see the flow chart of FIG. 24).

The input $IN_i$ of the first shift register $SR_{i1}$ included in a plurality of shift registers $SR_{i1}$ to $SR_{i5}$ is generated by the "1" generator (FIG. 34). As the initial state, the outputs $OSR_{i1}$ to $OSR_{i5}$ of the shift registers are set to "0" (where "0" corresponds to "L"). Whenever a failure bit is found, the outputs of the shift registers $SR_{i1}$ to $SR_{i5}$ are successively changed to "1" in synchronous with the clock signal $SCLK_i$. (As shown in FIG. 34, the logical product (AND) of the fail signal FAIL and the signal $TMATCH_i$ becomes this clock signal.) The word line $WL_{ij}$ of a SRAM array $M_{ij}$ connected to a shift register having an output of "1" becomes "L". In other words, the word line potential $WL_{ij}$ being "L" means that a failure address has been stored in its SRAM array $M_{ij}$. From that time on, only the comparison is effected in that SRAM array $M_{ij}$ to determine whether the address of a newly found failure bit coincides with the address already written into the cell array. The output of the shift registers $SR_{i1}$ to $SR_{i4}$ becoming "1" eventually indicates that the address stored in the SRAM array $M_{ij}$ is an address to be substituted by a spare and effective bits have been retained (see FIGS. 19 and 21).

If all outputs of a plurality of shift registers $SR_{i1}$ to $SR_{i5}$ become "1", i.e., the output $OSR_{i5}$ of the last shift register $SR_{i5}$ becomes "1", it means in the path (repair solution) of the block $BLOCK_i$ that all spare lines have been used. It becomes impossible to repair failure bits found thereafter by the path (repair solution) of that block $BLOCK_i$.

In this way, the output $OSR_{i5}$ of the last shift register $SR_{i5}$ is an index indicating whether the path (repair solution) of the block $BLOCK_i$ is effective. If the output $OSR_{i5}$ is "0", the path (repair solution) of the block $BLOCK_i$ is effective. If the output $OSR_{i5}$ is "1", the path (repair solution) of the block $BLOCK_i$ is ineffective.

FIGS. 50 to 55 show various signals at the time of redundancy calculation and allocation in the blocks $BLOCK_i$ (i=1 to 6), respectively.

Assuming that the memory cells are tested in the order of (R0, C0), (R0, C1), (R0, C2), (R0, C3), (R1, C0), (R1, C1), (R1, C2), (R1, C3), (R2, C0), (R2, C1), (R2, C2), (R2, C3), (R3, C0), (R3, C1), (R3, C2) and (R3, C3), cells (R0, C0), (R0, C2), (R0, C3), (R1, C0), (R1, C1) and (R2, C1) are failure cells at that time, and the number of spares NR=2 and NC=2, FIGS. 50 to 55 show the states of respective blocks (corresponding to repair solutions).

(3) Result output

After the test, it is determined whether the chip is a good chip which is repairable by redundancy (including a completely good chip requiring no redundancy) or a failure chip which is unrepairable by redundancy.

Assuming that a chip is a good chip which is repairable by redundancy (excluding a completely good chip), how to actually take out fuse data to make the chip normal will be described.

Basically, after the test, a signal of the "H" level is supplied to the input pad of the shift register data transfer signal SRT to output the data retained in the shift registers $SR_{i1}$ to $SR_{i5}$, i.e., effective bits. By supplying thereafter a signal of the "H" level to the input pad of the fuse data transfer signal FT, the fuse data is serially output from the output pad FOUT in a predetermined format.

This fuse data is used in the fuse blow process as information for cutting fuses.

Figure 56:
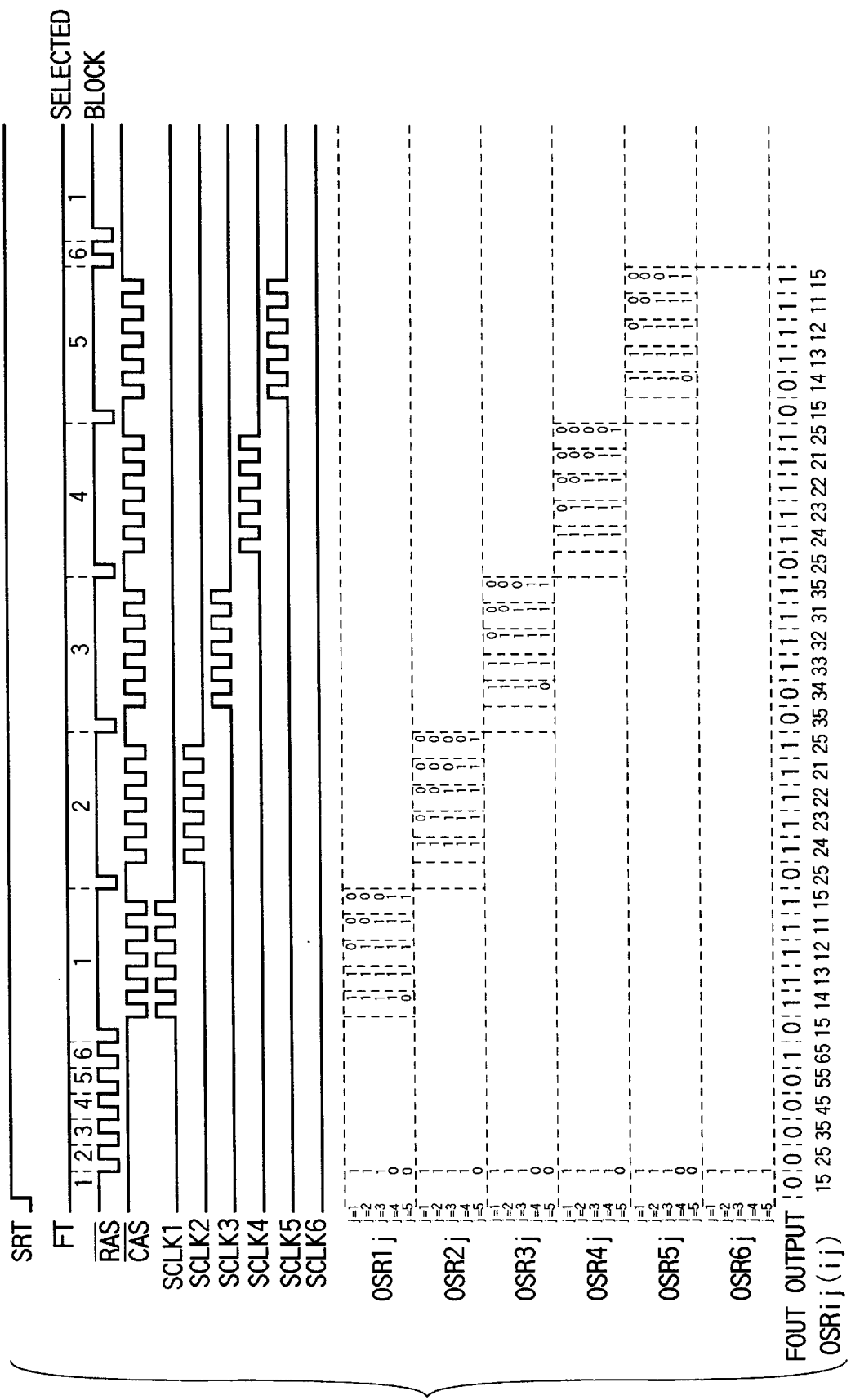
FIG. 56 is a diagram showing changes of signals at the time of output of shift register data (effective bits)
Figure 57:
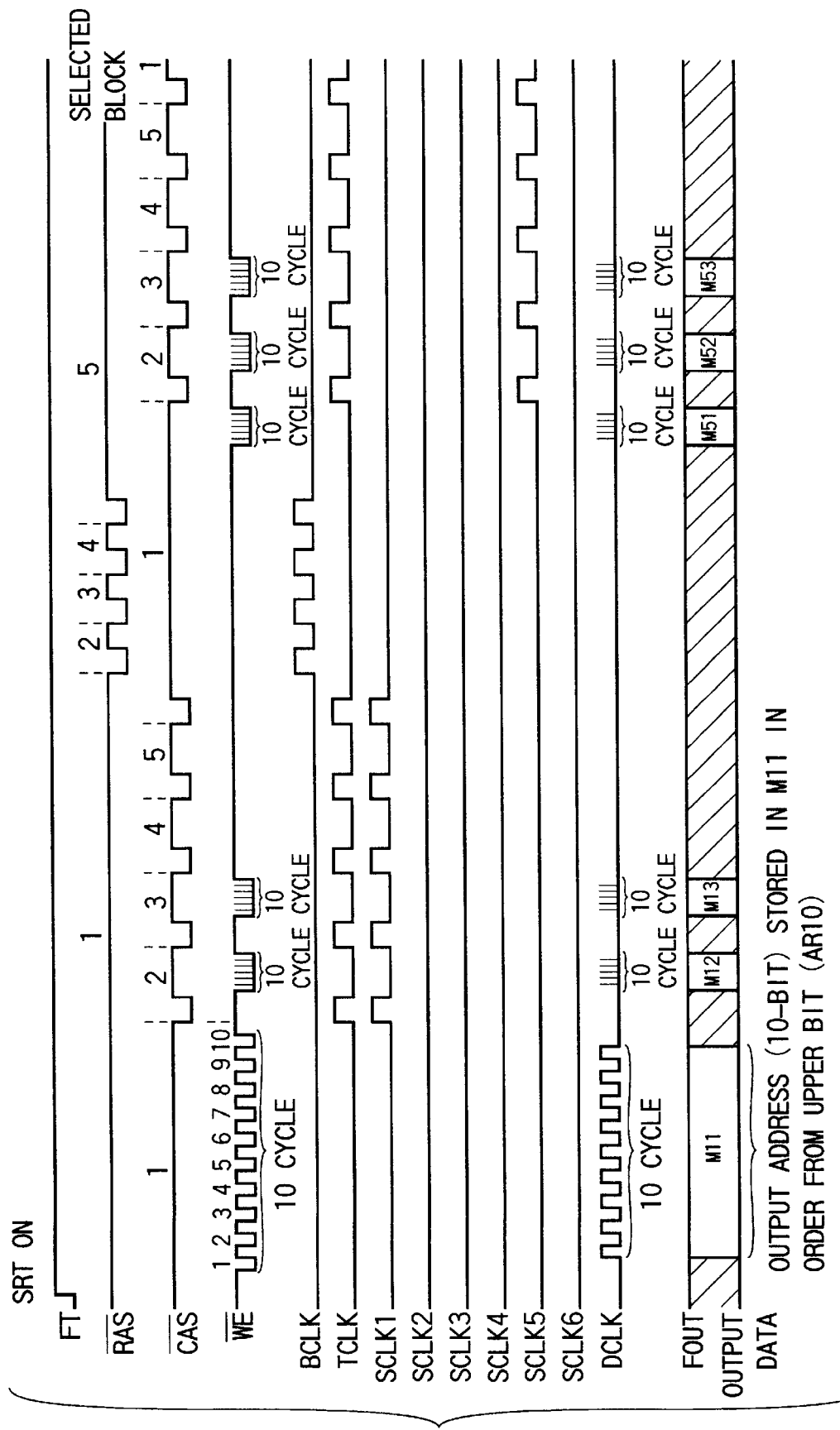
FIG. 57 is a diagram showing changes of signals at the time of output of fuse data.

FIG. 56 shows the timing of shift register output (effective bits). FIG. 57 shows the timing of fuse data output.

Hereafter, the procedure of the shift register output (effective bits) and fuse data output will be described by referring to these state transition diagrams.

a. Shift register data output (FIG. 56)

First of all, a signal of the "H" level is supplied to the input pad of the shift register data transfer signal SRT. Thereupon, the outputs $OTSR_1$ to $OTSR_4$ of the shift registers common to the entire system change from "L" to "H" and are fixed to "H". Every word line potential $WL_{ij}$ becomes "L".

Even if the data of the shift registers $SR_{i1}$ to $SR_{i5}$ are shifted in this state, therefore, false operation (such as false data reading or false data writing) does not occur in SRAM cells (memory cells).

Figure 44:
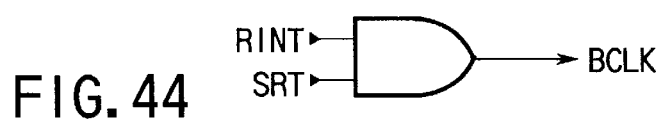
FIG. 44 is a diagram showing a circuit for generating a clock signal BCLK illustrated in FIG. 43.
Figure 45:
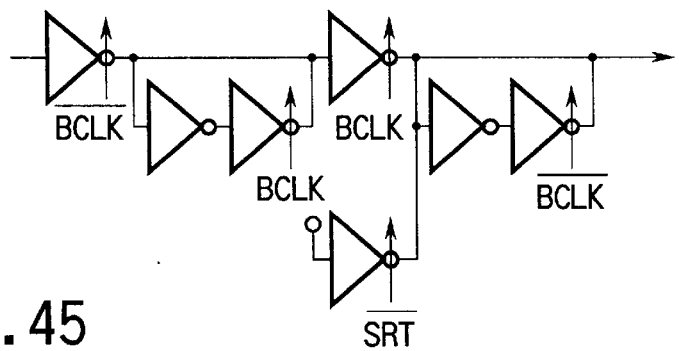
FIG. 45 is a diagram showing the configuration of shift registers $BSR_2$ to $BSR_6$ illustrated in FIG. 43.
Figure 46:
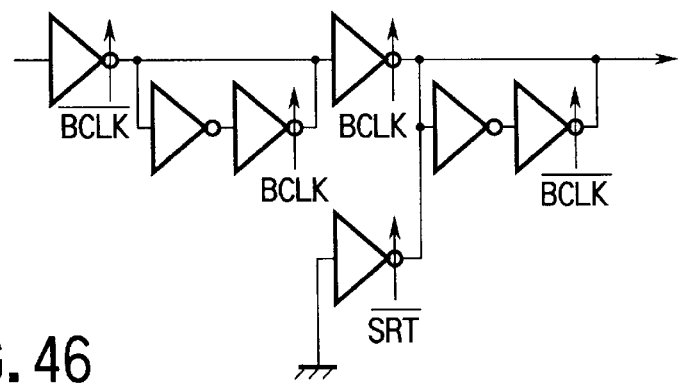
FIG. 46 is a diagram showing the configuration of a shift register $BSR_1$ illustrated in FIG. 43.
Figure 47:
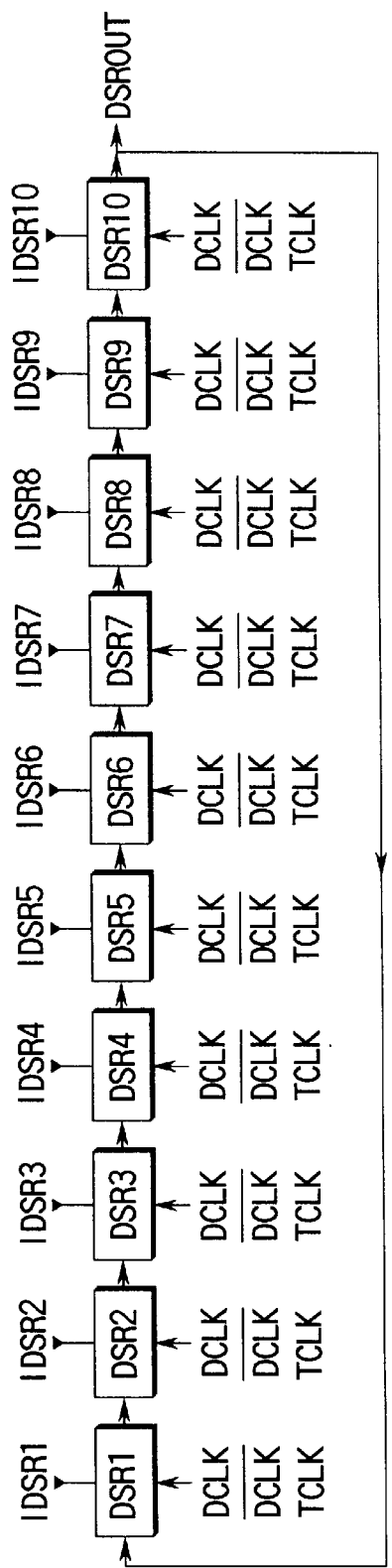
FIG. 47 is a diagram showing the configuration of a block (shift register) DSR BLOCK illustrated in FIG. 42.
Figure 49:
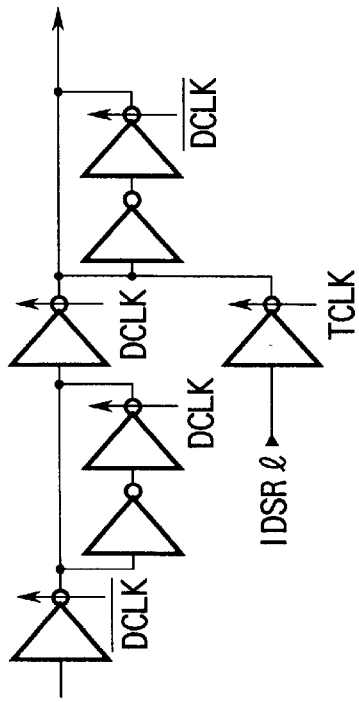
FIG. 49 is a diagram showing the configuration of a shift register $DSR_1$ illustrated in FIG. 47.
Figure 48:
FIG. 48 is a diagram showing a circuit for generating a clock signal DCLK illustrated in FIG. 47.
Figure 50:
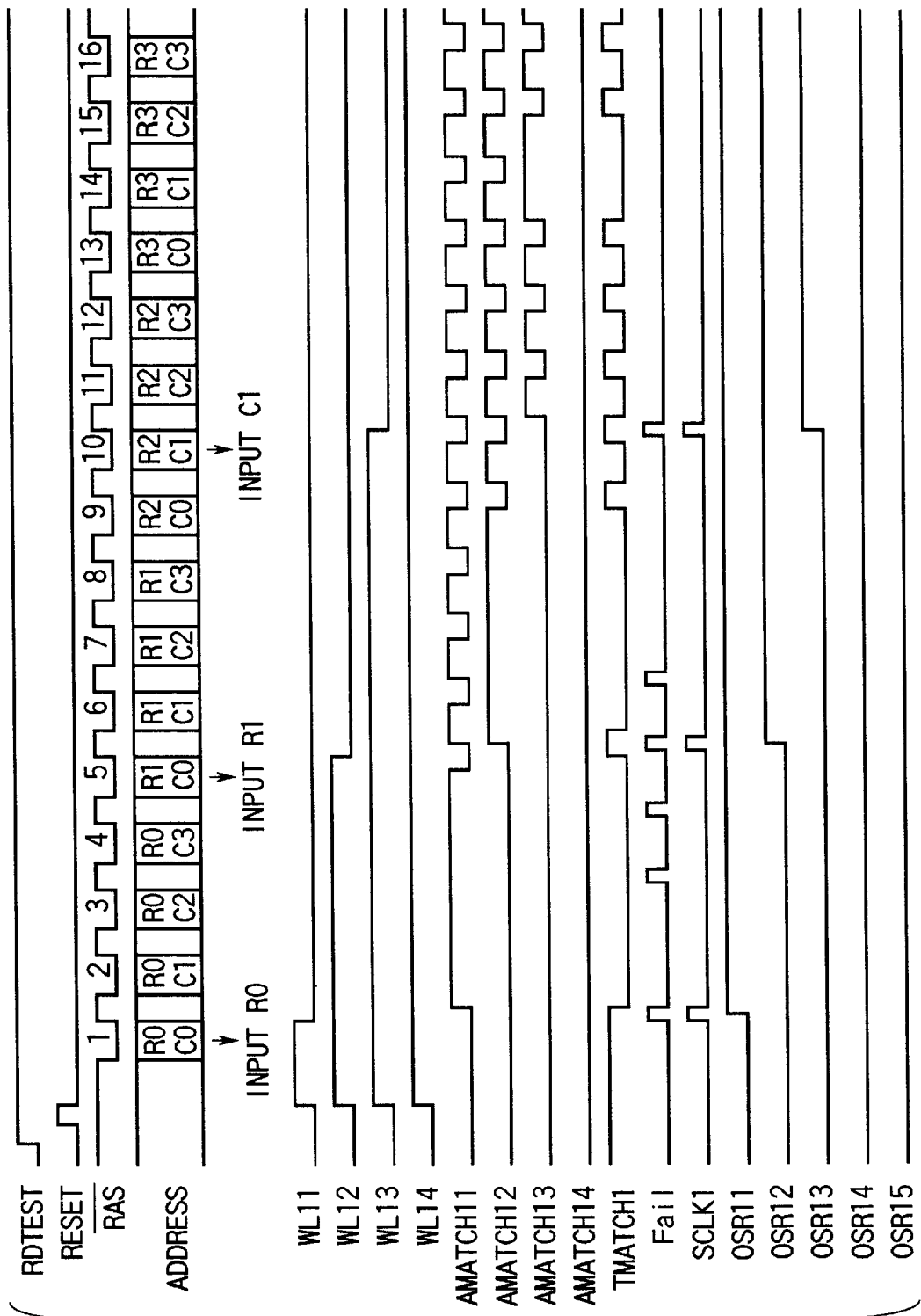
FIG. 50 is a diagram showing changes of signals in a BLOCK1 of FIG. 33 when a repair solution is generated.
Figure 51:
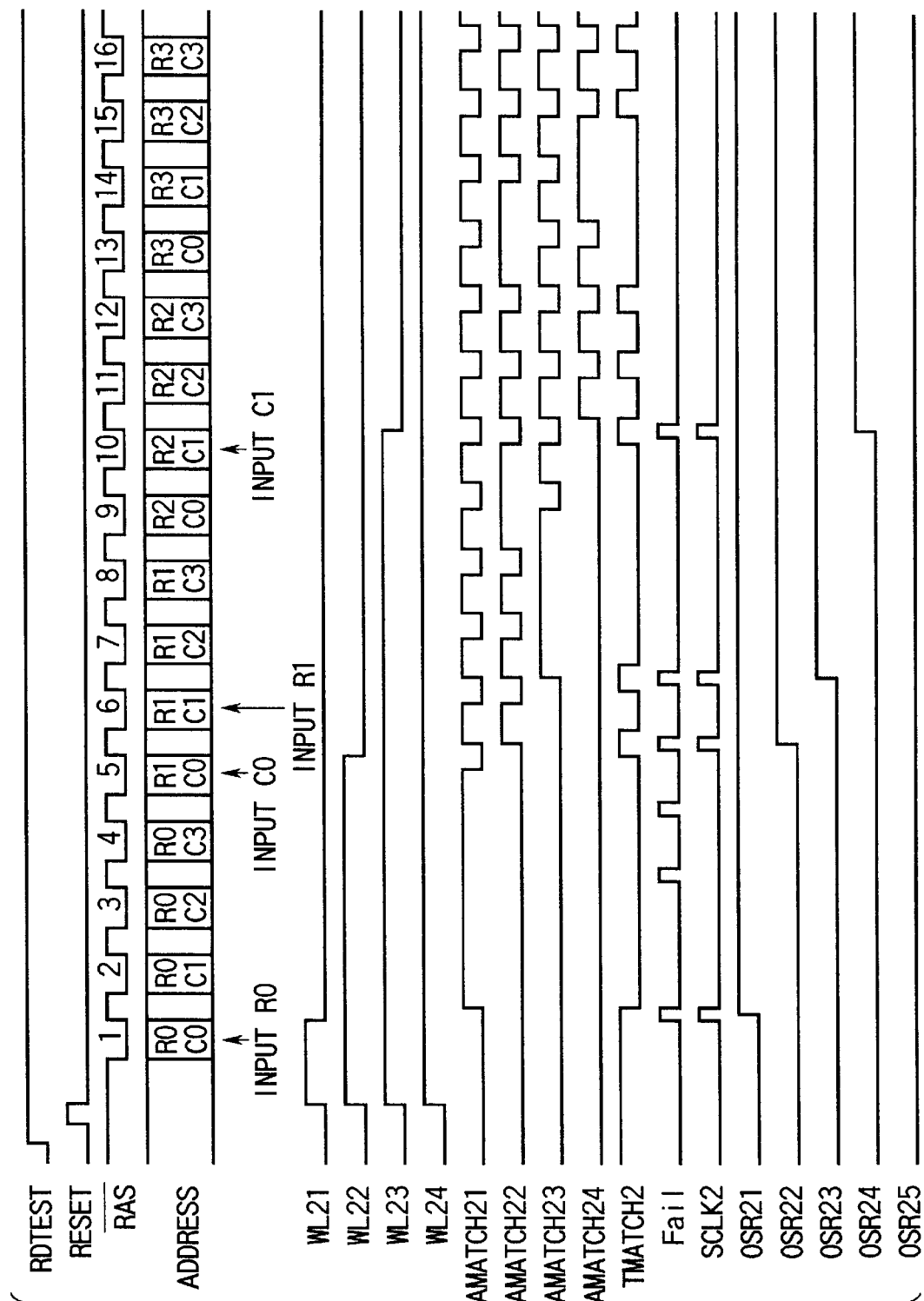
FIG. 51 is a diagram showing changes of signals in a BLOCK2 of FIG. 33 when a repair solution is generated.
Figure 52:
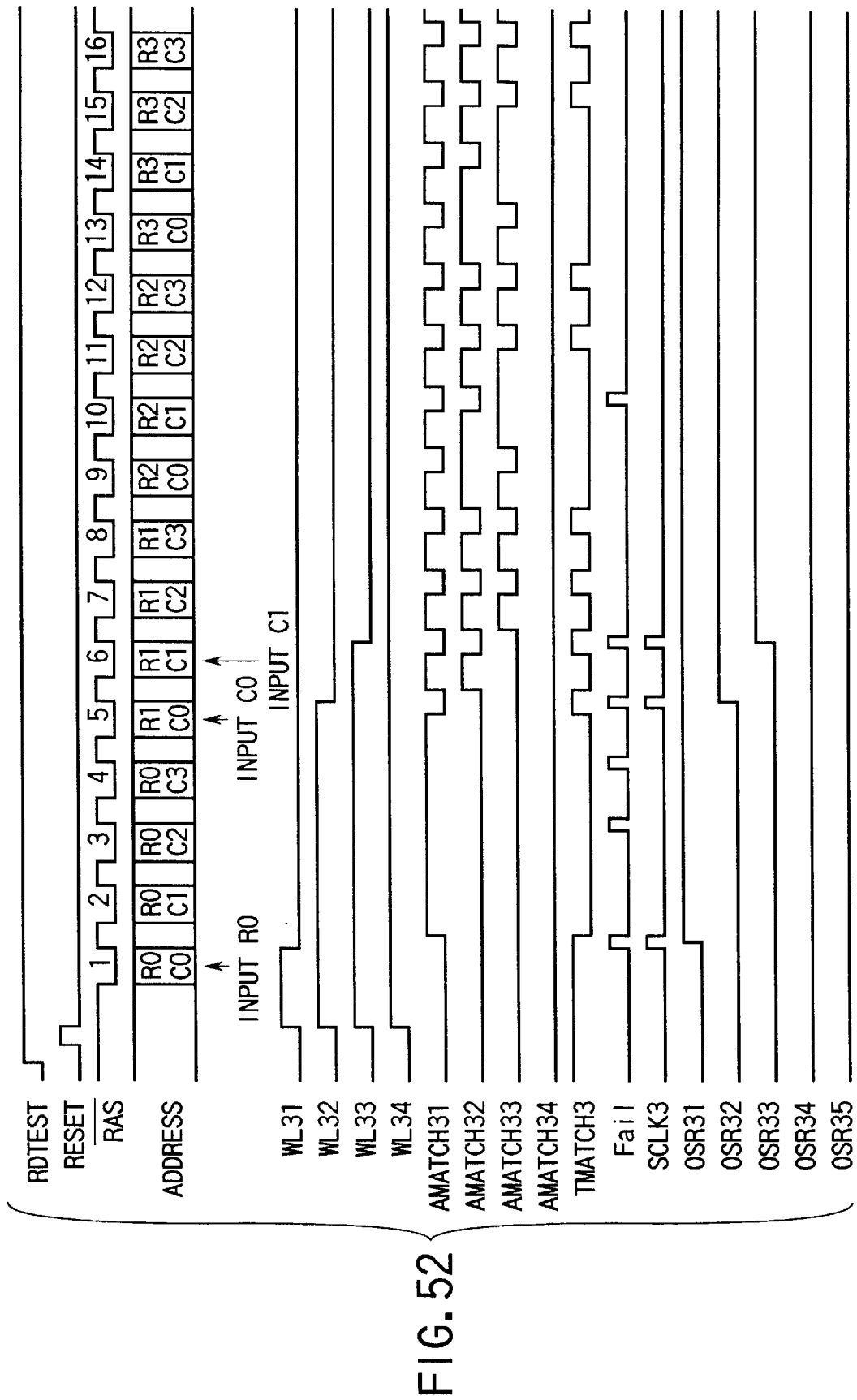
FIG. 52 is a diagram showing changes of signals in a BLOCK3 of FIG. 33 when a repair solution is generated.
Figure 53:
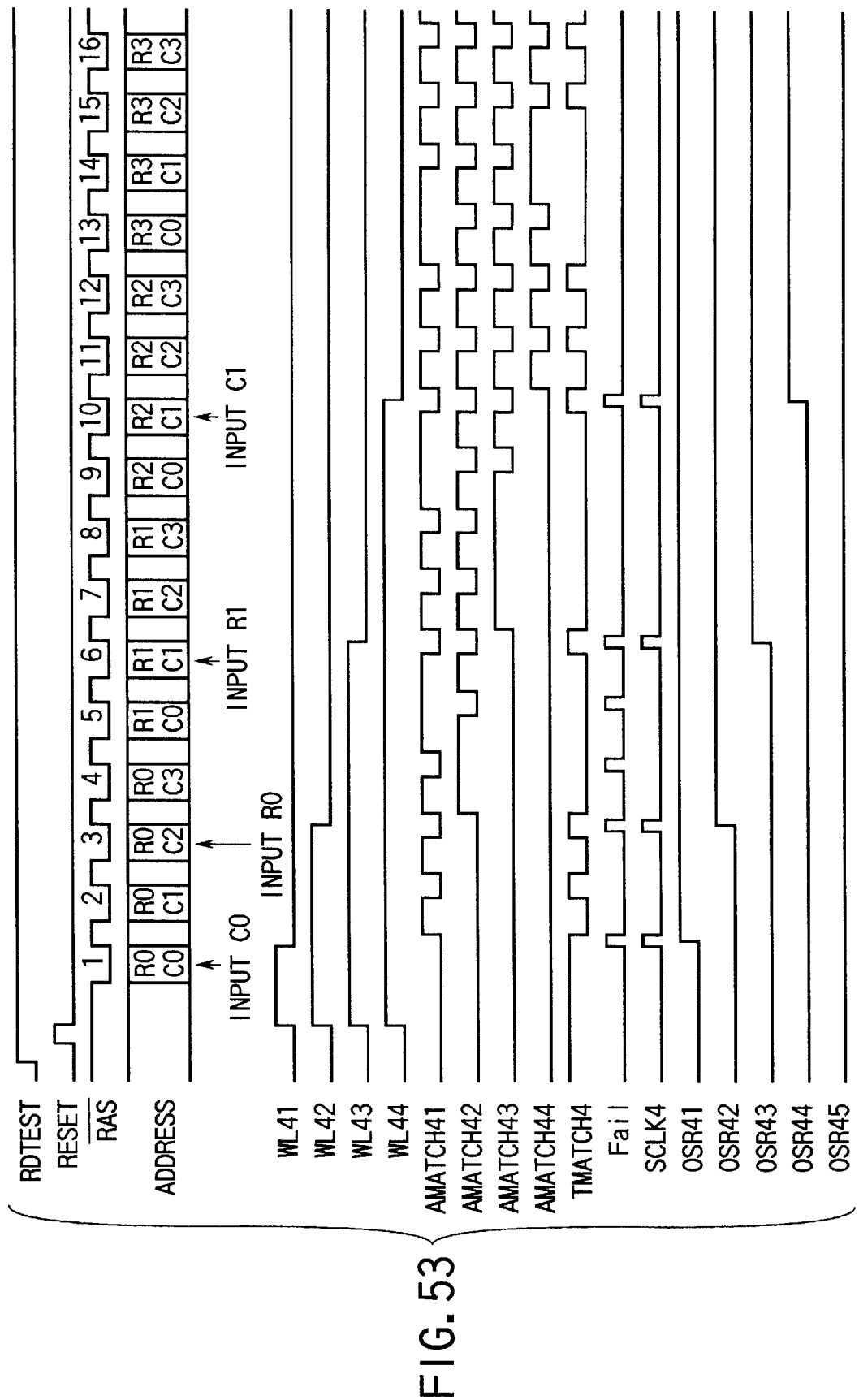
FIG. 53 is a diagram showing changes of signals in a BLOCK4 of FIG. 33 when a repair solution is generated.
Figure 54:
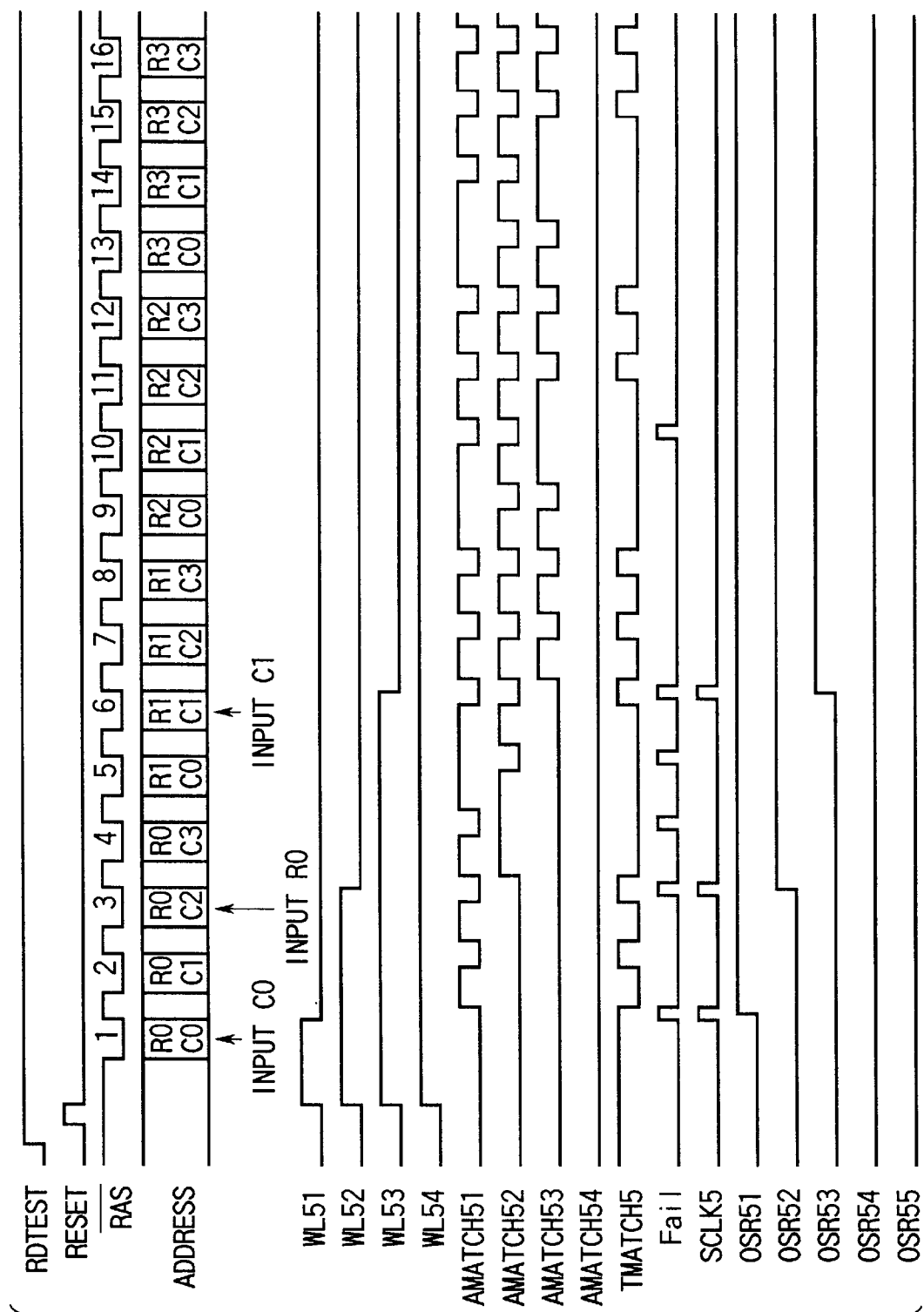
FIG. 54 is a diagram showing changes of signals in a BLOCK5 of FIG. 33 when a repair solution is generated.
Figure 55:
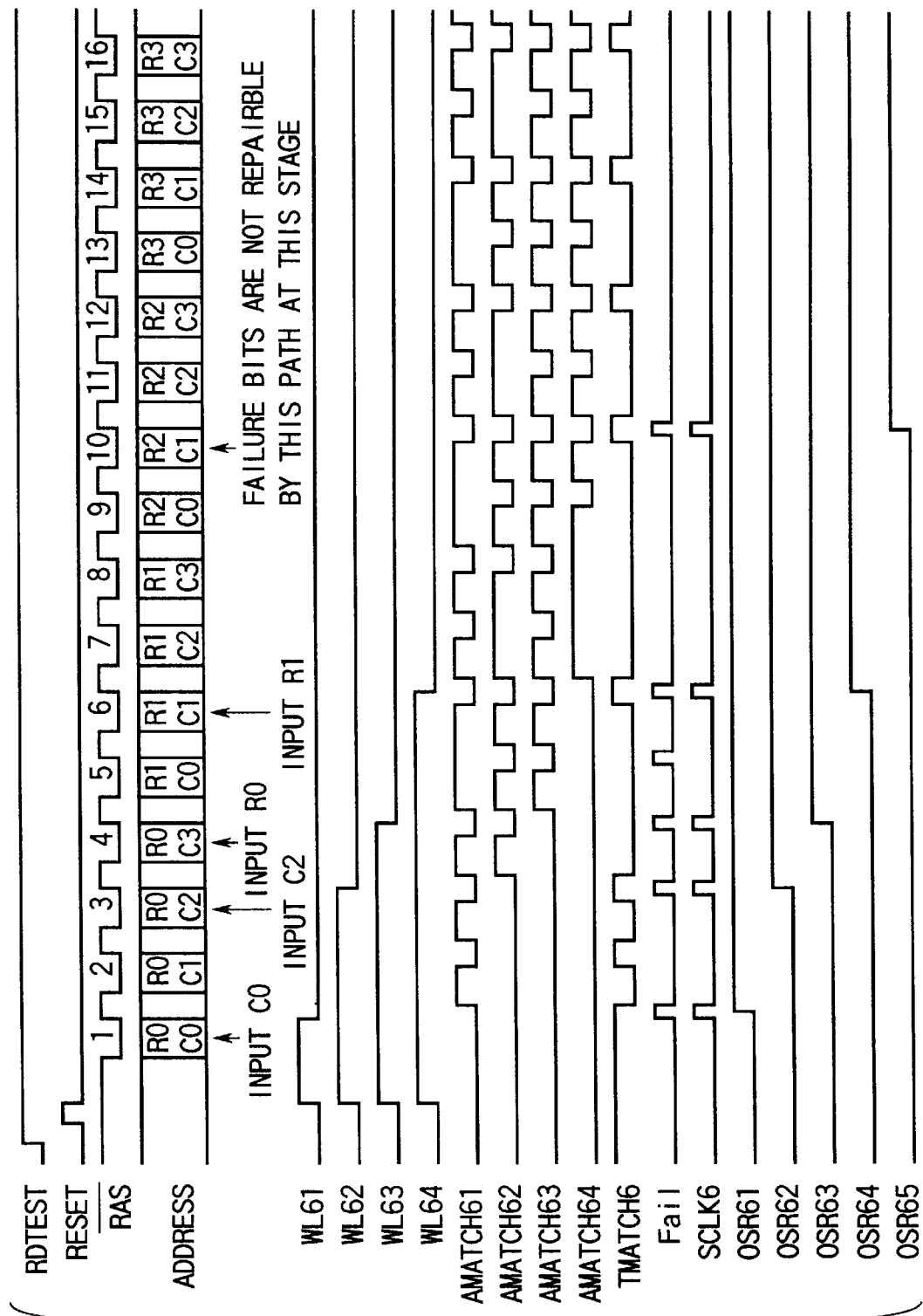
FIG. 55 is a diagram showing changes of signals in a BLOCK6 of FIG. 33 when a repair solution is generated.

As shown in FIG. 44, an input signal RINT which is a row address strobe signal /RAS becomes a signal BCLK. An input signal CINT which is a column address strobe signal /CAS becomes the signal $SCLK_i$.

The signal BCLK is a clock signal of a block BSR BLOCK. If the level of the row address strobe signal /RAS is changed (between "H" and "L") repeatedly, therefore, the selected block BSR BLOCK can be changed over. The shift register data of a specified block are read out to the outside of the chip.

Figure 43:
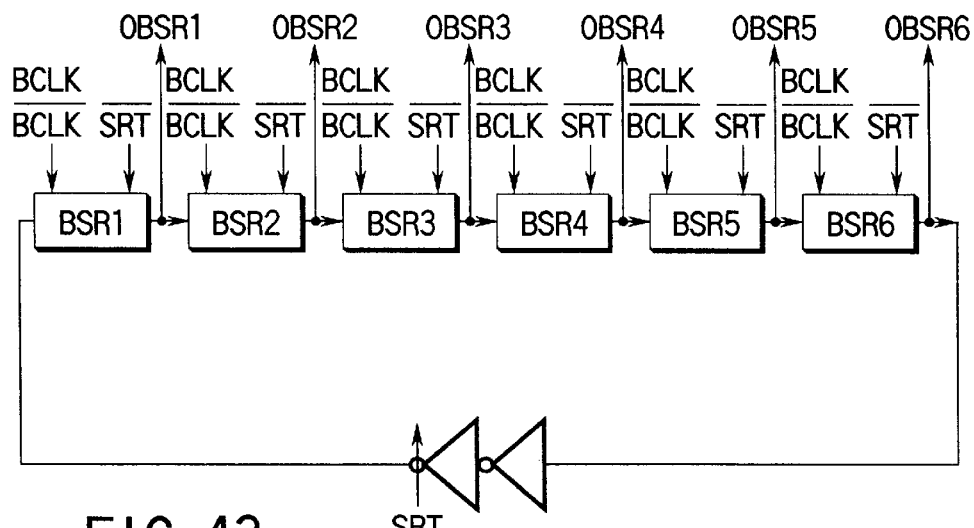
FIG. 43 is a diagram showing the configuration of a block (shift register) BSR BLOCK.

As understood from FIGS. 43 and 44, an "H" portion in the outputs $OBSR_{i1}$ to $OBSR_{i6}$ of registers of the block BSR BLOCK is shifted in synchronous with the clock signal BCLK from such an initial state that the output $OBSR_{i1}$ is "H" and the outputs $OBSR_{i2}$ to $OBSR_{i6}$ are "L". The output $OBSR_{ij}$ in the "H" state turns on a block select switch shown in FIG. 42. Therefore, the shift register data is output to outside of the chip via the block select switch.

On the other hand, the clock signal $SCLK_i$ is a logical product (AND) of fail signal Fail and a signal $TMATCH_i$ at the time of redundancy calculation and allocation during the test. At the time of shift register data output, however, the clock signal $SCLK_i$ becomes the input signal CINT which is the column address strobe signal /CAS. Since the column address strobe signal /CAS becomes the clock signal for shifting the shift register, the shift register data is successively output by changing this column address strobe signal /CAS (between "H" and "L") repeatedly.

In other words, if a cycle of changing the column address strobe signal /CAS between "H" and "L" is effected five times while keeping the row address strobe signal /RAS in the "H" state, effective solutions and ineffective solutions among repair solutions of all blocks $BLOCK_i$ are made clear.

The method for determining whether the chip is a good chip which is repairable by redundancy after the test completion will now be described.

Since the column address strobe signal /CAS becomes the clock signal $SCLK_i$, the shift register does not operate if the column address strobe signal /CAS is fixed to the "H"state.

If the row address strobe signal /RAS is changed between "H" and "L" repeatedly, therefore, the selected block is changed by the clock signal BCLK. At this time, the output OSRi5 of the shift registers, i.e., the effective bits of that path (repair solution) are output to the output pad FOUT in synchronous with the clock signal as shown in FIG. 42. Therefore, it can be determined whether the chip is a good chip which is repairable by redundancy.

For effective paths (repair solutions) which can be repaired by redundancy, data retained in the shift registers $SR_{i1}$ to $SR_{i5}$ is serially output to the output pad OUT every repair solution in synchronous with the clock signal $SCLK_i$. This data is effective bits each indicating whether the failure address retained in the SRAM is effective. An address in which this effective bit is not set (is not "1") indicates that an unnecessary address has been written by the overwriting method.

As an example, it is now assumed that the output values of the shift registers $SR_{i5}$ to $SR_{i1}$ (where the last one bit is ineffective) are 0, 0, 1, 1, 1 and 1. (The first one bit is output to the pad when the test is finished.) In this case, values of the shift registers $SR_{i5}$, $SR_{i4}$, $SR_{i3}$, $SR_{i2}$ and $SR_{i1}$ become 0, 0, 1, 1 and 1, respectively. The last one bit is an inverted value of the output value of the shift register $SR_{i5}$. Since the first one bit is the output of the shift register $SR_{i5}$, it indicates whether the path (repair solution) is effective (effective="0", ineffective="1"). Remaining four bits (0, 1, 1, 1) except the first one bit and the last one bit indicate whether effective address data is stored in each SRAM cell array $M_{ij}$ (j=1 to 4).

When reading the shift register data, the shift registers $SR_{i1}$ to $SR_{i5}$ are adapted to form a closed cycle (FIG. 34). Since the inversion of the output of the shift register $SR_{i5}$ is used as the input of the shift register $SR_{i1}$, however, the values of the shift registers after reading of one cycle has been carried out become the inversion of those obtained at the time of test completion.

FIG. 56 shows how the effective bits of the shift registers are output after the effective bits indicating whether each repair solution is effective are output.

According to the present example, repair solutions stored in the block 1, block 3 and block 5 use the fewest spare lines, and the number of spare lines used is three.

b. Fuse data output (FIG. 57)

In such a state that a signal of the "H" level is supplied to the input pad of the shift register transfer signal SRT, a signal of the "H" level is supplied to the input pad of the fuse data transfer signal FT.

Here, an object is to serially output the fuse data of a repair solution, i.e., the address data (10 bits) of the SRAM arrays $M_{i1}$, $M_{i2}$, $M_{i3}$ and $M_{i4}$ to the fuse data output pad FOUT every repair solution. In order to achieve this object, the common shift registers $TSR_1$ to $TSR_5$ are adapted to form a closed cycle.

The row address strobe signal /RAS becomes the clock signal BCLK for selecting a block BSR BLOCK. The column address strobe signal /CAS becomes the clock signal $SCLK_i$ and TCLK respectively of the shift registers $SR_{ij}$ and $TSR_k$ for specifying a SRAM array in the block BSR BLOCK. A write signal /WE becomes a clock signal DCLK of the Block DSR BLOCK for outputting parallel-serial converted fuse data bit by bit.

As for outputs $OBSR_1$ to $OBSR_6$ respectively of block selection shift registers $BSR_1$ to $BSR_6$, only the output OBSR1 is in the state "1" and remaining outputs $OBSR_2$ to $OBSR_6$ are in the state "0" in the beginning in the same way as the shift register data output. This effective bit "1" is shifted in synchronous with the clock signal BCLK. In the block having an effective bit "1", fuse data is output.

On the other hand, in the specified block, a signal of "0" propagates from the shift register $TRS_1$ to the shift register $TRS_4$ in synchronous with the rising edge (a change from "L" to "H") of the clock signal TCLK. Data of the SRAM array $M_{ij}$ corresponding to a shift register having an output of "0" is read out to the outside of the chip. In order to read the address of the repair solution, the word line is activated in each block four times in total. The "0" portion in the outputs of the shift registers specifies the word line activation.

In the same way as the ordinary operation, data readout of the SRAM array is carried out by amplifying the potential read out on read/write data lines (address lines) RWD and /RWD in a current mirror type sense amplifier, and leading 10 bits corresponding to one address to the shift registers DSR located near the external pad FOUT in synchronous with the clock signal TCLK. This 10-bit data is subjected to parallel-serial conversion and read out serially to the external pad FOUT bit by bit.

This serial data is output to the external pad in synchronous with the clock signal DCLK generated by the write signal /WE.

When fuse data output has finished, two cycles have elapsed. Therefore, the value of the shift register $SR_{ij}$ returns to the state obtained at the time when an immediately preceding memory tester was finished. By bringing the common shift register into the "L" state, therefore, analysis can be effected in the wake of the preceding result. For example, in the case where it is desired to monitor the repair solution in the middle course of the die sort, the test may be continued from this state.

FIG. 57 shows the state transition diagram at the time when fuse data of the block 1 and block 5 are read out to the pad FOUT.

By setting a shift register reset signal RESET to "H", all information of the result of preceding redundancy calculation and allocation is lost. This state transition diagram is used when monitoring the result of redundancy calculation and allocation irrespective of the result of preceding redundancy calculation and allocation.

Here, in order to specify a block to be read and a memory array in the block, the shift registers BSR and TSR were used, respectively. Instead, a method of specifying a block to be read and a memory array in the block using decoders is also conceivable.

Roles of the two stage registers, i.e., the shift registers $TSR_1$ to $TSR_5$ common to the respective blocks $BLOCK_i$, and the shift registers $SR_{i1}$ to $SR_{i5}$ operating independently in respective blocks $BLOCK_i$ will now be described again.

As described before, the shift registers $TSR_1$ to $TSR_5$ common to the respective blocks are controlled by the outputs of the SRAM arrays and outputs of the shift registers $SR_{i1}$ to $SR_{i5}$ operating independently in respective blocks $BLOCK_i$. The shift registers $SR_{i1}$ to $SR_{i5}$ operating independently in respective blocks $BLOCK_i$ are controlled by the outputs of the SRAM arrays and retain effective bit contents.

Registers of two stages are thus required. With one stage alone, contents of the effective bits cannot be retained for the test of the next time, when outputting the fuse data. If the repair solutions are seen only in the final step of the die sort, shift registers of a single stage suffice.

States in each step are (1) test mode entry, and (2) redundancy calculation and allocation (the outputs $OTSR_1$ to $OTSR_5$ of the shift registers are fixed to "L"). In other words, control of writing or comparison (SRAM array control) is carried out independently in each block $BLOCK_i$ by the shift registers $SR_{i1}$ to $SR_{i5}$. At this time, the data retained in the shift registers $SR_{i1}$ to $SR_{i5}$ functions as the effective bits as well.

The outputs $OTSR_1$ to $OTSR_4$ of the shift registers common to the entire system are changed from "L" to "H" and fixed to "H". In other words, every word line potential $WL_{ij}$ of the block $BLOCK_i$ becomes "L" to prevent the cell data being destroyed.

The shift registers $TSR_1$ to $TSR_5$ separates the shift registers $SR_{i1}$ to $SR_{i5}$ from the SRAM array. In this state, the data retained by the shift registers $SR_{i1}$ to $SR_{i5}$ of the block $BLOCK_i$ (effective bits of the fuse data) is output in synchronous with the clock signal $CLK_i$.

The shift registers $SR_{i1}$ to $SR_{i5}$ of the block $BLOCK_i$ and the outputs $OTSR_1$ to $OTSR_4$ of the shift registers common to the entire system are shifted in synchronous with each other. At this time, among the outputs $OTSR_1$ to $OTSR_4$ of the shift register TSR BLOCK, only one output is "0".

The logical sum (NOR) of the signals SRi1 to SRi5 and the signals $OTSR_1$ to $OTSR_4$ controls the word line of the SRAM array. Therefore, the word line of only one SRAM array corresponding to the output $OTSR_1$ to $OTSR_4$ of the shift register TSR BLOCK becoming "0" is activated. Data of the one SRAM array $M_{ij}$ is read out. (However, unrepairable path is not read out.)

Thus the shift registers $TSR_1$ to $TSR_5$ control the readout of the SRAM array. The shift registers $SR_{i1}$ to $SR_{i5}$ of each block $BLOCK_i$ execute the two cycles of the shift register output and fuse data output while remaining in the closed cycle, and then returns to the state at the time of test completion. The "1" input of the shift registers is the inversion logic of the output of the shift register 5.

c. Soft-set

By supplying a signal of "H" to the input pad of the soft-set signal SSET, the failure address stored in the error bit address stack circuit is set in the row and column address comparator. Thereby redundancy substitution can be effected without carrying out the fuse blow. By carrying out the retest, substitution can be checked.

An important point is as follows. After the substitution is effected by the soft-set, the memory tester is carried out. If a failure occurs, it indicates that there is a failure in the reserve cell, and consequently it is substituted by a reserve line which is not yet used. Thus the memory can be made good. In other words, instead of checking a failure of a reserve cell in advance, a failure after substitution is checked and only a failure portion is repaired. As a result, the yield can be improved efficiently.

As for the soft-set, besides the method of supplying a signal of "H" to the input pad of the soft-set signal SSET, an external signal such as the row address strobe signal /RAS or the column address strobe signal /CAS may be supplied at special timing.

The soft-set means a method of effecting substitution by the redundancy memory cell without carrying out the fuse blow as shown in FIGS. 58 and 59. In the above described example, data of all repair solutions (data of effective bits and fuse data) are taken out to the external output pad FOUT via the fuse data output control circuit.

For making the soft-set possible, therefore, instead of leading these data to the external output pad FOUT, data should be programmed in the fuse array on the basis of these data.

For example, if a fuse 1 is cut in FIG. 59, A1R="1" is set. The soft-set is effected by setting a signal SA1R to "L", instead of cutting the fuse 1. If the signal SA1R becomes "L", A1R="1" is soft-set.

FIG. 60 shows the configuration of a soft-set portion concerning the row address. As for the soft-set portion concerning the row address, the same configuration as that of FIG. 60 can be used.

For example, in the case where the number of spare rows is two and the number of spare columns is two, the effective bit of the selected repair solution is set to $SSR_j$, and fuse data of the repair solution is set to $SA1R_j$ and $/SA1R_j$ to $SA10R_j$ and $/SA10R_j$.

E. As for a logic-memory mixture LSI incorporating mixedly a logic circuit and a memory (especially a DRAM and/or a flash EEPROM) in a single chip, establishment of an efficient test method has become an important problem.

Currently, for the logic-memory mixture LSI, the logic portion and the memory portion are tested by a logic tester and a memory tester, respectively, and those tests are adapted to be carried out efficiently, respectively. However, such use of these two testers incurs an increase of the manufacturing cost.

From now on, therefore, the destination is to develop such a technique as to test the logic portion and the memory portion by using one inexpensive tester. The BIST (Built In Self Test) and BISR (Built In Self Repair) form one stream in developing a technique for conducting tests by using one tester inexpensively.

Here, the BIST refers to such a technique that a test circuit is provided within a chip. Beginning with a simple technique such as a multi-bit test and line mode test, techniques extending to such a full-scale technique that circuits, such as an address generator, a data generator, and a data comparator, are incorporated within a chip are known.

The BISR (Built In Self Repair) refers to such a technique that a redundancy repair solution is derived within a chip from a test result and memory cell substitution is carried out, i.e., a failure address is written in a failure address memory element for redundancy (such as fuses or nonvolatile semiconductor memory) on the basis of the redundancy repair solution.

Current big problems of the BISR are the following two problems.

1. Difficulty in deriving the redundancy repair solution within the chip

In the case where a redundancy repair solution is derived by an ordinary tester, test results, i.e., pass and fail information of every memory cell (bit) are stored within the tester. A memory storing such test results is called FAM (Fail Address Memory), and it is typically formed by a SRAM. The redundancy repair solution is derived from a predetermined algorithm on the basis of the test results stored in the FAM. In the case where a plurality of redundancy repair solutions have been obtained, one repair solution regarded as optimum is selected. One repair solution selected finally is written into the failure address memory element for redundancy. (For example, fuse blowing is carried out.)

As for the storage capacity of the FAM, a capacity corresponding to the number of bits of a memory cell, i.e., the same capacity as the storage capacity of the memory unit in the chip is needed. For example, in the case where a chip having a memory unit of 1 Mbit is tested, a FAM having a storage capacity of 1 Mbit is needed. Therefore, an ordinary tester includes a FAM having a capacity equal to the storage capacity of the memory unit included in the chip.

On the other hand, in implementing the BISR, it is practically impossible to provide the FAM in the chip. Because incorporation of a FAM having the same capacity as the memory unit in the chip has into the chip incurs an increase of the area of a wasteful memory region (not used for data storage) in the chip, and consequently it is not practical. For implementing the BISR, therefore, it becomes necessary to develop such a technique as to derive a redundancy repair solution without the FAM.

The technique described above in the items A to D relates to an algorithm and a hardware configuration capable of deriving all repair solutions. In this technique, the pass and fail information is not held for all memory cells (bits), but only the fail information, that is, necessary and enough for generate repair solution, is held in a dedicated memory in a chip.

In the case where addresses of failure memory cells (bits) are held, it is a matter of course that even only the only fail information, that is necessary and enough for generating repair solution, may amount to an enormous data quantity depending upon how failure memory cells occur. In the technique described above in the items A to D, however, the fail information is held in the dedicated memory as row addresses or column addresses of failure memory cells. According to the algorithm of the present invention, the so-called "tree" structure (capacity of the dedicated memory) is determined by the number of spare rows and spare columns in the repair unit. If the number of spare rows and spare columns in the repair unit is small, therefore, it is possible to derive all repair solutions without big area penalty and hold them within the chip.

2. Means for writing failure address (such as setting fuse) in address memory element for redundancy on the basis of redundancy repair solution In the current fuse set, fuse blowing using a laser is a main stream. Even if a redundancy repair solution is derived within the chip, therefore, the repair solution must be once taken out to an external device (such as the tester). Then the repair solution (fuse dater) is transferred from the external device to a fuse blowing machine. By using this fuse blowing machine, fuse blowing is carried out.

Therefore, it is desired to develop such a technique that the above described trouble can be omitted, i.e., such a technique that the failure address will be written into the failure address memory element for redundancy within the chip on the basis of the redundancy repair solution.

As candidates of a technique for setting the failure address within the chip without using a laser, there is, besides the above described technique utilizing soft set, such a technique that a portion for storing the failure address (row or column) is changed from fuses to a nonvolatile semiconductor memory (EPROM, Flash EEPROM, etc.). In this technique, the failure address is electrically written. Therefore, this technique has such an advantage that the failure address can be programmed in the failure address memory element for redundancy even after packaging.

a. Summary

In view of the above described situation, in the present embodiment:

a. A redundancy calculation and allocation circuit is incorporated in the chip;

b. A failure address memory element for redundancy for storing the failure address to be used in address comparison at the time of normal operation is formed by a nonvolatile semiconductor memory (EPROM, Flash EEPROM, etc.); and c. Repair solutions successively derived during execution of the redundancy calculation and allocation are programmed in the failure address element for redundancy, i.e., nonvolatile semiconductor memory.

In other words, since the repair solutions successively derived by the algorithm of the present invention are written into the nonvolatile semiconductor memory serving as the failure address memory element for redundancy, the redundancy repair can be completed by only selecting one optimum repair solution after the end of the test (it is not necessary to output the repair solutions or setting the failure address).

Therefore, it is possible to shorten the test time of memory cells and reduce the area of the chip adopting the BISR.

Adoption of the BISR aims at fast conducting the operation for deriving the redundancy repair solution and substituting a failure memory cell (failure row or failure column) by a spare memory cell (spare row or spare column), and aims at shortening the test time.

Hereafter, a method for generating repair solution and judging a chip repairable or unrepairable by using not a CPU in the tester but dedicated hardware (chip) will be described.

At the time of testing, data are written into all memory cells, then data of a memory cell is read out by inputting an address, and this data is compared with an expected value. The present embodiment is based on the assumption that the above described algorithm of the present invention is used, i.e., repair solutions are successively generated in parallel to the readout operation.

In other words, there is not carried out the operation of testing all memory cells (all bits) and thereafter judging the chip repairable or unrepairable on the basis of failure bits obtained as a result of the test (blanket repair algorithm). Instead, whenever a failure bit occurs during the execution of the test, repair solutions are successively generated in parallel to this test (successive repair algorithm).

Furthermore, an algorithm enumerating all repair solutions for each failure bit is adopted.

If such an algorithm is carried out in parallel to the test, then the repair solutions successively derived are stored in the nonvolatile semiconductor memory (functioning as the failure address memory for redundancy) as they are, and stacked. At the time when the test of all memory cells (all bits) has finished, all repair solutions are derived and one optimum repair solution is selected.

In other words, since all repair solutions are stored in the nonvolatile semiconductor memory functioning as the failure address memory element for redundancy as they are, it suffices to only select a repair solution, and processes such as fuse blowing need not be carried out separately.

In the present embodiment, it is not necessary to take out the result of judging the chip repairable or unrepairable to the outside of the chip. However, the result of judging the chip repairable or unrepairable may be taken out to the outside of the chip. In this case, it is possible to know outside the chip whether the chip is repairable or unrepairable.

Furthermore, since all repair solutions are successively stored in the nonvolatile semiconductor memory in the chip, not only information as to whether the chip is repairable or unrepairable derived after execution of all function tests can be obtained but also information as to whether the chip is repairable or unrepairable derived after execution of each function test can be monitored one after another. In some cases, therefore, it is found during the test that a chip is unrepairable. If the test is immediately stopped for such a chip, it can contribute to the objects such as shortening of the test time.

Furthermore, as the failure address memory element for redundancy, a nonvolatile semiconductor memory is used instead of the conventional fuse. Even if a failure occurs in the margin test, or a test after burn-in or packaging, therefore, the failure cell can be repaired by using a spare cell after each test. This largely contributes to cost reduction.

By using a special readout mode, the program data (repair solution) may be output to the outside of the chip.

b. Hardware configuration

Figure 61:
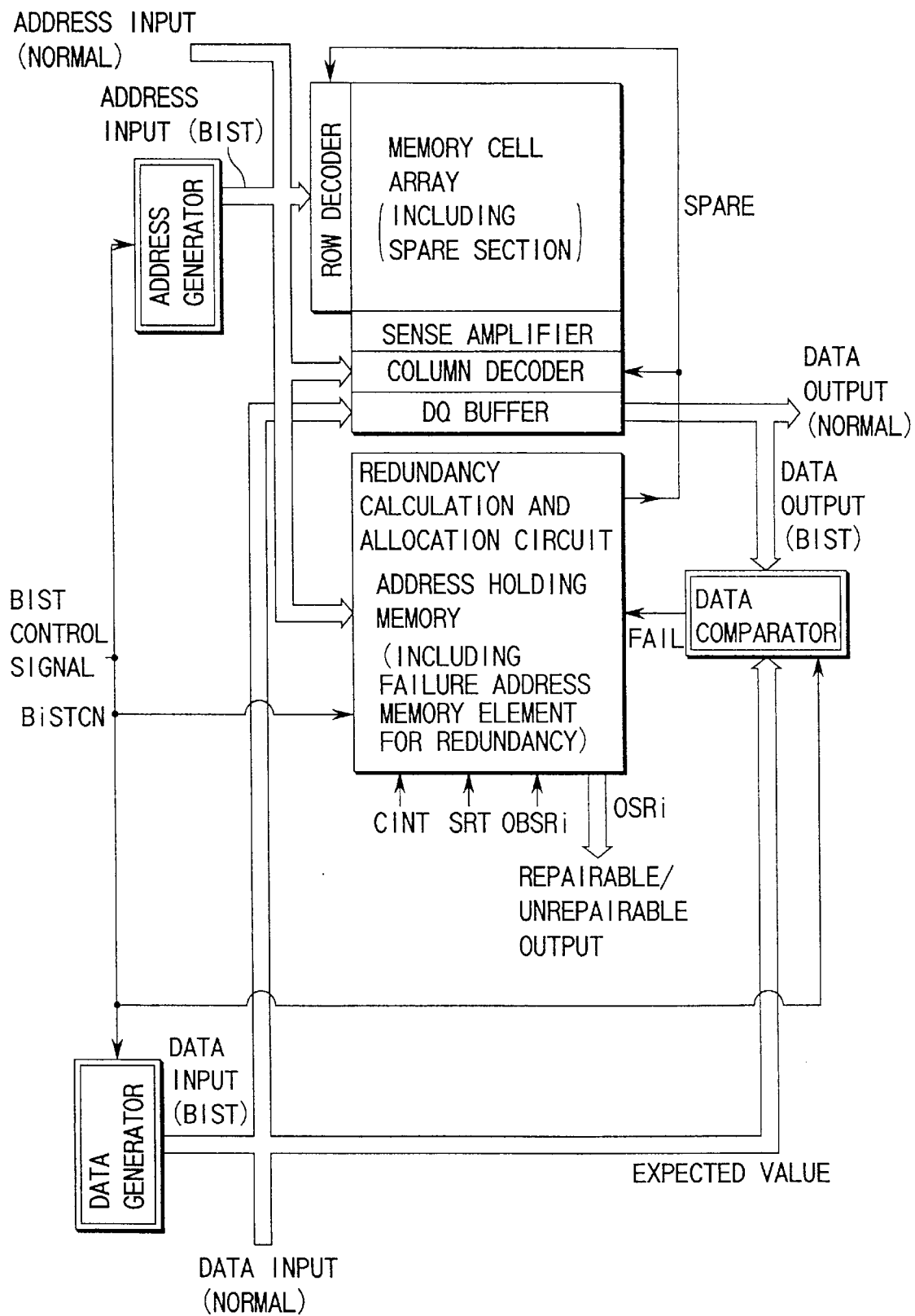
FIG. 61 is a diagram showing the configuration of a principal part (a portion concerning the repair solution generation) of a semiconductor memory of the present invention.
Figure 62:
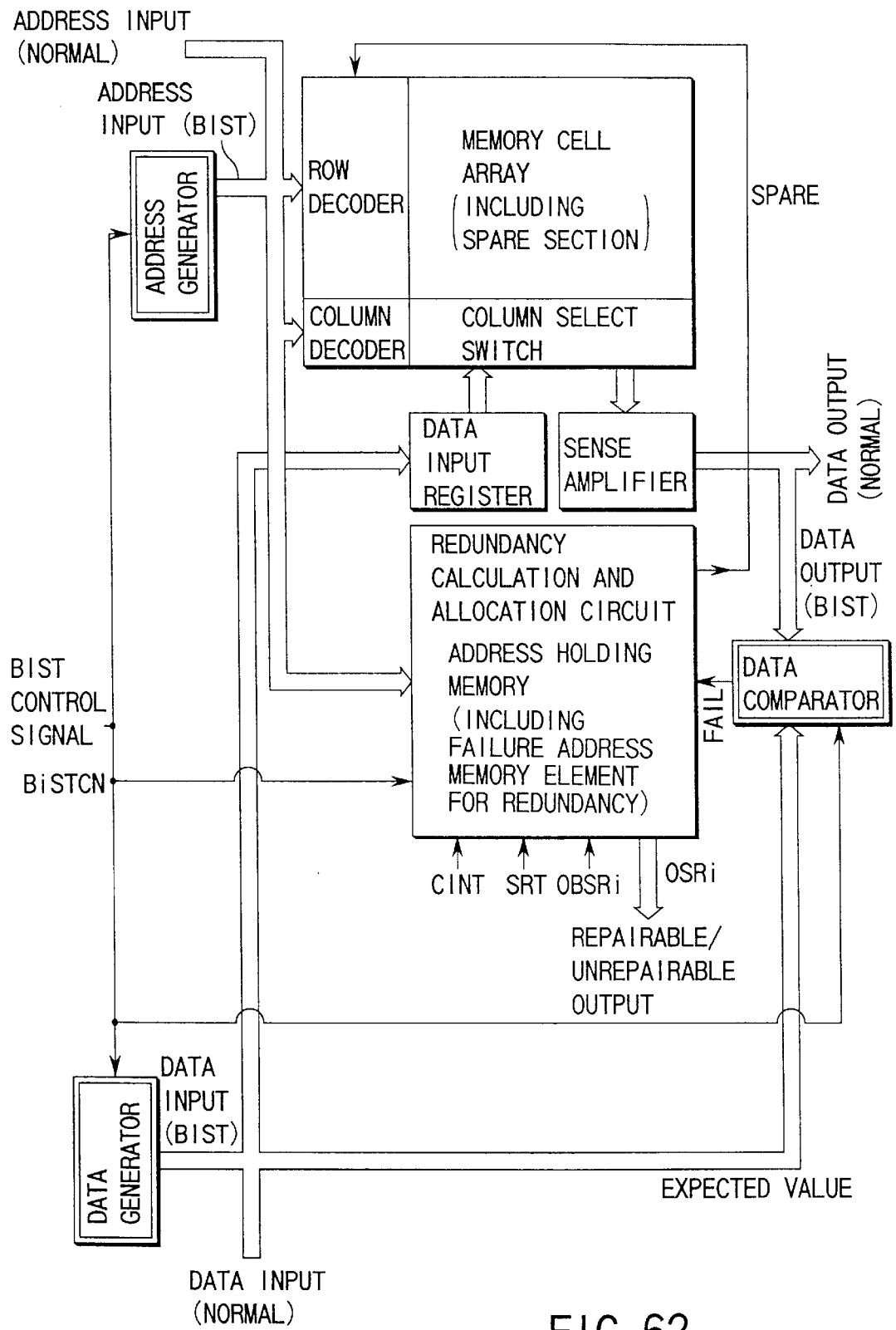
FIG. 62 is a diagram showing the configuration of a principal part (a portion concerning the repair solution generation) of a semiconductor memory of the present invention.

FIGS. 61 and 62 show a principal part of a semiconductor memory of the present invention.

FIG. 61 is based on a DRAM (including a logic-memory mixture LSI). FIG. 62 is based on an EEPROM.

A portion for controlling the memory reading and writing by using /RAS, /CAS, and /WE is completely the same as the configuration of the conventional technique. Also as for the operation such as inputting an external address to the chip, data writing, and data reading, there is not a bit of difference as compared with the conventional technique.

With respect to redundancy, however, a nonvolatile semiconductor memory (EPROM, Flash EEPROM, etc.) is adopted as the means for storing address data to substitute a failure bit (failure row or failure column) by a spare row or a spare column, instead of the conventional fuse (laser blowing). This nonvolatile semiconductor memory functions as both the failure address memory element for redundancy and the address holding memory at the time of repair solution generation.

The nonvolatile semiconductor memory has a capacity capable of storing all repair solutions. (Because of the "tree" structure, the maximum number of repair solutions is known beforehand. See FIGS. 16 and 17.) The nonvolatile semiconductor memory forms the failure address holding memory (which functions as the failure address memory element for redundancy as well in the present embodiment) of FIG. 18 and the effective bit holding memory of FIG. 19.

Figure 63:
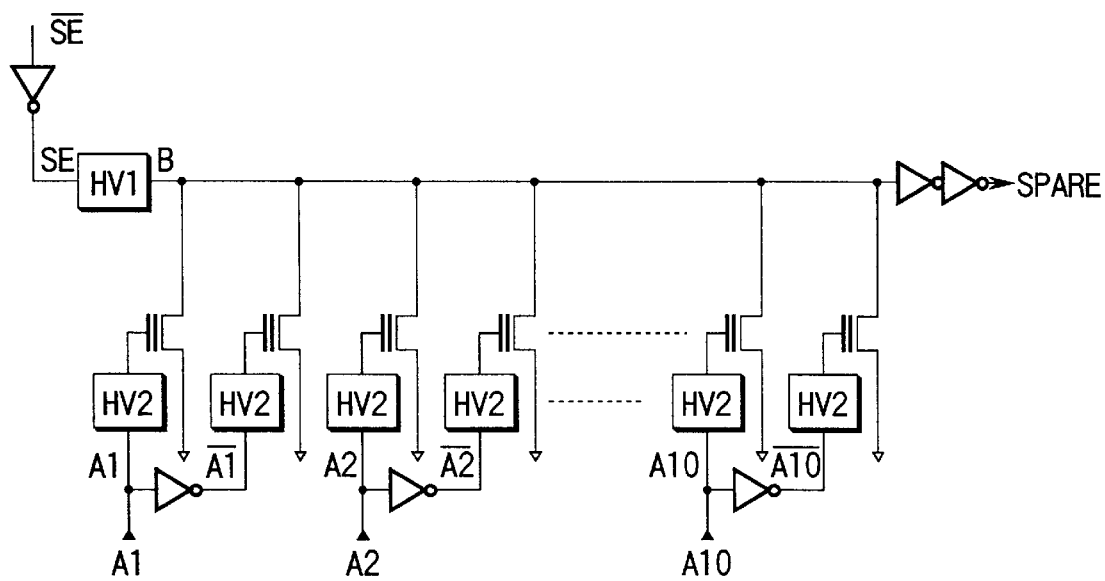
FIG. 63 is a diagram showing a part of a failure address memory element for redundancy (nonvolatile semiconductor memory)
Figures 64, 65:
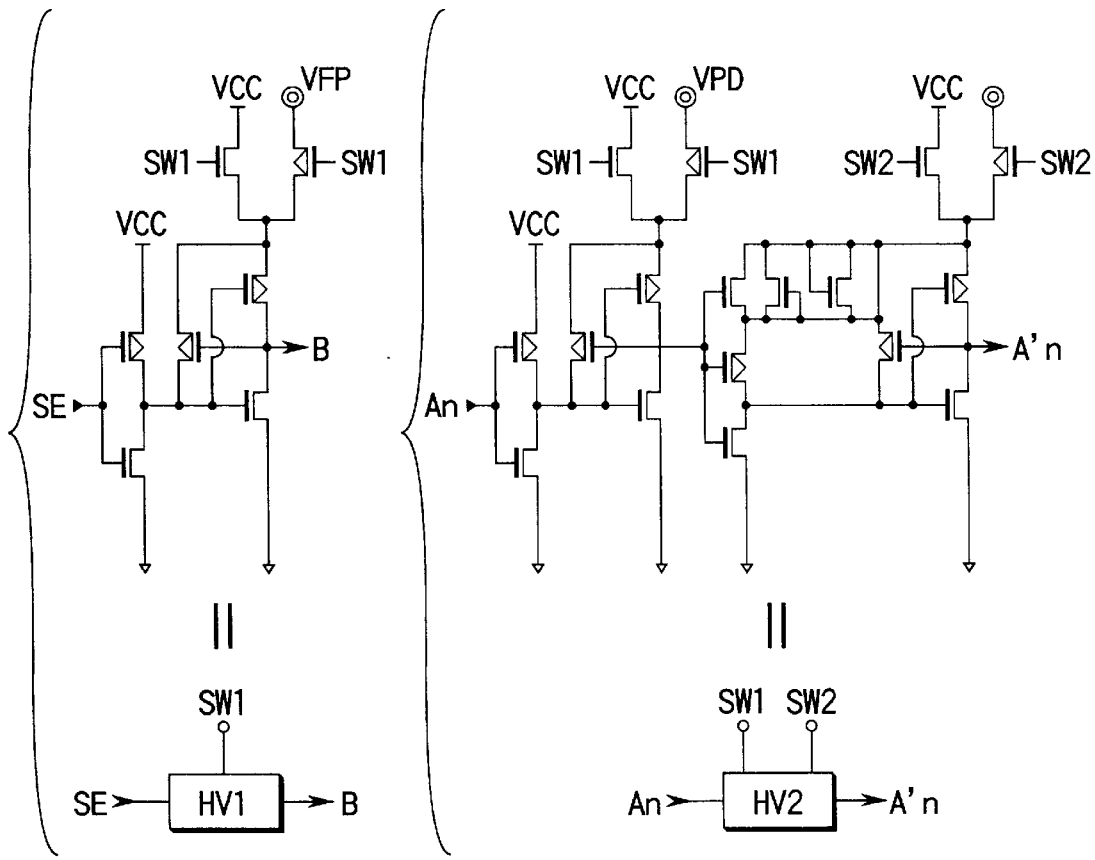
FIG. 64 is a diagram showing the configuration of a block HV1 illustrated in FIG. 63.
FIG. 65 is a diagram showing the configuration of a block HV2 illustrated in FIG. 63.

A portion for storing the failure address (repair solution) has a configuration as shown in, for example, FIGS. 63 to 65.

In the present embodiment, it is supposed that the nonvolatile semiconductor memory is formed by FLOTOX transistors. In other words, denoting gate voltage by VG, drain voltage by VD, and source voltage by VS, 1) At the time of writing ("1" writing: rise of threshold)
   VG=VD=VPP (boosted voltage)
   VS=GND
2) At the time of reading
   VG=VCC (internal voltage)
3) Erase
   VG=GND
   VD=VPP (boosted voltage).

If data has not been written beforehand (i.e., data is "0") at the time of reading, then a channel is formed between the drain and the source, and the FLOTOX transistor turns on. On the other hand, if data has been written beforehand (i.e., data is "1"), then a channel is not formed between the drain and the source, and the FLOTOX transistor turns off.

Besides FLOTOX transistors, the nonvolatile semiconductor memory for storing the failure address may be formed by any memory such as a flash EEPROM as far as electrical reading, writing, and erasing are possible.

After redundancy substitution information (failure address) has been programmed into the nonvolatile semiconductor memory, an input address is compared by a comparator with the failure address at the time of normal operation. If the input address coincides with the failure address, then a spare decoder is activated, a normal decoder is inactivated, and a spare line (spare row or spare column) is selected.

For example, when a signal /SE of FIG. 63 is "L," the input address is compared by the comparator with the failure address. If the input address coincides with the failure address, an output SPARE becomes "H (redundancy bit)." If the input address does not coincide with the failure address, the output SPARE becomes "L."

FIG. 64 shows the configuration of a block HV1 of FIG. 63. FIG. 65 shows the configuration of a block HV2 of FIG. 63.

TABLE 3 shows the relation between inputs SW1 and SE of the circuit of FIG. 64 and an output B.

TABLE 3

| SW1 | SE | B |
|---|---|---|
| H | H | VCC |
| L | H | 0 |
| L | H | VPP |
| L | L | 0 |

TABLE 4 shows the relation between inputs SW1, SW2, and An of the circuit of FIG. 65 and an output A.

TABLE 4

| SW1 | SW2 | An | A' | |
|---|---|---|---|---|
| L | L | H | VPP | WRITE |
| L | L | L | 0 | WRITE |
| H | L | H | 0 | ERASE |
| H | L | L | 0 | ERASE |
| H | H | H | VCC | READ |
| H | H | L | 0 | READ |

The semiconductor memory shown in FIGS. 61 and 62 will now be described.

A feature of this semiconductor memory is that a redundancy calculation and allocation circuit (including an address holding memory serving also as a failure address memory element for redundancy) is included. Although this point is described later, its function will now be described briefly. During the memory cell array test, the redundancy calculation and allocation circuit derives redundancy repair solutions successively, and sets (writes) the redundancy repair solutions into the address holding memory/failure address memory element for redundancy (for example, such as an electrically programmable, erasable, and readable nonvolatile semiconductor memory).

Typically in the test using a tester, a test process, a repair solution generation process, and a failure address setting process are carried out separately one after another.

In the present embodiment, all of these processes are carried out at the same time. In other words, memory cell tests are successively executed. During that time, a repair solution is generated within the chip. At the same time, this repair solution is set in the address holding memory/failure address memory element for redundancy (nonvolatile semiconductor memory).

After the test has finished, optimum one is selected out of the repair solutions stored in the address holding memory/failure address memory element for redundancy, and it is used for spare control (this corresponds to the so-called conventional set fuse). At the time of normal operation, the input address is compared with the address set in the address holding memory/failure address memory element for redundancy.

The result of judging the chip repairable or unrepairable can be taken out to the outside of the chip after the test has finished. On the basis of this result, an optimum redundancy repair solution may be selected.

In FIGS. 61 and 62, a block surrounded by a double line (address generator, data generator, and data comparator) forms a principal part of a BIST circuit.

In a BISR circuit, the BIST may be incorporated or may not be incorporated. In the present embodiment, however, it is supposed that the BIST is incorporated. Such a mode that the BIST and BISR are activated is hereafter referred to as BIST mode.

In the BIST mode, all of address generation, data generation and comparison with the expected value at the time of function test are carried out by the BIST circuit in the chip. If comparison of the read data of a memory cell with the expected value data of the data generator results in noncoincidence, a fail signal Fail becomes "H" in a pulse form and this is input to the redundancy calculation and allocation circuit. The fail signal Fail is set so as to be normally in the "L" state.

The redundancy calculation and allocation circuit will now be described.

FIGS. 66 to 69 show the hardware configuration of the redundancy calculation and allocation circuit in the case where the number NRS of spare rows is two and the number NCS of spare columns is two for the repair unit (4 Mbits) of the memory cell array.

Figure 66:
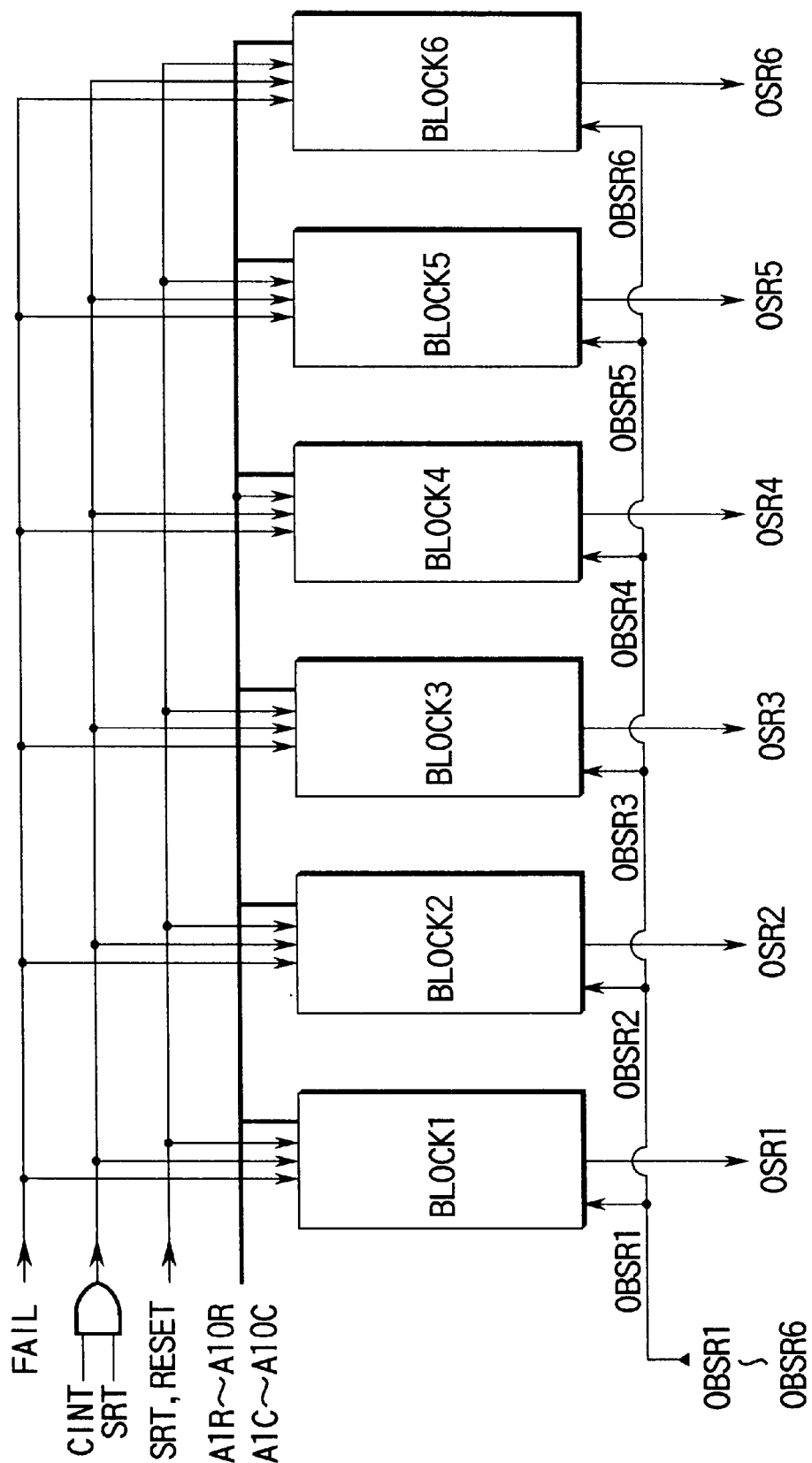
FIG. 66 is a diagram showing a principal part of a redundancy calculation and allocation circuit illustrated in FIGS. 61 and 62.

As shown in FIG. 66, the redundancy calculation and allocation circuit is formed by blocks $BLOCK_i$ (i=1 to Nconb, Nconb is the number of paths) corresponding to all repair solutions (paths of "tree" structure).

Figure 67:
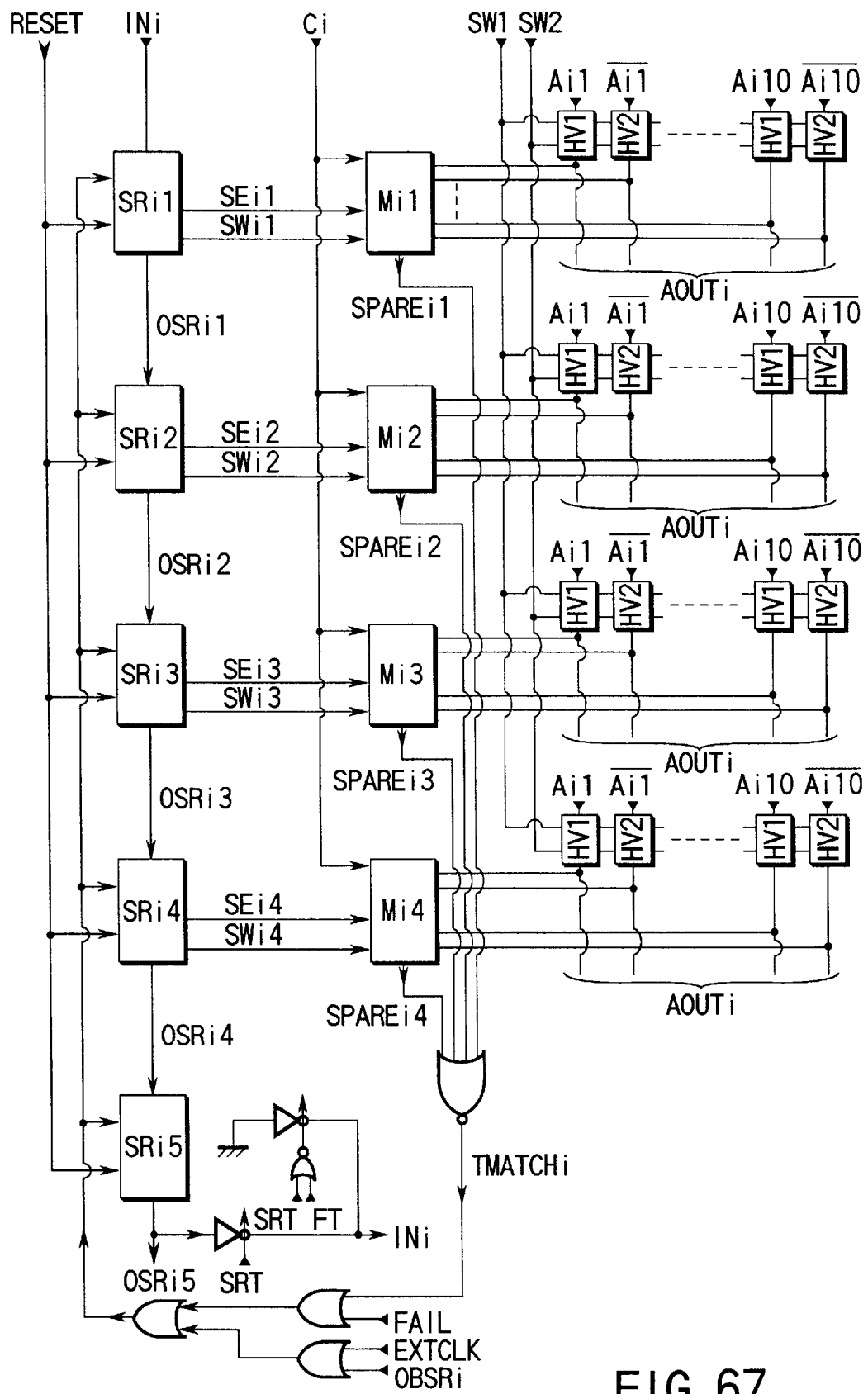
FIG. 67 is a diagram showing the configuration of a block BLOCKi (in the case where NR=NC=2) illustrated in FIG. 66.

Each block BLOCKi has the configuration as shown in FIG. 67. In other words, the block BLOCKi is formed by a nonvolatile semiconductor memory array (FIG. 68) for stacking error bit addresses and holding fuse data, and a shift register (FIG. 69) accompanying the block BLOCKi.

Operation of the redundancy calculation and allocation circuit having the configuration heretofore described will now be described.

For example, it is now assumed that four spare rows and four spare columns are provided for the repair unit (4 Mbits) of the memory cell array determined by addresses A1R to A10R and A1C to A10C. However, it is assumed that the lowest order addresses A0R and A0C are curtailed, two lines are substituted together in both the column direction and the column direction, and A0R and A0C can be neglected.

This case becomes equal to the case where the number NRS of spare rows is two and the number NCS of spare columns is two for one repair unit. Therefore, the maximum number of paths is determined to be Nconb=$_4C_2$=6, and their shape is predetermined (see templates of FIGS. 16 and 17).

Hereafter, when parameters i and j are used in description, i=1 to Nconb, and j=1 to NRS+NCS are implied.

The potential of $SPARE_{ij}$ line provided in common every ten bits is equal to the result of AND (logical product) of outputs of EEPROM cells of 10 bits (where 1 bit corresponds to one EEPROM cell) of the failure address memory element for redundancy.

In other words, if the input address of 10 bits of A1R to A10R completely coincides with the content of EPROM cells of 10 bits (storing one failure address), the $SPARE_{ij}$ becomes "H." If noncoincidence occurs even in one bit, the $SPARE_{ij}$ becomes "L."

Furthermore, a result obtained by executing NOR operation on the $SPARE_{ij}$ signals with respect to j=1 to NRS+NCS becomes a $MATCH_i$ signal.

Eventually, the $MATCH_i$ signal is usually "H." If the input address coincides with the failure address of the repair solution, however, the $MATCH_i$ signal becomes "L." The $MATCH_i$ signals are independent in respective blocks BLOCKi. (It corresponds to the fact that respective paths of the "tree" structure are processed independently.) Signals $SW_{ij}$ and $SE_{ij}$ are controlled by outputs of shift registers of FIG. 69.

During the test, data readout of memory cells (address comparison) is carried out if the shift register outputs $SW_{i1}$ to $SE_{i4}$ are "H" and $SE_{i1}$ to $SE_{i4}$ are "H." If the shift register outputs $SW_{i1}$ to $SE_{i4}$ are "L" and $SE_{i1}$ to $SE_{i4}$ are "H," data writing or erasing is carried out.

Figure 69:
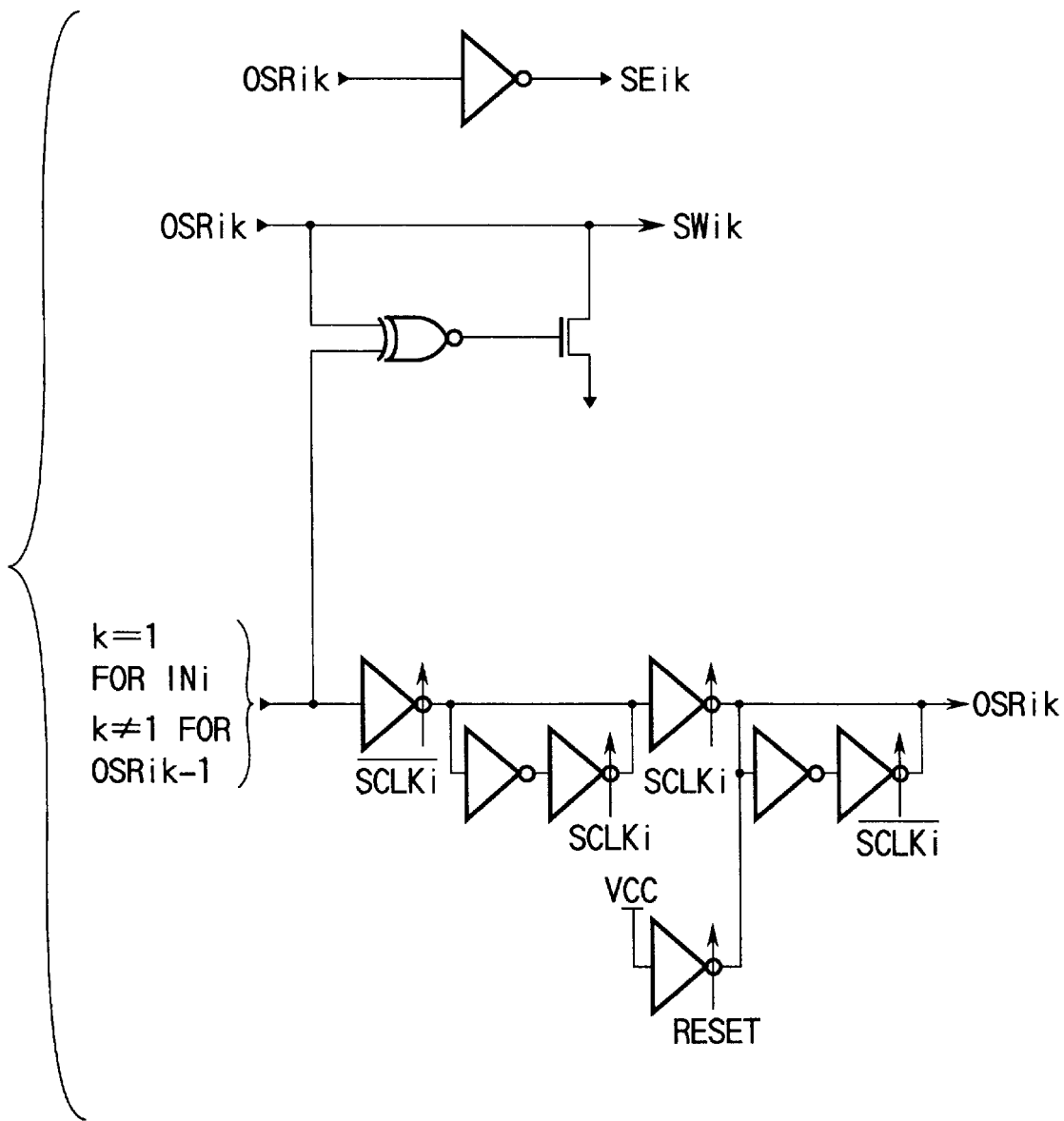
FIG. 69 is a diagram showing the configuration of a block (shift registers) SRik illustrated in FIG. 67.

For one repair solution, five shift registers $SR_{i1}$ to $SR_{i5}$ having the configuration of FIG. 69 are needed. This is $SR_{ik}$ itself of FIG. 19.

In the entire system, therefore, 6 (=the number of repair solutions)×5 (=the number of spares+1) shift registers are needed.

As for common shift registers of the entire system, 5 (=the number of spares+1) shift registers are needed ($TSR_1$ to $TSR_5$). The shift registers heretofore described operate at the rising edge of respective clock signals $SCLK_i$ and TCLK.

The fail signal Fail is set so as to become "L" normally and generate a pulse signal of "H" only when data input from the expected value pad does not coincide with test data.

The input clocks $SCLK_i$ of respective shift registers are independent every repair solution unit. During the test, an output $CLK_i$ representing a result of AND (logical product) operation of the fail signal Fail and the $TMATCH_i$ signal of the repair solution unit becomes the clock signal $SCLK_i$ (FIG. 67).

Therefore, the clock signal $SCLK_i$ becomes "H" when the input address is a failure bit and the input address does not coincide with any address held on the path. In this case, the shift registers $SR_{i1}$ to $SR_{i5}$ shift by one. In the redundancy test mode, "0" is written into all of the shift registers $SR_{i1}$ to $SR_{i5}$, by making a reset signal RESET "H" once after the entry to this mode (FIG. 69).

During the generation of the repair solution, the input signal $IN_i$ of the shift register $SR_{ij}$ is input to a "1" generator, and consequently the $SCLK_i$ becomes "H." In the shift registers $SR_{i1}$ to $SR_{i5}$, shift of "1" means that a failure address has been written into the failure address memory element for redundancy. (If "1" shifts, the output value $SW_{ij}$ of only one register changes from "H" to "L.")

Eventually, the shift registers $SR_1$ to $SR_{i5}$ operating independently in each block $BLOCK_i$ functions to hold the contents of the effective bits, and controls the array of the nonvolatile semiconductor memory according to the contents of the effective bits.

By taking out the information of the shift registers to the outside of the chip after the test has finished, it is possible to know whether the chip is repairable or unrepairable, which repair solution provides the highest efficiency, and how many spare lines are used for substitution of each repair solution.

Figure 68:
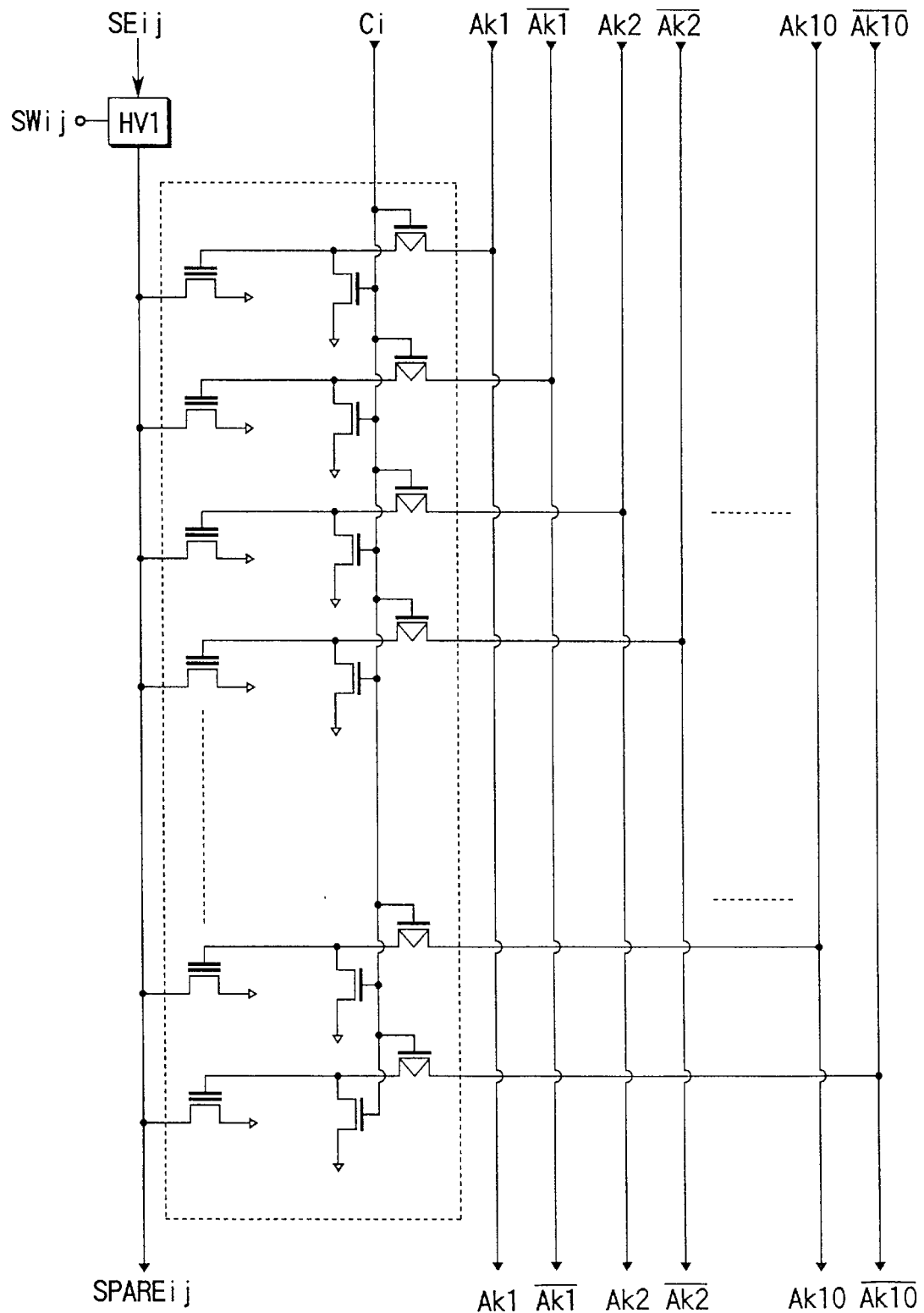
FIG. 68 is a diagram showing the configuration of a block Mij illustrated in FIG. 67.

Furthermore, by determining a repair solution i to be actually used, making the potential of a signal $C_i$ of the circuit shown in FIG. 68 equal to 0, and inputting a signal output from this circuit to a spare unit of FIG. 67, redundancy information can be set.

Heretofore, there has been described the hardware configuration of the redundancy calculation and allocation circuit in the case where the number NRS of spare rows is two and the number NCS of spare columns is two for the repair unit (4 Mbits) of the memory cell array.

Expansion to a general case can be carried out according to the following TABLE 5.

TABLE 5

| | EMBODIMENT | GENERAL |
|---|---|---|
| ROW ADDRESS | 10-bit | NRA-bit |
| COLUMN ADDRESS | 10-bit | NCA-bit |
| NUMBER OF ROW SPARES | 2 | NRS |
| NUMBER OF COLUMN SPARES | 2 | NCS |
| NUMBER OF ALL SPARES | 4 | NRS + NCS |
| NUMBER OF ALL REPAIR SOLUTIONS Ncomb | 6 | NRS + NCS$^C$NRS |
| NUMBER OF SHIFT REGISTERS | 30 | Ncomb × (NRS + NCS + 1) |
| NUMBER OF NONVOLATILE MEMORY ELEMENTS | 480 | 2 × Ncomb × (NRS × NRA + NCS × NCA) |

At the time of repair solution generation during the test, the shift register reset signal RESET is first set to "H" as the initial state. As a result, outputs $OSR_{i1}$ to $OSR_{i5}$ of the shift registers are set to the "L" state.

The input signal $IN_{i1}$ of the first shift register is input to the "1" generator. Whenever a failure memory cell occurs, data "1" is shifted successively in the shift registers $SR_{i1}$ to $SR_{i5}$ in synchronism with the clock signal $SCLK_i$. As the initial state, the outputs $OSR_{i1}$ to $OSR_{i5}$ respectively of the shift registers $SR_{i1}$ to $SR_{i5}$ are set to "0" ("L") beforehand. Inputting of data "1" to the shift registers $SR_{i1}$ to $SR_{i5}$ means that an effective bit is held.

As shown in FIG. 67, the result of AND (logical product) operation of the fail signal Fail and the $TMATCH_i$ signal becomes the clock signal for controlling the operation of the shift registers $SR_{i1}$ to $SR_{i5}$.

If data "1" is inputted to the shift register $SR_{i5}$ and its output $OSR_{i5}$ becomes "1," then it is meant that a failure bit has occurred although all spare lines have been used already. In the path (repair solution) for which the output $OSR_{i5}$ has become "1," therefore, it becomes impossible to repair a failure bit.

In this way, the last output $OSR_{i5}$ of the shift registers $SR_{i1}$ to $SR_{i5}$ representing one path (repair solution) of the predetermined "tree" structure is an index representing whether the one path (repair solution) is effective. In other words, when the output $OSR_{i5}$ concerning one path is "0," the one path (repair solution) is effective. When the output $OSR_{i5}$ concerning one path is "1," the one path (repair solution) becomes ineffective.

For determining after the test whether the chip can be repaired by redundancy, it is only necessary to output serially the data of the shift registers $SR_{i1}$ to $SR_{i5}$ to the outside of the chip, or conducting serial-parallel conversion on the data of the shift registers $SR_{i1}$ to $SR_{i5}$ and then output resultant parallel data to the outside of the chip in parallel.

Thus in the present embodiment, the redundancy analysis (RA) is carried out in parallel to the test. Furthermore, as a matter of course, parallel processing is carried out between repair units in the chip. Even in the repair unit, repair solution generation and repair solution storage (corresponding to the conventional set fuse) are performed in parallel. As a result, the time required for the RA can be significantly reduced.

In this system, repair solutions are generated successively during the test, and the repair solutions are successively set in the nonvolatile semiconductor memory (corresponding to the conventional fuses). After the end of the test, therefore, it is not necessary to separately conduct fuse setting.

Especially in a chip having a small number of spares in the repair unit (usually, the repair unit itself is small), application of the present system is effective.

Furthermore, by combining the present system with the BIST, processing ranging from the test to fuse setting can be achieved on chip. Especially for the logic-memory mixture LSI, faster and easier tests become possible.

FIGS. 70A to 73 concisely show the summary of the semiconductor memory of the present invention heretofore described.

Figures 70A, 70B:
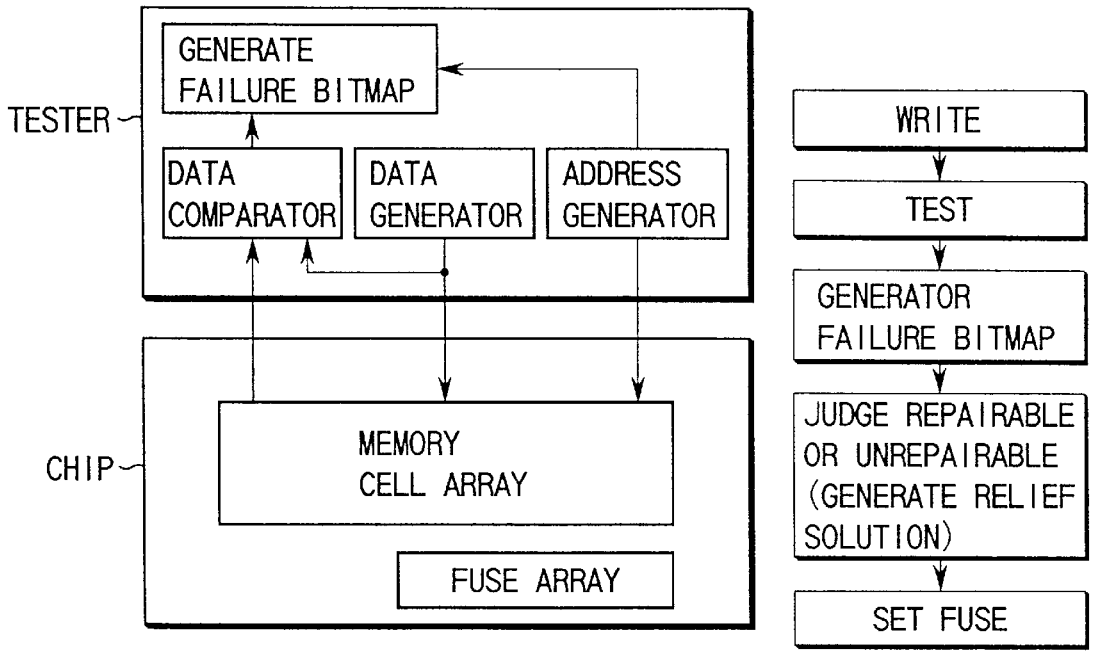
FIGS. 70A and 70B are schematic diagrams showing the configuration of a conventional semiconductor memory.

First of all, FIGS. 70A and 70B show configurations of the conventional semiconductor memory. In this case, the repair solution is derived by applying the so-called blanket repair algorithm.

FIGS. 71A to 71C show configurations of the semiconductor memory described above in the items A. to D. In this case, the repair solution is derived by applying the so-called successive repair algorithm. The test is carried out by writing data into all memory cells of the memory cell array by using the data generated by address generator and data generator, then reading the data of all memory cells, for example, cell by cell, comparing the data with the expected value, and thereby judging each memory cell normal or failed. Whenever a failure bit occurs during the test, the successive repair algorithm generates a repair solution for memory cells tested since the test start until the time point when that failure bit has occurred. The repair solution is held in the address holding memory (SRAM) of the redundancy calculation and allocation circuit. In the successive repair algorithm of the present invention, the number of repair solutions (the number of paths="tree" structure) is fixed beforehand by the number of spare lines (rows and/or columns). In the redundancy calculation and allocation circuit, therefore, the address holding memory capable of storing all repair solutions (paths) is provided. After the test has finished, all repair solutions are read out to the outside of the chip, and one optimum repair solution is selected out of effective repair solutions (each having an effective bit which is not "1"). On the basis of the repair solution, fuse setting is performed for the fuse array, for example.

Figure 72:
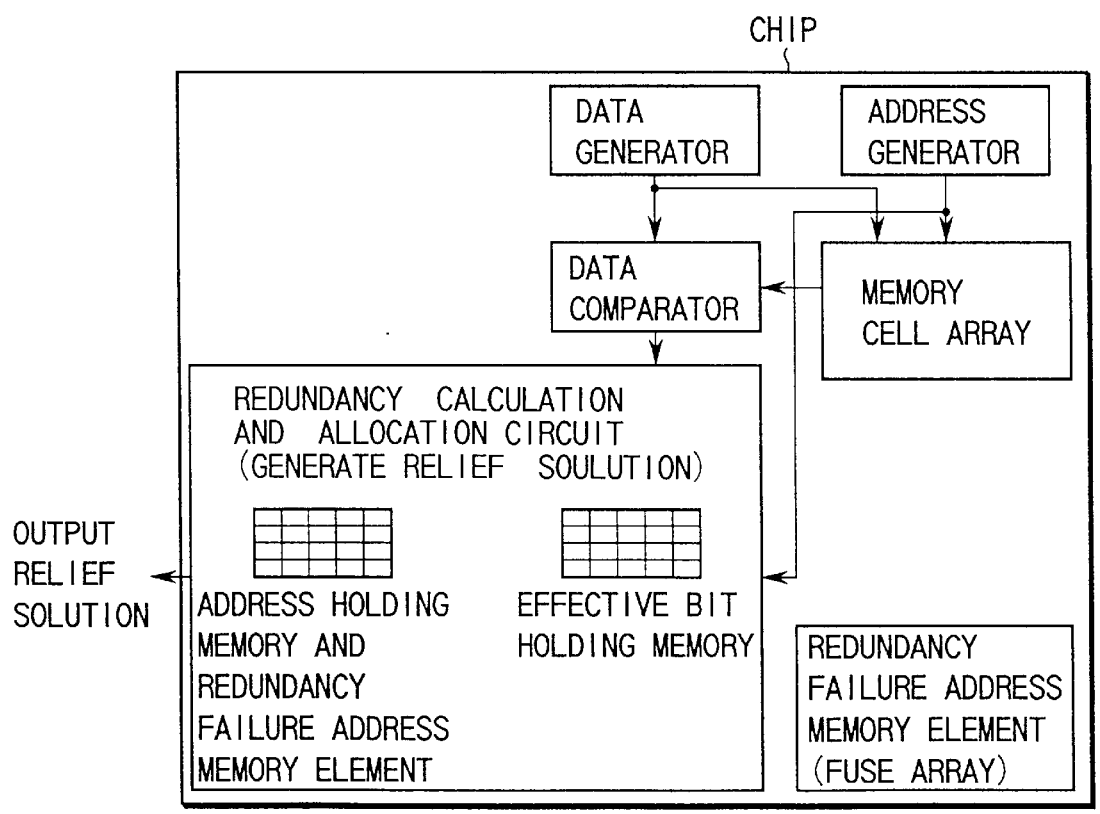
FIG. 72 is a schematic diagram showing the configuration of a semiconductor memory according to the present invention.

FIG. 72 shows a memory chip (including a logic-memory chip) having the BIST and BISR function described above in the item E. In other words, test circuit such as the address generator and the data generator and data comparator are incorporated in the chip. Even in this chip, shortening of the test time and reduction of the manufacturing cost can be achieved by applying the successive repair algorithm of the present invention.

Figure 73:
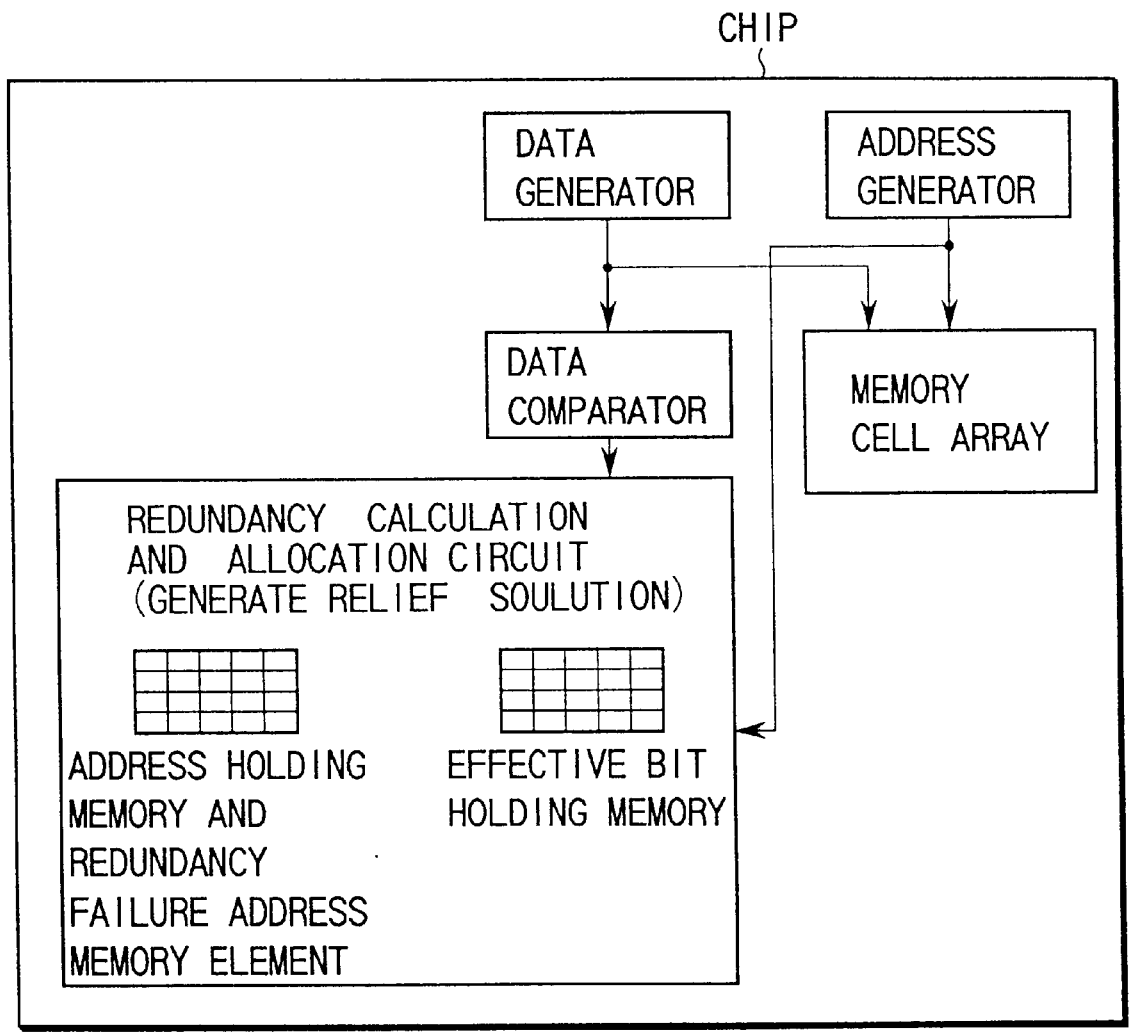
FIG. 73 is a schematic diagram showing the configuration of a semiconductor memory according to the present invention.

FIG. 73 is an example of application of the memory of FIG. 72. In other words, in the successive repair algorithm (hardware configuration) of the present invention, the address holding memory capable of storing all repair solutions (paths) is provided in the redundancy calculation and allocation circuit. On the other hand, in the embodiment of FIGS. 71A to 72, the failure address memory element for redundancy (such as a fuse array) for storing the failure address to be compared with the input address (external address/internal address) at the time of normal operation is also incorporated in the chip separately. In the present embodiment, therefore, the operation of reading all repair solutions to the outside of the chip is not carried out after the test has finished. Instead, one optimum repair solution is selected, within the chip, out of effective repair solutions (each having an effective bit which is not "1"). At the time of normal operation, the failure address of the address holding memory (functioning also as the failure address memory element for redundancy) is the input address (external address/internal address). Therefore, it is not necessary to provide separately a memory element such as the conventional fuse array in the chip.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device comprising:
   a memory cell array;
   a redundancy memory cell array provided as a reserve for said memory cell array;
   a redundancy calculation and allocation circuit, whenever a test circuit for successively testing a plurality of memory cells forming said memory cell array has found a failure memory cell, for generating at least one repair solution for repairing said failure memory cell in parallel to the test of said plurality of memory cells carried out by said test circuit; and
   a redundancy circuit for substituting a row or a column of said memory cell array by a row or a column of said redundancy memory cell array on the basis of said at least one repair solution.

2. A semiconductor memory device according to claim 1, wherein
   said memory cell array comprises a plurality of repair units,
   said redundancy memory cell array is provided for each of said plurality of repair units, and
   the generation of said at least one repair solution by said redundancy calculation and allocation circuit and the substitution of a row or a column of said memory cell array on the basis of said at least one repair solution are carried out for each of the plurality of repair units.

3. A semiconductor memory device according to claim 1, wherein the substitution of a row or a column of said memory cell array is carried out by fuse blow or electric means.

4. A semiconductor memory device according to claim 1, wherein said semiconductor memory device is formed in a semiconductor chip, and said test circuit is incorporated in said semiconductor chip.

5. A semiconductor memory device according to claim 1, wherein said at least one repair solution is one of all repair solutions capable of repairing said failure memory cell.

6. A semiconductor memory device according to claim 1, wherein the number of said at least one repair solutions is $_{NRS+NCS}C_{NRS}$ (combinations of taking NRS out of NRS+NCS) at maximum (where NRS is the number of spare rows and NCS is the number of spare columns).

7. A semiconductor memory device according to claim 6, wherein said redundancy calculation and allocation circuit has $_{NRS+NCS}C_{NRS}$ blocks, whenever said failure memory cell is found, one repair solution is generated and retained for each of the blocks, and an effective bit indicating whether or not said one repair solution is effective is retained in each of the blocks.

8. A semiconductor memory device according to claim 7, wherein said one repair solution is constructed by an arrangement of row addresses for selecting a row containing said failure memory cell or column addresses for selecting a column containing said failure memory cell, and arrangement of said row addresses or said column addresses in each block differs from block to block.

9. A semiconductor memory device according to claim 8, wherein row addresses or column addresses contained in said at least one repair solution are different from each other.

10. A semiconductor memory device according to claim 1, further comprising an output control circuit for serially outputting said at least one repair solution to outside of a chip on which said semiconductor memory device is formed.

11. A semiconductor memory device according to claim 10, wherein in the case where said test circuit conducts a plurality of test, said output control circuit outputs said at least one repair solution whenever each test is completed.

12. A semiconductor memory device according to claim 10, wherein in the case where said test circuit conducts a plurality of test, said output control circuit outputs said at least one repair solution for each test after all tests are completed.

13. A semiconductor memory device according to claim 1, wherein said redundancy calculation and allocation circuit generates effective bits indicating whether or not said at least one repair solution is effective.

14. A semiconductor memory device according to claim 13, further comprising an output control circuit for serially outputting said at least one repair solution and said effective bits to outside of a chip on which said semiconductor memory device is formed.

15. A semiconductor memory device according to claim 14, wherein in the case where said test circuit conducts a plurality of test, said output control circuit outputs said at least one repair solution and said effective bits whenever each test is completed.

16. A semiconductor memory device according to claim 14, wherein in the case where said test circuit conducts a plurality of test, said output control circuit outputs said at least one repair solution and said effective bits for each test after all tests are completed.

17. A semiconductor memory test system according to claim 1, wherein said redundancy circuit substitutes a row or a column of said memory cell array to a row or a column of said redundancy memory cell array based on one optimum repair solution capable of repairing said failure memory cell the most efficiently out of said at least one repair solution.

18. A semiconductor memory test system according to claim 17, wherein the optimum repair solution is a solution as to reduce the number of rows and columns of said redundancy memory cell array required to repair a failure to a minimum.

19. A semiconductor memory device according to claim 1 further comprising: a tester for supplying row address data, column address data, and test data to said semiconductor memory device and receiving said at least one repair solution from said semiconductor memory device.

20. A semiconductor memory device according to claim 1, further comprising a tester for receiving said at least one repair solution from said semiconductor memory device, wherein upon receiving a control signal of said tester, said test circuit of said semiconductor memory device generates row address data, column address data, and test data.

21. A semiconductor memory system comprising:

a semiconductor memory device including a memory cell array, a redundancy memory cell array provided as a reserve for said memory cell array, and a redundancy circuit for substituting a row or a column of said memory cell array by a row or a column of said redundancy memory cell array on the basis of said at least one repair solution; and a test device including a test circuit for successively testing a plurality of memory cells forming said memory cell array, and a redundancy calculation and allocation circuit, wherein whenever said test circuit has found a failure memory cell, said redundancy calculation and allocation circuit generates at least one repair solution for repairing said failure memory cell in parallel to the test of said plurality of memory cells carried out by said test circuit.

22. A semiconductor memory device comprising:

a memory cell array;

a redundancy memory cell array provided as a reserve for said memory cell array;

a redundancy calculation and allocation circuit, whenever a test circuit for successively testing a plurality of memory cells forming said memory cell array has found a failure memory cell, for generating at least one repair solution for repairing said failure memory cell in parallel to the test of said plurality of memory cells carried out by said test circuit;

storage circuit included in said redundancy calculation and allocation circuit for storing the at least one repair solution during the test; and a redundancy circuit for substituting a row or a column of said memory cell array by a row or a column of said redundancy memory cell array on the basis of said at least one repair solution.

23. A semiconductor memory device according to claim 22, wherein said storage circuit is a nonvolatile semiconductor memory which is readable, programmable and erasable.

24. A semiconductor memory device according to claim 22, wherein when at least one repair solution has a plurality of repair solutions, an optimum repair solution is selected among the plurality of effective repair solutions, and said redundancy circuit substitutes a row or a column of said memory cell array to a row or a column of said redundancy memory cell array based on the optimum repair solution.

25. A semiconductor memory device according to claim 22, wherein said semiconductor memory device is formed on a semiconductor chip, and said test circuit comprising an address generator, data generator, and data comparator is incorporated in said semiconductor chip.

* * * * *